US012787229B2

(12) United States Patent
Hodigere et al.

(10) Patent No.: US 12,787,229 B2
(45) Date of Patent: Nov. 3, 2026

(54) METHODS AND APPARATUS FOR COOLANT MANAGEMENT IN DISTRIBUTED COMPUTE SYSTEMS

(71) Applicant: Intel Corporation, Santa Clara, CA (US)

(72) Inventors: Arun Hodigere, Bangalore (IN); Francesc Guim Bernat, Barcelona (ES); Kshitij Arun Doshi, Tempe, AZ (US); Amruta Misra, Bangalore (IN); Marcos Carranza, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 66 days.

(21) Appl. No.: 18/148,335

(22) Filed: Dec. 29, 2022

(65) Prior Publication Data

US 2023/0134643 A1 May 4, 2023

(51) Int. Cl.
*H05K 7/20* (2006.01)
*G06F 1/20* (2006.01)

(52) U.S. Cl.
CPC ........... *H05K 7/20836* (2013.01); *G06F 1/20* (2013.01)

(58) Field of Classification Search
CPC .............................. H05K 7/20836; G06F 1/20
USPC .......................................................... 700/300
See application file for complete search history.

(56) References Cited

U.S. PATENT DOCUMENTS

| | | | | |
|---|---|---|---|---|
| 2012/0123595 | A1* | 5/2012 | Bower, III | H05K 7/20772 700/282 |
| 2015/0334880 | A1* | 11/2015 | Best | H05K 7/20836 361/679.47 |
| 2016/0262288 | A1* | 9/2016 | Chainer | F28D 15/0266 |
| 2018/0352683 | A1* | 12/2018 | Karrat | G06F 1/206 |
| 2021/0320050 | A1 | 10/2021 | Robinson et al. | |
| 2022/0201902 | A1* | 6/2022 | Shaw | H05K 7/20745 |
| 2023/0240053 | A1* | 7/2023 | Turner | H05K 7/20281 |
| 2023/0284423 | A1* | 9/2023 | Heydari | H05K 7/20781 |
| 2024/0049434 | A1* | 2/2024 | Mohajer | H05K 7/20254 |
| 2024/0215205 | A1* | 6/2024 | Shahi | H05K 7/20272 |

FOREIGN PATENT DOCUMENTS

| | | |
|---|---|---|
| GB | 2576032 | 4/2021 |
| GB | 2576030 | 12/2021 |
| GB | 2597525 | 2/2022 |
| GB | 2601357 | 6/2022 |

* cited by examiner

*Primary Examiner* — Md Azad
(74) *Attorney, Agent, or Firm* — Hanley, Flight & Zimmerman, LLC

(57) ABSTRACT

Methods and apparatus for distributing coolant between server racks are disclosed herein. An example apparatus described herein includes a compute node including a sensor and a first volume of coolant, a coolant storage, memory, and at least one processor to execute instructions to determine, based on an output of the sensor, if the first volume is effective to maintain a temperature of the compute node at a target temperature, in response to determining the first volume is not effective, reduce a computation load on the first compute node, and pump, from the coolant storage, a second volume of coolant to the compute node. In some examples, the coolant storage can be disposed underground.

20 Claims, 26 Drawing Sheets

METHODS AND APPARATUS FOR COOLANT MANAGEMENT IN DISTRIBUTED COMPUTE SYSTEMS

FIELD OF THE DISCLOSURE

This disclosure relates generally to data centers and, more particularly, to methods and apparatus for coolant management in distributed compute systems.

BACKGROUND

The use of liquids to cool electronic components is being explored for its benefits over more traditional air cooling systems, as there is an increasing need to address thermal management risks resulting from increased thermal design power in high-performance systems (e.g., CPU and/or GPU servers in data centers, cloud computing, edge computing, and the like). More particularly, relative to air, liquid has inherent advantages of higher specific heat (when no boiling is involved) and higher latent heat of vaporization (when boiling is involved).

Figure 1:
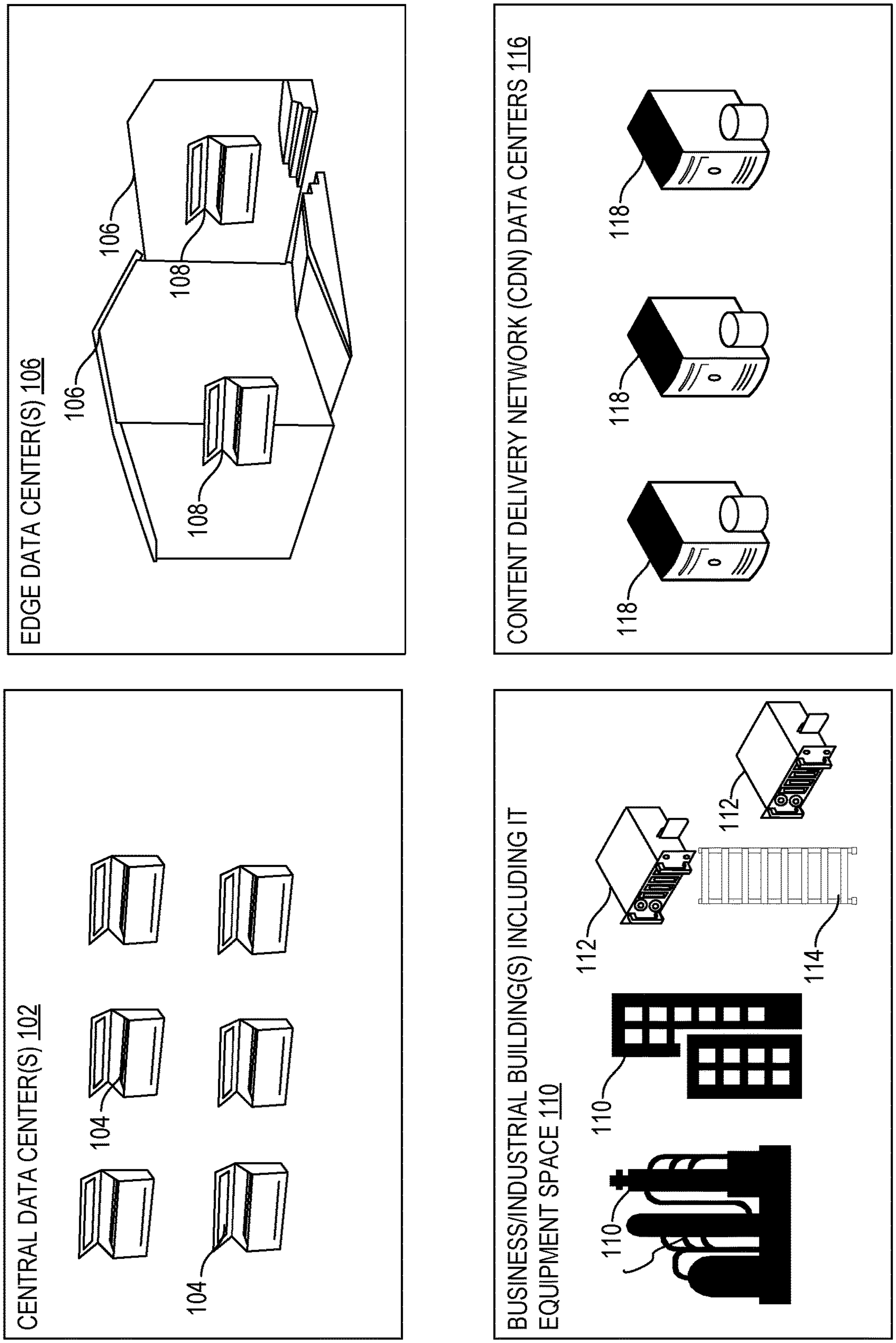
FIG. 1 illustrates one or more example environments in which teachings of this disclosure may be implemented.

In general, the same reference numbers will be used throughout the drawing(s) and accompanying written description to refer to the same or like parts. The figures are not to scale. Instead, the thickness of the layers or regions may be enlarged in the drawings. Although the figures show layers and regions with clean lines and boundaries, some or all of these lines and/or boundaries may be idealized. In reality, the boundaries and/or lines may be unobservable, blended, and/or irregular.

DETAILED DESCRIPTION

In recent years, a substantial amount of digital content and computing power has been migrated to data centers, such as edge data centers. This enables the content and computing resources to be located closer to the end users, which reduces latency, decreases backhaul network loads, and improves user experience. These data centers typically include one or more servers or other computing devices. Some of these servers are located outdoors and are therefore subject to extreme temperature ranges. Keeping this server hardware in a proper operational temperature range to ensure proper functionality can be costly and generally requires dedicated heating and/or cooling equipment. Some example cooling equipment includes immersion cooling systems, which dissipate heat from compute hardware via convection caused by the flow of an immersion fluid directly over compute units.

Examples disclosed herein include centralized coolant storage systems that can be used to supply coolant to one or more servers. Examples disclosed herein include pipes that send coolant from the coolant storage to servers and drain coolant from servers back to the coolant storage. In some examples disclosed herein, a system controller can determine, based on sensor data from the server and/or a workload on the server, if the coolant of the server is able to maintain the server at a target temperature. In some examples disclosed herein, if the coolant is not able to maintain the server at the target temperature, the system controller can drain the coolant from the server and supply the server with fresh coolant. In some examples disclosed herein, the system controller can reduce the heat output of the server while the coolant is being replaced. In some examples disclosed herein, the coolant storage can be underground. In some such examples disclosed herein, the coolant in the coolant storage can be cooled via conduction into the ground.

As used herein, unless otherwise stated, the term "above" describes the relationship of two parts relative to Earth. A first part is above a second part, if the second part has at least one part between Earth and the first part. Likewise, as used herein, a first part is "below" a second part when the first part is closer to the Earth than the second part. As noted above, a first part can be above or below a second part with one or more of: other parts therebetween, without other parts therebetween, with the first and second parts touching, or without the first and second parts being in direct contact with one another.

As used in this patent, stating that any part (e.g., a layer, film, area, region, or plate) is in any way on (e.g., positioned on, located on, disposed on, or formed on, etc.) another part, indicates that the referenced part is either in contact with the other part, or that the referenced part is above the other part with one or more intermediate part(s) located therebetween.

As used herein, connection references (e.g., attached, coupled, connected, and joined) may include intermediate members between the elements referenced by the connection reference and/or relative movement between those elements unless otherwise indicated. As such, connection references do not necessarily infer that two elements are directly connected and/or in fixed relation to each other. As used herein, stating that any part is in "contact" with another part is defined to mean that there is no intermediate part between the two parts.

Unless specifically stated otherwise, descriptors such as "first," "second," "third," etc., are used herein without imputing or otherwise indicating any meaning of priority, physical order, arrangement in a list, and/or ordering in any way, but are merely used as labels and/or arbitrary names to distinguish elements for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for identifying those elements distinctly that might, for example, otherwise share a same name.

As used herein, "approximately" and "about" modify their subjects/values to recognize the potential presence of variations that occur in real world applications. For example, "approximately" and "about" may modify dimensions that may not be exact due to manufacturing tolerances and/or other real world imperfections as will be understood by persons of ordinary skill in the art. For example, "approximately" and "about" may indicate such dimensions may be within a tolerance range of +/−10% unless otherwise specified in the below description. As used herein "substantially real time" refers to occurrence in a near instantaneous manner recognizing there may be real world delays for computing time, transmission, etc. Thus, unless otherwise specified, "substantially real time" refers to real time+/−1 second.

As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

As used herein, "processor circuitry" is defined to include (i) one or more special purpose electrical circuits structured to perform specific operation(s) and including one or more semiconductor-based logic devices (e.g., electrical hardware implemented by one or more transistors), and/or (ii) one or more general purpose semiconductor-based electrical circuits programmable with instructions to perform specific operations and including one or more semiconductor-based logic devices (e.g., electrical hardware implemented by one or more transistors). Examples of processor circuitry include programmable microprocessors, Field Programmable Gate Arrays (FPGAs) that may instantiate instructions, Central Processor Units (CPUs), Graphics Processor Units (GPUs), Digital Signal Processors (DSPs), XPUs, or microcontrollers and integrated circuits such as Application Specific Integrated Circuits (ASICs). For example, an XPU may be implemented by a heterogeneous computing system including multiple types of processor circuitry (e.g., one or more FPGAs, one or more CPUs, one or more GPUs, one or more DSPs, etc., and/or a combination thereof) and application programming interface(s) (API(s)) that may assign computing task(s) to whichever one(s) of the multiple types of processor circuitry is/are best suited to execute the computing task(s).

Referring now to FIG. 1, the example environment(s) of FIG. 1 can include buildings 110 for purposes of business and/or industry that store information technology (IT) equipment in, for example, one or more rooms of the building(s) 110. For example, as represented in FIG. 1, server(s) 112 can be stored with server rack(s) 114 that support the server(s) 112 (e.g., in an opening of slot of the rack 114). In some examples, the server(s) 112 located at the buildings 110 include on-premise server(s) of an edge computing network, where the on-premise server(s) are in communication with remote server(s) (e.g., the server(s) at the edge data center(s) 106) and/or other computing device(s) within an edge network.

The example environment(s) of FIG. 1 include content delivery network (CDN) data center(s) 116. The CDN data center(s) 116 of this example include server(s) 118 that cache content such as images, webpages, videos, etc. accessed via user devices. The server(s) 118 of the CDN data centers 116 can be disposed (e.g., positioned, located, arranged, etc.) in immersion cooling tank(s) such as the immersion tanks 104, 108 shown in connection with the data centers 102, 106.

In some instances, the example data centers 102, 106, 116 and/or building(s) 110 of FIG. 1 include servers and/or other electronic components that are cooled independent of immersion tanks (e.g., the immersion tanks 104, 108) and/or an associated immersion cooling system. That is, in some examples, some or all of the servers and/or other electronic components in the data centers 102, 106, 116 and/or building(s) 110 can be cooled by air and/or liquid coolants without immersing the servers and/or other electronic components therein. Thus, in some examples, the immersion tanks 104, 108 of FIG. 1 may be omitted. Further, the example data centers 102, 106, 116 and/or building(s) 110 of FIG. 1 can correspond to, be implemented by, and/or be adaptations of the example data center 200 described in further detail below in connection with FIGS. 2-16.

Although a certain number of cooling tank(s) and other component(s) are shown in the figures, any number of such components may be present. Also, the example cooling data centers and/or other structures or environments disclosed herein are not limited to arrangements of the size that are depicted in FIG. 1. For instance, the structures containing example cooling systems and/or components thereof disclosed herein can be of a size that includes an opening to accommodate service personnel, such as the example data center(s) 106 of FIG. 1, but can also be smaller (e.g., a "doghouse" enclosure). For instance, the structures containing example cooling systems and/or components thereof disclosed herein can be sized such that access (e.g., the only access) to an interior of the structure is a port for service personnel to reach into the structure. In some examples, the structures containing example cooling systems and/or components thereof disclosed herein are be sized such that only a tool can reach into the enclosure because the structure may be supported by, for a utility pole or radio tower, or a larger structure.

Figure 2:
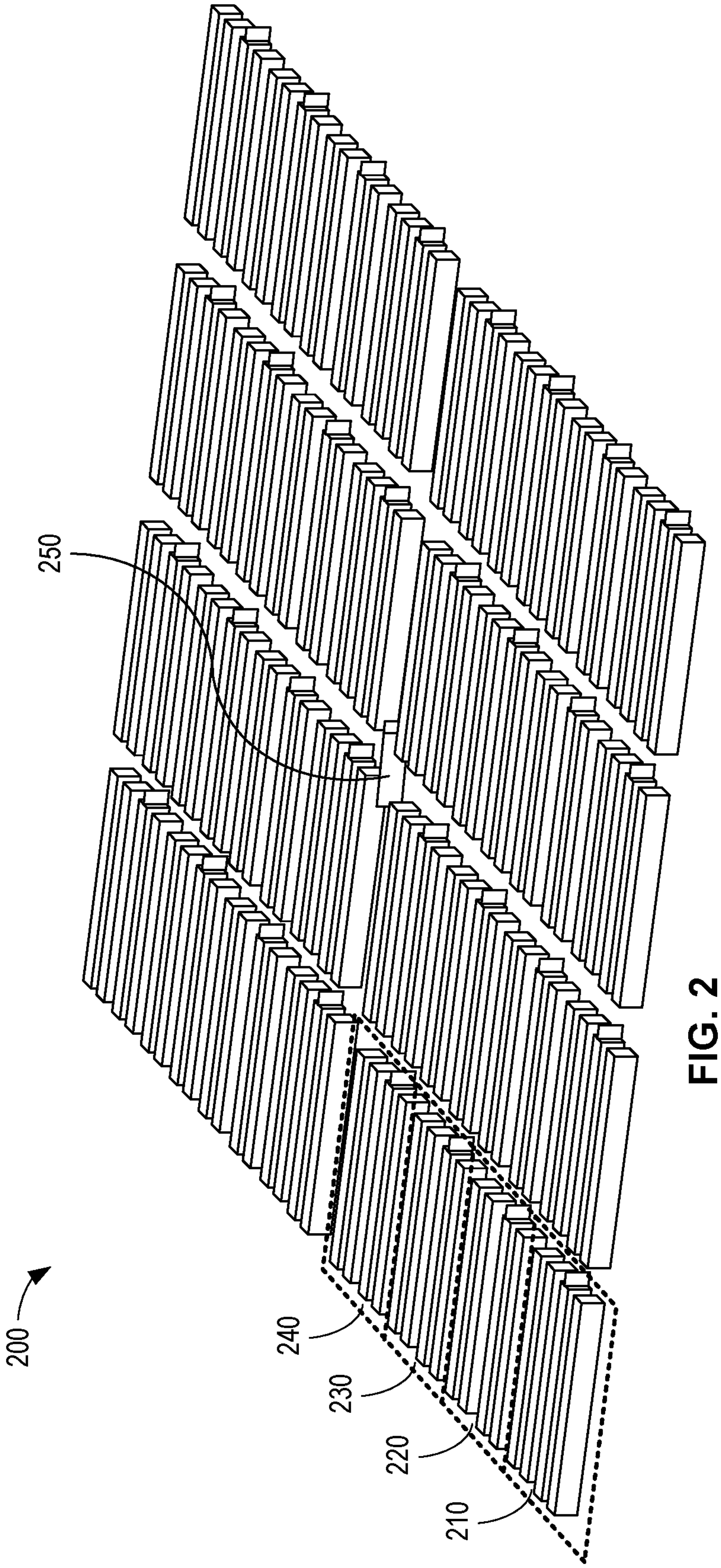
FIG. 2 illustrates at least one example of a data center for executing workloads with disaggregated resources.

FIG. 2 illustrates an example data center 200 in which disaggregated resources may cooperatively execute one or more workloads (e.g., applications on behalf of customers). The illustrated data center 200 includes multiple platforms 210, 220, 230, 240 (referred to herein as pods), each of which includes one or more rows of racks of equipment. Although the data center 200 is shown with multiple pods, in some examples, the data center 200 may be implemented as a single pod. As described in more detail herein, a rack may house multiple sleds. A sled may be primarily equipped with a particular type of resource (e.g., memory devices, data storage devices, accelerator devices, general purpose processors), i.e., resources that can be logically coupled to form a composed node. Some such nodes may act as, for example, a server. In the illustrative example, the sleds in the pods 210, 220, 230, 240 are connected to multiple pod switches (e.g., switches that route data communications to and from sleds within the pod). The pod switches, in turn, connect with spine switches 250 that switch communications among pods (e.g., the pods 210, 220, 230, 240) in the data center 200.

In some examples, the sleds may be connected with a high-speed fabric (e.g., Omni-Path™, Infiniband, Ethernet) technology. As described in more detail herein, resources within the sleds in the data center 200 may be allocated to a group (referred to herein as a "managed node") containing resources from one or more sleds to be collectively utilized in the execution of a workload. The workload can execute as if the resources belonging to the managed node were located on the same sled. The resources in a managed node may belong to sleds belonging to different racks, and even to different pods 210, 220, 230, 240. As such, some resources of a single sled may be allocated to one managed node while other resources of the same sled are allocated to a different managed node (e.g., first processor circuitry assigned to one managed node and second processor circuitry of the same sled assigned to a different managed node).

A data center including disaggregated resources, such as the data center 200, can be used in a wide variety of contexts, such as enterprise, government, cloud service provider, and communications service provider (e.g., Telco's), as well in a wide variety of sizes, from cloud service provider mega-data centers that consume over 200,000 sq. ft. to single- or multi-rack installations for use in base stations.

In some examples, the disaggregation of resources is accomplished by using individual sleds that include predominantly a single type of resource (e.g., compute sleds including primarily compute resources, memory sleds including primarily memory resources). The disaggregation of resources in this manner, and the selective allocation and deallocation of the disaggregated resources to form a managed node assigned to execute a workload, improves the operation and resource usage of the data center 200 relative to typical data centers. Such typical data centers include hyperconverged servers containing compute, memory, storage, and perhaps additional resources in a single chassis. Resource utilization may also increase. For example, if managed nodes are composed based on requirements of the workloads that will be running on them, resources within a node are more likely to be fully utilized. Such utilization may allow for more managed nodes to run in a data center with a given set of resources, or for a data center expected to run a given set of workloads, to be built using fewer resources.

Figure 3:
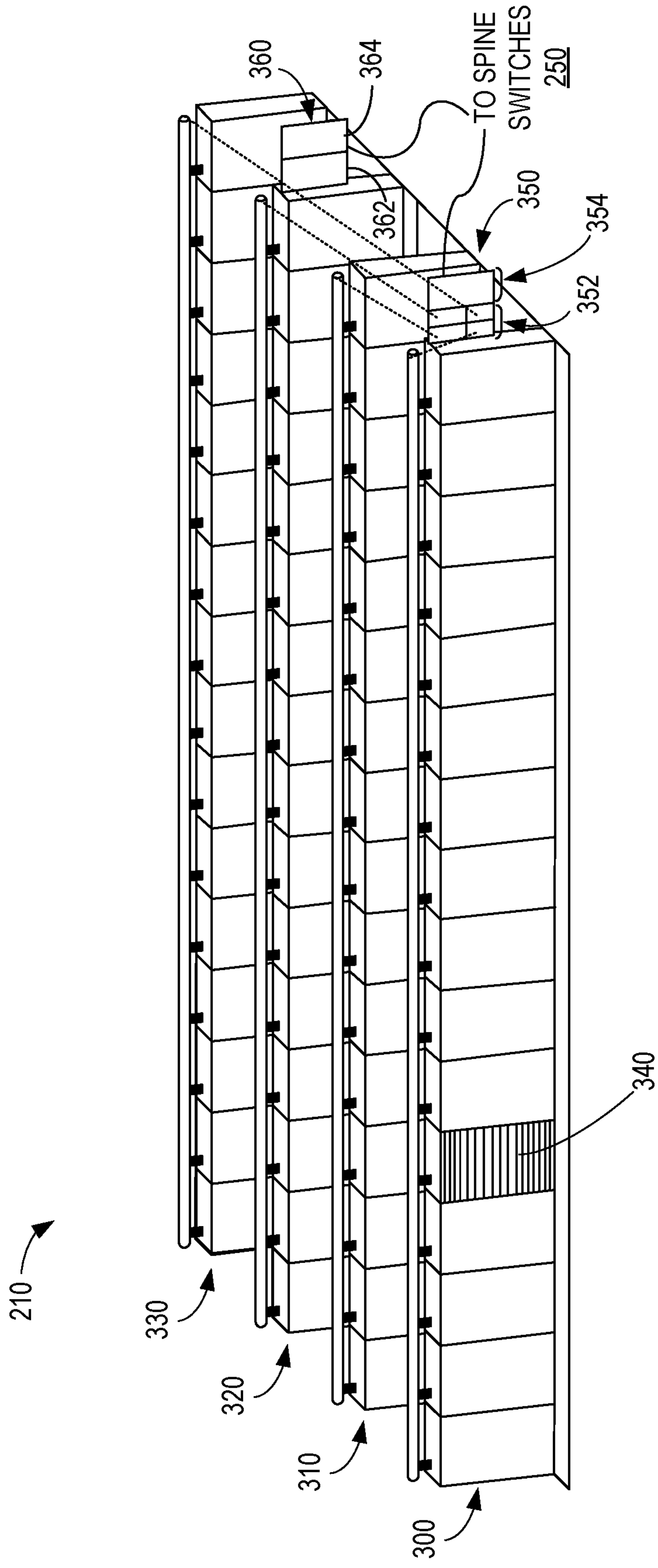
FIG. 3 illustrates at least one example of a pod that may be included in the data center of FIG. 2.

Referring now to FIG. 3, the pod 210, in the illustrative example, includes a set of rows 300, 310, 320, 330 of racks, one of which is shown at reference numeral 340. Individual ones of the racks 340 may house multiple sleds (e.g., sixteen sleds) and provide power and data connections to the housed sleds, as described in more detail herein. In the illustrative example, the racks are connected to multiple pod switches 350, 360. The pod switch 350 includes a set of ports 352 to which the sleds of the racks of the pod 210 are connected and another set of ports 354 that connect the pod 210 to the spine switches 250 to provide connectivity to other pods in the data center 200. Similarly, the pod switch 360 includes a set of ports 362 to which the sleds of the racks of the pod 210 are connected and a set of ports 364 that connect the pod 210 to the spine switches 250. As such, the use of the pair of switches 350, 360 provides an amount of redundancy to the pod 210. For example, if either of the switches 350, 360 fails, the sleds in the pod 210 may still maintain data communication with the remainder of the data center 200 (e.g., sleds of other pods) through the other switch 350, 360. Furthermore, in the illustrative example, the switches 250, 350, 360 may be implemented as dual-mode optical switches, capable of routing both Ethernet protocol communications carrying Internet Protocol (IP) packets and communications according to a second, high-performance link-layer protocol (e.g., PCI Express) via optical signaling media of an optical fabric.

It should be appreciated that any one of the other pods 220, 230, 240 (as well as any additional pods of the data center 200) may be similarly structured as, and have components similar to, the pod 210 shown in and disclosed in regard to FIG. 3 (e.g., a given pod may have rows of racks housing multiple sleds as described above). Additionally, while two pod switches 350, 360 are shown, it should be understood that in other examples, a different number of pod switches may be present, providing even more failover capacity. In other examples, pods may be arranged differently than the rows-of-racks configuration shown in FIGS. 2 and 3. For example, a pod may include multiple sets of racks arranged radially, i.e., the racks are equidistant from a center switch.

Figure 4:
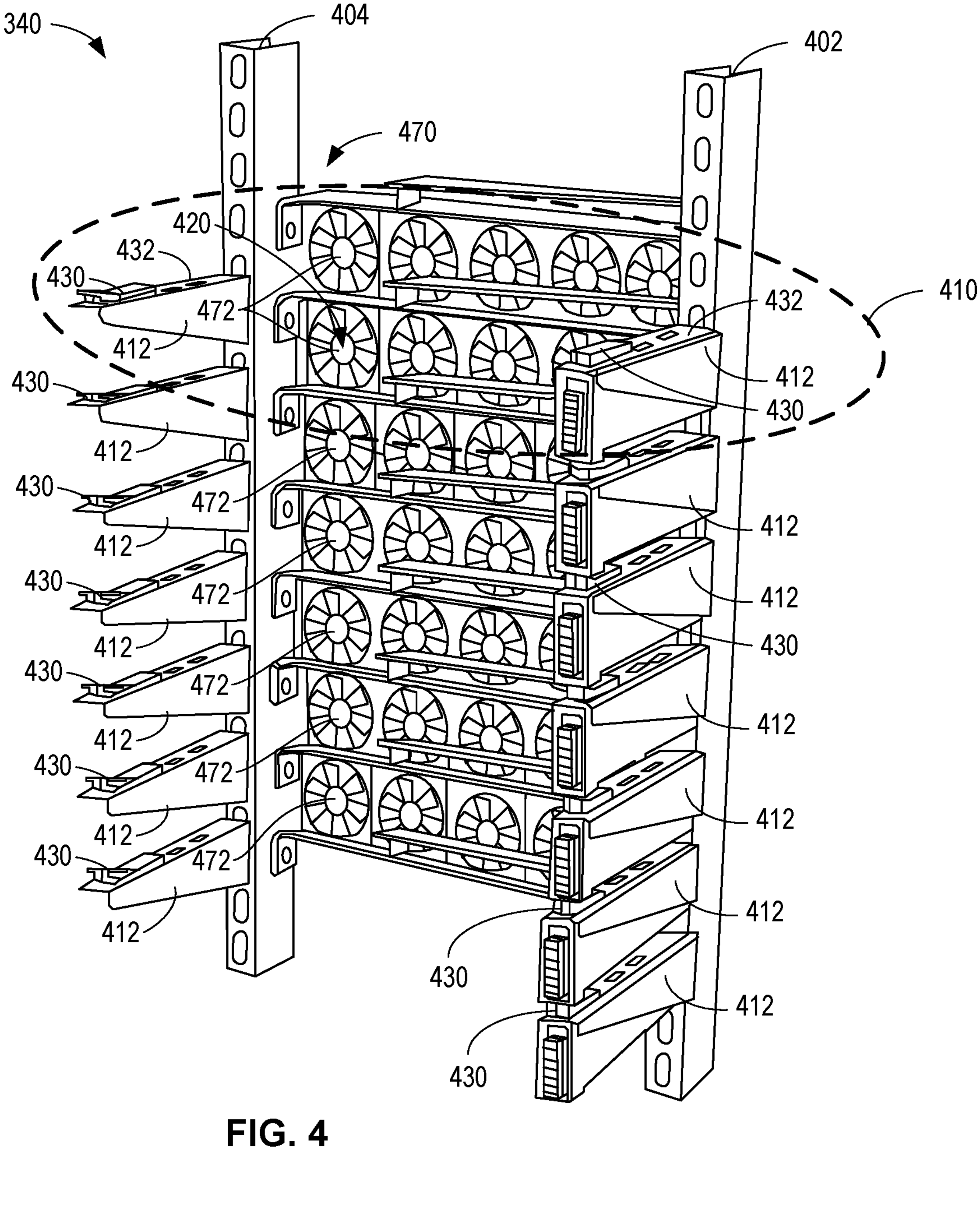
FIG. 4 is a perspective view of at least one example of a rack that may be included in the pod of FIG. 3.
Figure 5:
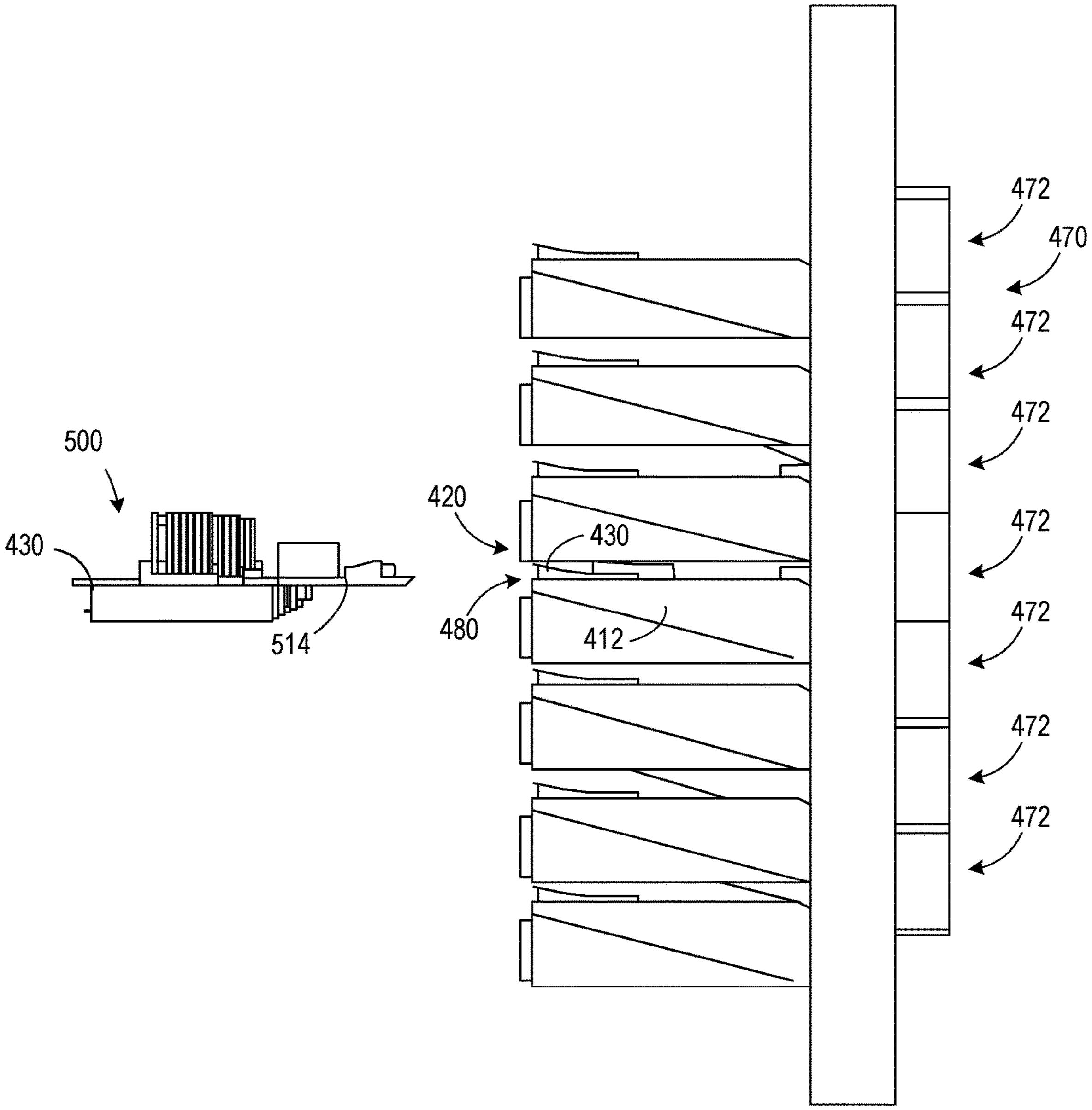
FIG. 5 is a side elevation view of the rack of FIG. 4 and a sled removed therefrom.
Figure 6:
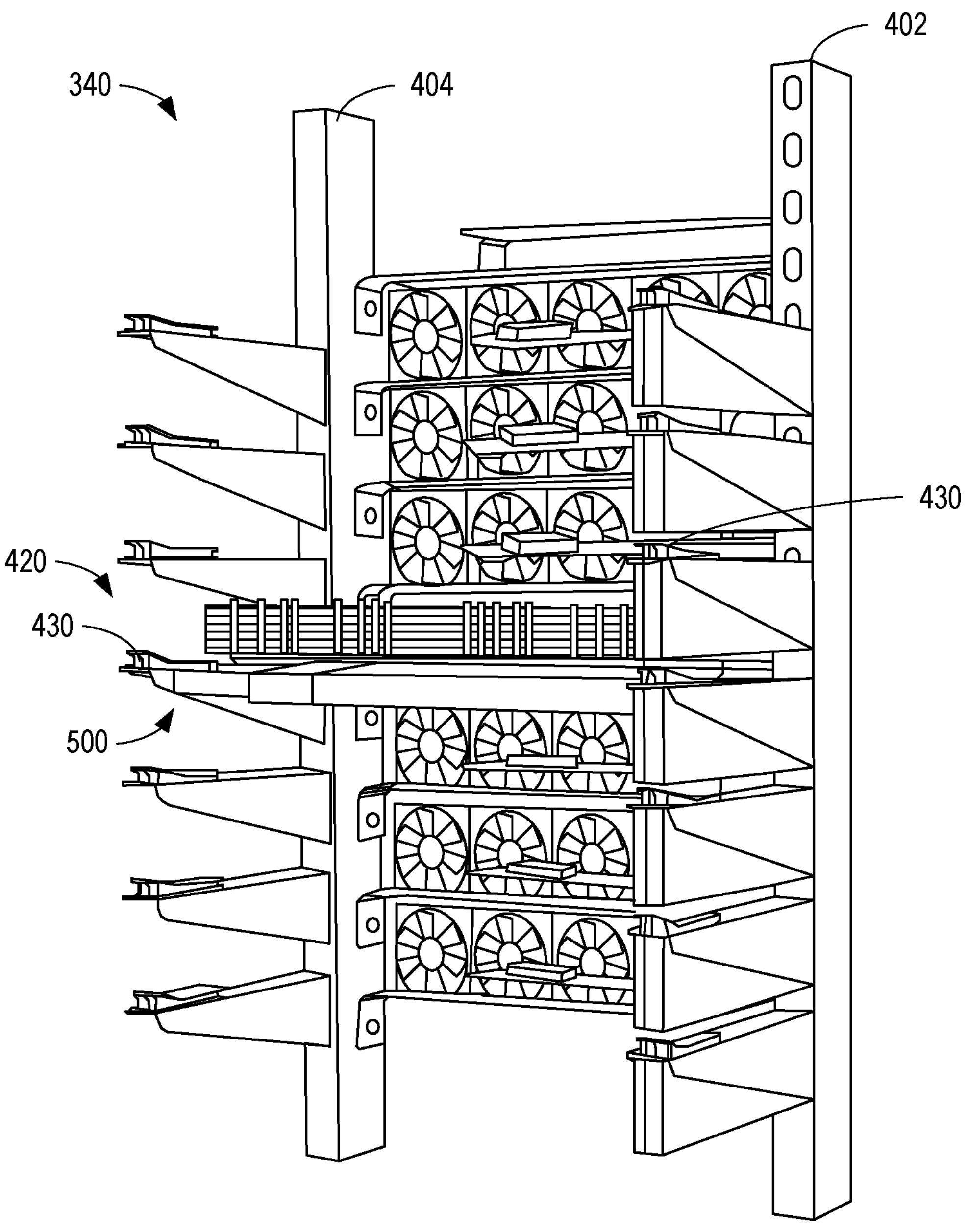
FIG. 6 is a perspective view of the rack of FIG. 4 having a sled mounted therein.

FIGS. 4-6 illustrate an example rack 340 of the data center 200. As shown in the illustrated example, the rack 340 includes two elongated support posts 402, 404, which are arranged vertically. For example, the elongated support posts 402, 404 may extend upwardly from a floor of the data center 200 when deployed. The rack 340 also includes one or more horizontal pairs 410 of elongated support arms 412 (identified in FIG. 4 via a dashed ellipse) configured to support a sled of the data center 200 as discussed below. One elongated support arm 412 of the pair of elongated support arms 412 extends outwardly from the elongated support post 402 and the other elongated support arm 412 extends outwardly from the elongated support post 404.

In the illustrative examples, at least some of the sleds of the data center 200 are chassis-less sleds. That is, such sleds have a chassis-less circuit board substrate on which physical resources (e.g., processors, memory, accelerators, storage, etc.) are mounted as discussed in more detail below. As such, the rack 340 is configured to receive the chassis-less sleds. For example, a given pair 410 of the elongated support arms 412 defines a sled slot 420 of the rack 340, which is configured to receive a corresponding chassis-less sled. To do so, the elongated support arms 412 include corresponding circuit board guides 430 configured to receive the chassis-less circuit board substrate of the sled. The circuit board guides 430 are secured to, or otherwise mounted to, a top side 432 of the corresponding elongated support arms 412. For example, in the illustrative example, the circuit board guides 430 are mounted at a distal end of the corresponding elongated support arm 412 relative to the corresponding elongated support post 402, 404. For clarity of FIGS. 4-6, not every circuit board guide 430 may be referenced in each figure. In some examples, at least some of the sleds include a chassis and the racks 340 are suitably adapted to receive the chassis.

The circuit board guides 430 include an inner wall that defines a circuit board slot 480 configured to receive the chassis-less circuit board substrate of a sled 500 when the sled 500 is received in the corresponding sled slot 420 of the rack 340. To do so, as shown in FIG. 5, a user (or robot) aligns the chassis-less circuit board substrate of an illustrative chassis-less sled 500 to a sled slot 420. The user, or robot, may then slide the chassis-less circuit board substrate forward into the sled slot 420 such that each side edge 514 of the chassis-less circuit board substrate is received in a corresponding circuit board slot 480 of the circuit board guides 430 of the pair 410 of elongated support arms 412 that define the corresponding sled slot 420 as shown in FIG. 5. By having robotically accessible and robotically manipulable sleds including disaggregated resources, the different types of resource can be upgraded independently of one other and at their own optimized refresh rate. Furthermore, the sleds are configured to blindly mate with power and data communication cables in the rack 340, enhancing their ability to be quickly removed, upgraded, reinstalled, and/or replaced. As such, in some examples, the data center 200 may operate (e.g., execute workloads, undergo maintenance and/or upgrades, etc.) without human involvement on the data center floor. In other examples, a human may facilitate one or more maintenance or upgrade operations in the data center 200.

It should be appreciated that the circuit board guides 430 are dual sided. That is, a circuit board guide 430 includes an inner wall that defines a circuit board slot 480 on each side of the circuit board guide 430. In this way, the circuit board guide 430 can support a chassis-less circuit board substrate on either side. As such, a single additional elongated support post may be added to the rack 340 to turn the rack 340 into a two-rack solution that can hold twice as many sled slots 420 as shown in FIG. 4. The illustrative rack 340 includes seven pairs 410 of elongated support arms 412 that define seven corresponding sled slots 420. The sled slots 420 are configured to receive and support a corresponding sled 500 as discussed above. In other examples, the rack 340 may include additional or fewer pairs 410 of elongated support arms 412 (i.e., additional or fewer sled slots 420). It should be appreciated that because the sled 500 is chassis-less, the sled 500 may have an overall height that is different than typical servers. As such, in some examples, the height of a given sled slot 420 may be shorter than the height of a typical server (e.g., shorter than a single rank unit, referred to as "1U"). That is, the vertical distance between pairs 410 of elongated support arms 412 may be less than a standard rack unit "1U." Additionally, due to the relative decrease in height of the sled slots 420, the overall height of the rack 340 in some examples may be shorter than the height of traditional rack enclosures. For example, in some examples, the elongated support posts 402, 404 may have a length of six feet or less. Again, in other examples, the rack 340 may have different dimensions. For example, in some examples, the vertical distance between pairs 410 of elongated support arms 412 may be greater than a standard rack unit "1U". In such examples, the increased vertical distance between the sleds allows for larger heatsinks to be attached to the physical resources and for larger fans to be used (e.g., in the fan array 470 described below) for cooling the sleds, which in turn can allow the physical resources to operate at increased power levels. Further, it should be appreciated that the rack 340 does not include any walls, enclosures, or the like. Rather, the rack 340 is an enclosure-less rack that is opened to the local environment. In some cases, an end plate may be attached to one of the elongated support posts 402, 404 in those situations in which the rack 340 forms an end-of-row rack in the data center 200.

In some examples, various interconnects may be routed upwardly or downwardly through the elongated support posts 402, 404. To facilitate such routing, the elongated support posts 402, 404 include an inner wall that defines an inner chamber in which interconnects may be located. The interconnects routed through the elongated support posts 402, 404 may be implemented as any type of interconnects including, but not limited to, data or communication interconnects to provide communication connections to the sled slots 420, power interconnects to provide power to the sled slots 420, and/or other types of interconnects.

The rack 340, in the illustrative example, includes a support platform on which a corresponding optical data connector (not shown) is mounted. Such optical data connectors are associated with corresponding sled slots 420 and are configured to mate with optical data connectors of corresponding sleds 500 when the sleds 500 are received in the corresponding sled slots 420. In some examples, optical connections between components (e.g., sleds, racks, and switches) in the data center 200 are made with a blind mate optical connection. For example, a door on a given cable may prevent dust from contaminating the fiber inside the cable. In the process of connecting to a blind mate optical connector mechanism, the door is pushed open when the end of the cable approaches or enters the connector mechanism. Subsequently, the optical fiber inside the cable may enter a gel within the connector mechanism and the optical fiber of one cable comes into contact with the optical fiber of another cable within the gel inside the connector mechanism.

The illustrative rack 340 also includes a fan array 470 coupled to the cross-support arms of the rack 340. The fan array 470 includes one or more rows of cooling fans 472, which are aligned in a horizontal line between the elongated support posts 402, 404. In the illustrative example, the fan array 470 includes a row of cooling fans 472 for the different sled slots 420 of the rack 340. As discussed above, the sleds 500 do not include any on-board cooling system in the illustrative example and, as such, the fan array 470 provides cooling for such sleds 500 received in the rack 340. In other examples, some or all of the sleds 500 can include on-board cooling systems. Further, in some examples, the sleds 500 and/or the racks 340 may include and/or incorporate a liquid and/or immersion cooling system to facilitate cooling of electronic component(s) on the sleds 500. The rack 340, in the illustrative example, also includes different power supplies associated with different ones of the sled slots 420. A given power supply is secured to one of the elongated support arms 412 of the pair 410 of elongated support arms 412 that define the corresponding sled slot 420. For example, the rack 340 may include a power supply coupled or secured to individual ones of the elongated support arms 412 extending from the elongated support post 402. A given power supply includes a power connector configured to mate with a power connector of a sled 500 when the sled 500 is received in the corresponding sled slot 420. In the illustrative example, the sled 500 does not include any on-board power supply and, as such, the power supplies provided in the rack 340 supply power to corresponding sleds 500 when mounted to the rack 340. A given power supply is configured to satisfy the power requirements for its associated sled, which can differ from sled to sled. Additionally, the power supplies provided in the rack 340 can operate independent of each other. That is, within a single rack, a first power supply providing power to a compute sled can provide power levels that are different than power levels supplied by a second power supply providing power to an accelerator sled. The power supplies may be controllable at the sled level or rack level, and may be controlled locally by components on the associated sled or remotely, such as by another sled or an orchestrator.

Figure 7:
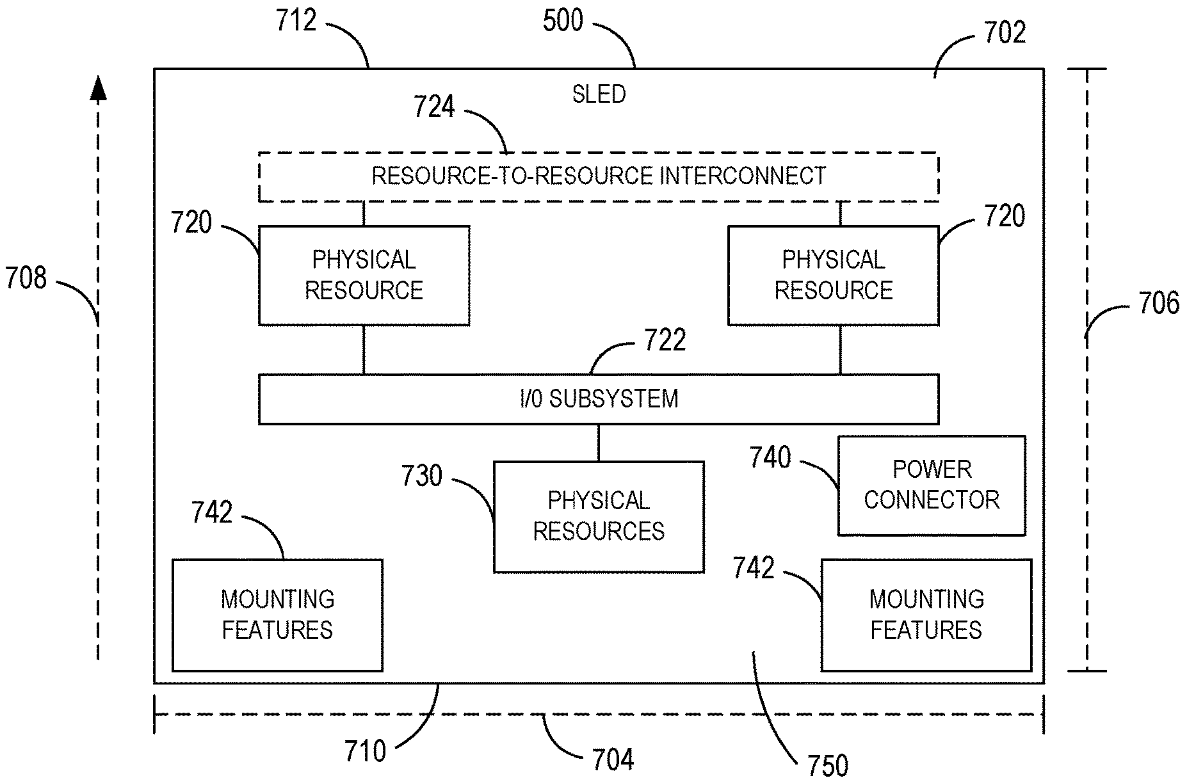
FIG. 7 is a is a block diagram of at least one example of a top side of the sled of FIG. 6.

Referring now to FIG. 7, the sled 500, in the illustrative example, is configured to be mounted in a corresponding rack 340 of the data center 200 as discussed above. In some examples, a give sled 500 may be optimized or otherwise configured for performing particular tasks, such as compute tasks, acceleration tasks, data storage tasks, etc. For example, the sled 500 may be implemented as a compute sled 900 as discussed below in regard to FIGS. 9 and 10, an accelerator sled 1100 as discussed below in regard to FIGS. 11 and 12, a storage sled 1300 as discussed below in regard to FIGS. 13 and 14, or as a sled optimized or otherwise configured to perform other specialized tasks, such as a memory sled 1500, discussed below in regard to FIG. 15.

As discussed above, the illustrative sled 500 includes a chassis-less circuit board substrate 702, which supports various physical resources (e.g., electrical components) mounted thereon. It should be appreciated that the circuit board substrate 702 is "chassis-less" in that the sled 500 does not include a housing or enclosure. Rather, the chassis-less circuit board substrate 702 is open to the local environment. The chassis-less circuit board substrate 702 may be formed from any material capable of supporting the various electrical components mounted thereon. For example, in an illustrative example, the chassis-less circuit board substrate 702 is formed from an FR-4 glass-reinforced epoxy laminate material. Other materials may be used to form the chassis-less circuit board substrate 702 in other examples.

As discussed in more detail below, the chassis-less circuit board substrate 702 includes multiple features that improve the thermal cooling characteristics of the various electrical components mounted on the chassis-less circuit board substrate 702. As discussed, the chassis-less circuit board substrate 702 does not include a housing or enclosure, which may improve the airflow over the electrical components of the sled 500 by reducing those structures that may inhibit air flow. For example, because the chassis-less circuit board substrate 702 is not positioned in an individual housing or enclosure, there is no vertically-arranged backplane (e.g., a back plate of the chassis) attached to the chassis-less circuit board substrate 702, which could inhibit air flow across the electrical components. Additionally, the chassis-less circuit board substrate 702 has a geometric shape configured to reduce the length of the airflow path across the electrical components mounted to the chassis-less circuit board substrate 702. For example, the illustrative chassis-less circuit board substrate 702 has a width 704 that is greater than a depth 706 of the chassis-less circuit board substrate 702. In one particular example, the chassis-less circuit board substrate 702 has a width of about 21 inches and a depth of about 9 inches, compared to a typical server that has a width of about 17 inches and a depth of about 39 inches. As such, an airflow path 708 that extends from a front edge 710 of the chassis-less circuit board substrate 702 toward a rear edge 712 has a shorter distance relative to typical servers, which may improve the thermal cooling characteristics of the sled 500. Furthermore, although not illustrated in FIG. 7, the various physical resources mounted to the chassis-less circuit board substrate 702 in this example are mounted in corresponding locations such that no two substantively heat-producing electrical components shadow each other as discussed in more detail below. That is, no two electrical components, which produce appreciable heat during operation (i.e., greater than a nominal heat sufficient enough to adversely impact the cooling of another electrical component), are mounted to the chassis-less circuit board substrate 702 linearly in-line with each other along the direction of the airflow path 708 (i.e., along a direction extending from the front edge 710 toward the rear edge 712 of the chassis-less circuit board substrate 702). The placement and/or structure of the features may be suitable adapted when the electrical component(s) are being cooled via liquid (e.g., one phase or two phase cooling).

As discussed above, the illustrative sled 500 includes one or more physical resources 720 mounted to a top side 750 of the chassis-less circuit board substrate 702. Although two physical resources 720 are shown in FIG. 7, it should be appreciated that the sled 500 may include one, two, or more physical resources 720 in other examples. The physical resources 720 may be implemented as any type of processor, controller, or other compute circuit capable of performing various tasks such as compute functions and/or controlling the functions of the sled 500 depending on, for example, the type or intended functionality of the sled 500. For example, as discussed in more detail below, the physical resources 720 may be implemented as high-performance processors in examples in which the sled 500 is implemented as a compute sled, as accelerator co-processors or circuits in examples in which the sled 500 is implemented as an accelerator sled, storage controllers in examples in which the sled 500 is implemented as a storage sled, or a set of memory devices in examples in which the sled 500 is implemented as a memory sled.

The sled 500 also includes one or more additional physical resources 730 mounted to the top side 750 of the chassis-less circuit board substrate 702. In the illustrative example, the additional physical resources include a network interface controller (NIC) as discussed in more detail below. Depending on the type and functionality of the sled 500, the physical resources 730 may include additional or other electrical components, circuits, and/or devices in other examples.

The physical resources 720 are communicatively coupled to the physical resources 730 via an input/output (I/O) subsystem 722. The I/O subsystem 722 may be implemented as circuitry and/or components to facilitate input/output operations with the physical resources 720, the physical resources 730, and/or other components of the sled 500. For example, the I/O subsystem 722 may be implemented as, or otherwise include, memory controller hubs, input/output control hubs, integrated sensor hubs, firmware devices, communication links (e.g., point-to-point links, bus links, wires, cables, waveguides, light guides, printed circuit board traces, etc.), and/or other components and subsystems to facilitate the input/output operations. In the illustrative example, the I/O subsystem 722 is implemented as, or otherwise includes, a double data rate 4 (DDR4) data bus, a DDR5 data bus, or another system host memory architecture.

In some examples, the sled 500 may also include a resource-to-resource interconnect 724. The resource-to-resource interconnect 724 may be implemented as any type of communication interconnect capable of facilitating resource-to-resource communications. In the illustrative example, the resource-to-resource interconnect 724 is implemented as a high-speed point-to-point interconnect (e.g., faster than the I/O subsystem 722). For example, the resource-to-resource interconnect 724 may be implemented as a QuickPath Interconnect (QPI), an UltraPath Interconnect (UPI), or other high-speed point-to-point interconnect dedicated to resource-to-resource communications.

The sled 500 also includes a power connector 740 configured to mate with a corresponding power connector of the rack 340 when the sled 500 is mounted in the corresponding rack 340. The sled 500 receives power from a power supply of the rack 340 via the power connector 740 to supply power to the various electrical components of the sled 500. That is, the sled 500 does not include any local power supply (i.e., an on-board power supply) to provide power to the electrical components of the sled 500. The exclusion of a local or on-board power supply facilitates the reduction in the overall footprint of the chassis-less circuit board substrate 702, which may increase the thermal cooling characteristics of the various electrical components mounted on the chassis-less circuit board substrate 702 as discussed above. In some examples, voltage regulators are placed on a bottom side 850 (see FIG. 8) of the chassis-less circuit board substrate 702 directly opposite of processor circuitry 920 (see FIG. 9), and power is routed from the voltage regulators to the processor circuitry 920 by vias extending through the circuit board substrate 702. Such a configuration provides an increased thermal budget, additional current and/or voltage, and better voltage control relative to typical printed circuit boards in which processor power is delivered from a voltage regulator, in part, by printed circuit traces.

In some examples, the sled 500 may also include mounting features 742 configured to mate with a mounting arm, or other structure, of a robot to facilitate the placement of the sled 500 in a rack 340 by the robot. The mounting features 742 may be implemented as any type of physical structures that allow the robot to grasp the sled 500 without damaging the chassis-less circuit board substrate 702 or the electrical components mounted thereto. For example, in some examples, the mounting features 742 may be implemented as non-conductive pads attached to the chassis-less circuit board substrate 702. In other examples, the mounting features may be implemented as brackets, braces, or other similar structures attached to the chassis-less circuit board substrate 702. The particular number, shape, size, and/or make-up of the mounting feature 742 may depend on the design of the robot configured to manage the sled 500.

Figure 8:
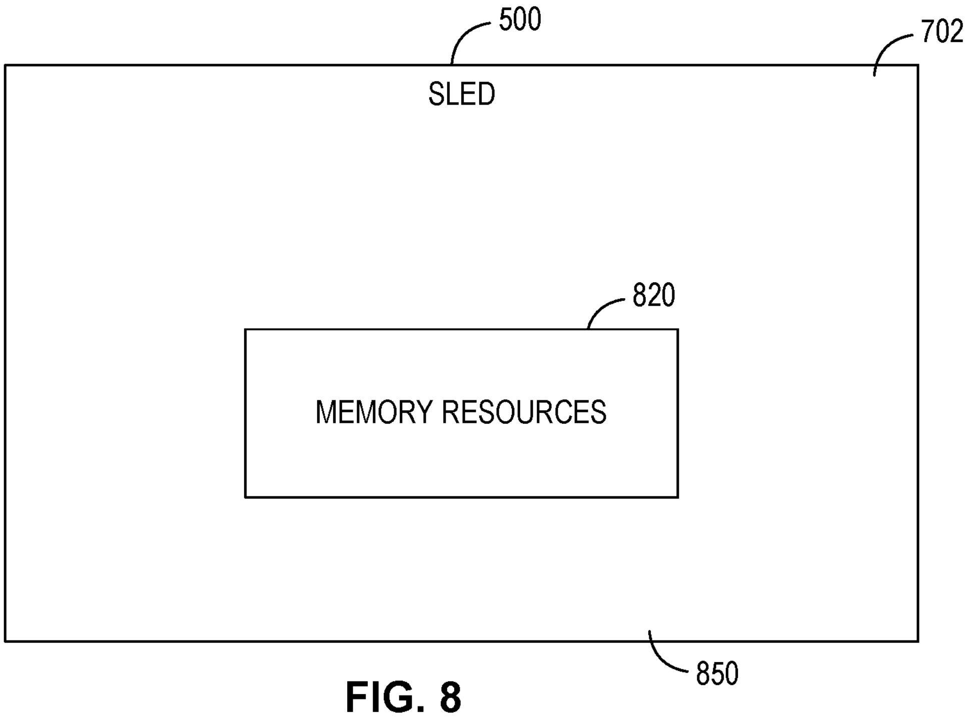
FIG. 8 is a block diagram of at least one example of a bottom side of the sled of FIG. 7.

Referring now to FIG. 8, in addition to the physical resources 730 mounted on the top side 750 of the chassis-less circuit board substrate 702, the sled 500 also includes one or more memory devices 820 mounted to a bottom side 850 of the chassis-less circuit board substrate 702. That is, the chassis-less circuit board substrate 702 is implemented as a double-sided circuit board. The physical resources 720 are communicatively coupled to the memory devices 820 via the I/O subsystem 722. For example, the physical resources 720 and the memory devices 820 may be communicatively coupled by one or more vias extending through the chassis-less circuit board substrate 702. Different ones of the physical resources 720 may be communicatively coupled to different sets of one or more memory devices 820 in some examples. Alternatively, in other examples, different ones of the physical resources 720 may be communicatively coupled to the same ones of the memory devices 820.

The memory devices 820 may be implemented as any type of memory device capable of storing data for the physical resources 720 during operation of the sled 500, such as any type of volatile (e.g., dynamic random access memory (DRAM), etc.) or non-volatile memory. Volatile memory may be a storage medium that requires power to maintain the state of data stored by the medium. Non-limiting examples of volatile memory may include various types of random access memory (RAM), such as dynamic random access memory (DRAM) or static random access memory (SRAM). One particular type of DRAM that may be used in a memory module is synchronous dynamic random access memory (SDRAM). In particular examples, DRAM of a memory component may comply with a standard promulgated by JEDEC, such as JESD79F for DDR SDRAM, JESD79-2F for DDR2 SDRAM, JESD79-3F for DDR3 SDRAM, JESD79-4A for DDR4 SDRAM, JESD209 for Low Power DDR (LPDDR), JESD209-2 for LPDDR2, JESD209-3 for LPDDR3, and JESD209-4 for LPDDR4. Such standards (and similar standards) may be referred to as DDR-based standards and communication interfaces of the storage devices that implement such standards may be referred to as DDR-based interfaces.

In one example, the memory device is a block addressable memory device, such as those based on NAND or NOR technologies. A memory device may also include next-generation nonvolatile devices, such as Intel 3D XPoint™ memory or other byte addressable write-in-place nonvolatile memory devices. In one example, the memory device may be or may include memory devices that use chalcogenide glass, multi-threshold level NAND flash memory, NOR flash memory, single or multi-level Phase Change Memory (PCM), a resistive memory, nanowire memory, ferroelectric transistor random access memory (FeTRAM), anti-ferroelectric memory, magnetoresistive random access memory (MRAM) memory that incorporates memristor technology, resistive memory including the metal oxide base, the oxygen vacancy base and the conductive bridge Random Access Memory (CB-RAM), or spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory. The memory device may refer to the die itself and/or to a packaged memory product. In some examples, the memory device may include a transistor-less stackable cross point architecture in which memory cells sit at the intersection of word lines and bit lines and are individually addressable and in which bit storage is based on a change in bulk resistance.

Figure 9:
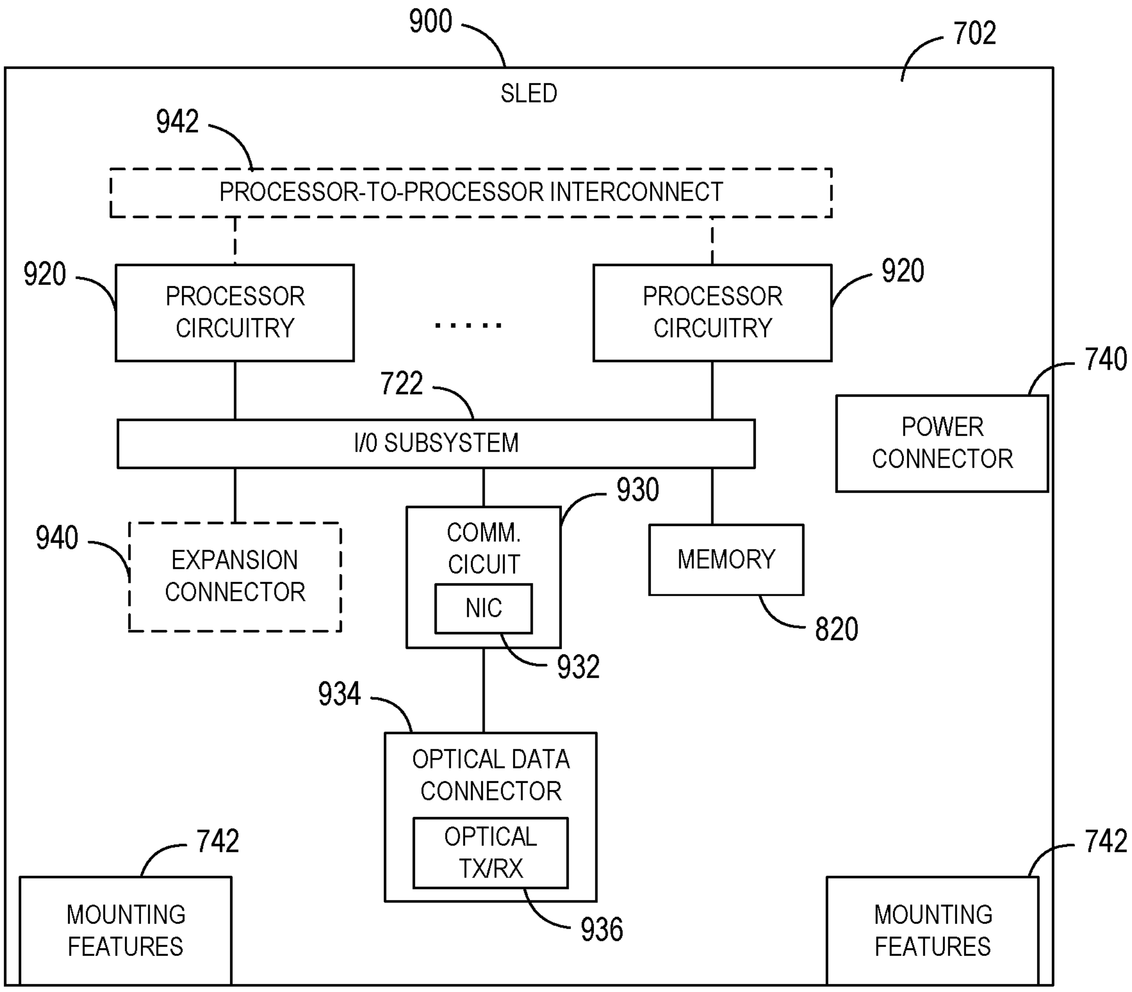
FIG. 9 is a block diagram of at least one example of a compute sled usable in the data center of FIG. 2.

Referring now to FIG. 9, in some examples, the sled 500 may be implemented as a compute sled 900. The compute sled 900 is optimized, or otherwise configured, to perform compute tasks. As discussed above, the compute sled 900 may rely on other sleds, such as acceleration sleds and/or storage sleds, to perform such compute tasks. The compute sled 900 includes various physical resources (e.g., electrical components) similar to the physical resources of the sled 500, which have been identified in FIG. 9 using the same reference numbers. The description of such components provided above in regard to FIGS. 7 and 8 applies to the corresponding components of the compute sled 900 and is not repeated herein for clarity of the description of the compute sled 900.

In the illustrative compute sled 900, the physical resources 720 include processor circuitry 920. Although only two blocks of processor circuitry 920 are shown in FIG. 9, it should be appreciated that the compute sled 900 may include additional processor circuits 920 in other examples. Illustratively, the processor circuitry 920 corresponds to high-performance processors 920 and may be configured to operate at a relatively high power rating. Although the high-performance processor circuitry 920 generates additional heat operating at power ratings greater than typical processors (which operate at around 155-230 W), the enhanced thermal cooling characteristics of the chassis-less circuit board substrate 702 discussed above facilitate the higher power operation. For example, in the illustrative example, the processor circuitry 920 is configured to operate at a power rating of at least 250 W. In some examples, the processor circuitry 920 may be configured to operate at a power rating of at least 350 W.

In some examples, the compute sled 900 may also include a processor-to-processor interconnect 942. Similar to the resource-to-resource interconnect 724 of the sled 500 discussed above, the processor-to-processor interconnect 942 may be implemented as any type of communication interconnect capable of facilitating processor-to-processor interconnect 942 communications. In the illustrative example, the processor-to-processor interconnect 942 is implemented as a high-speed point-to-point interconnect (e.g., faster than the I/O subsystem 722). For example, the processor-to-processor interconnect 942 may be implemented as a QuickPath Interconnect (QPI), an UltraPath Interconnect (UPI), or other high-speed point-to-point interconnect dedicated to processor-to-processor communications.

The compute sled 900 also includes a communication circuit 930. The illustrative communication circuit 930 includes a network interface controller (NIC) 932, which may also be referred to as a host fabric interface (HFI). The NIC 932 may be implemented as, or otherwise include, any type of integrated circuit, discrete circuits, controller chips, chipsets, add-in-boards, daughtercards, network interface cards, or other devices that may be used by the compute sled 900 to connect with another compute device (e.g., with other sleds 500). In some examples, the NIC 932 may be implemented as part of a system-on-a-chip (SoC) that includes one or more processors, or included on a multichip package that also contains one or more processors. In some examples, the NIC 932 may include a local processor (not shown) and/or a local memory (not shown) that are both local to the NIC 932. In such examples, the local processor of the NIC 932 may be capable of performing one or more of the functions of the processor circuitry 920. Additionally or alternatively, in such examples, the local memory of the NIC 932 may be integrated into one or more components of the compute sled at the board level, socket level, chip level, and/or other levels.

The communication circuit 930 is communicatively coupled to an optical data connector 934. The optical data connector 934 is configured to mate with a corresponding optical data connector of the rack 340 when the compute sled 900 is mounted in the rack 340. Illustratively, the optical data connector 934 includes a plurality of optical fibers which lead from a mating surface of the optical data connector 934 to an optical transceiver 936. The optical transceiver 936 is configured to convert incoming optical signals from the rack-side optical data connector to electrical signals and to convert electrical signals to outgoing optical signals to the rack-side optical data connector. Although shown as forming part of the optical data connector 934 in the illustrative example, the optical transceiver 936 may form a portion of the communication circuit 930 in other examples.

In some examples, the compute sled 900 may also include an expansion connector 940. In such examples, the expansion connector 940 is configured to mate with a corresponding connector of an expansion chassis-less circuit board substrate to provide additional physical resources to the compute sled 900. The additional physical resources may be used, for example, by the processor circuitry 920 during operation of the compute sled 900. The expansion chassis-less circuit board substrate may be substantially similar to the chassis-less circuit board substrate 702 discussed above and may include various electrical components mounted thereto. The particular electrical components mounted to the expansion chassis-less circuit board substrate may depend on the intended functionality of the expansion chassis-less circuit board substrate. For example, the expansion chassis-less circuit board substrate may provide additional compute resources, memory resources, and/or storage resources. As such, the additional physical resources of the expansion chassis-less circuit board substrate may include, but is not limited to, processors, memory devices, storage devices, and/or accelerator circuits including, for example, field programmable gate arrays (FPGA), application-specific integrated circuits (ASICs), security co-processors, graphics processing units (GPUs), machine learning circuits, or other specialized processors, controllers, devices, and/or circuits.

Figure 10:
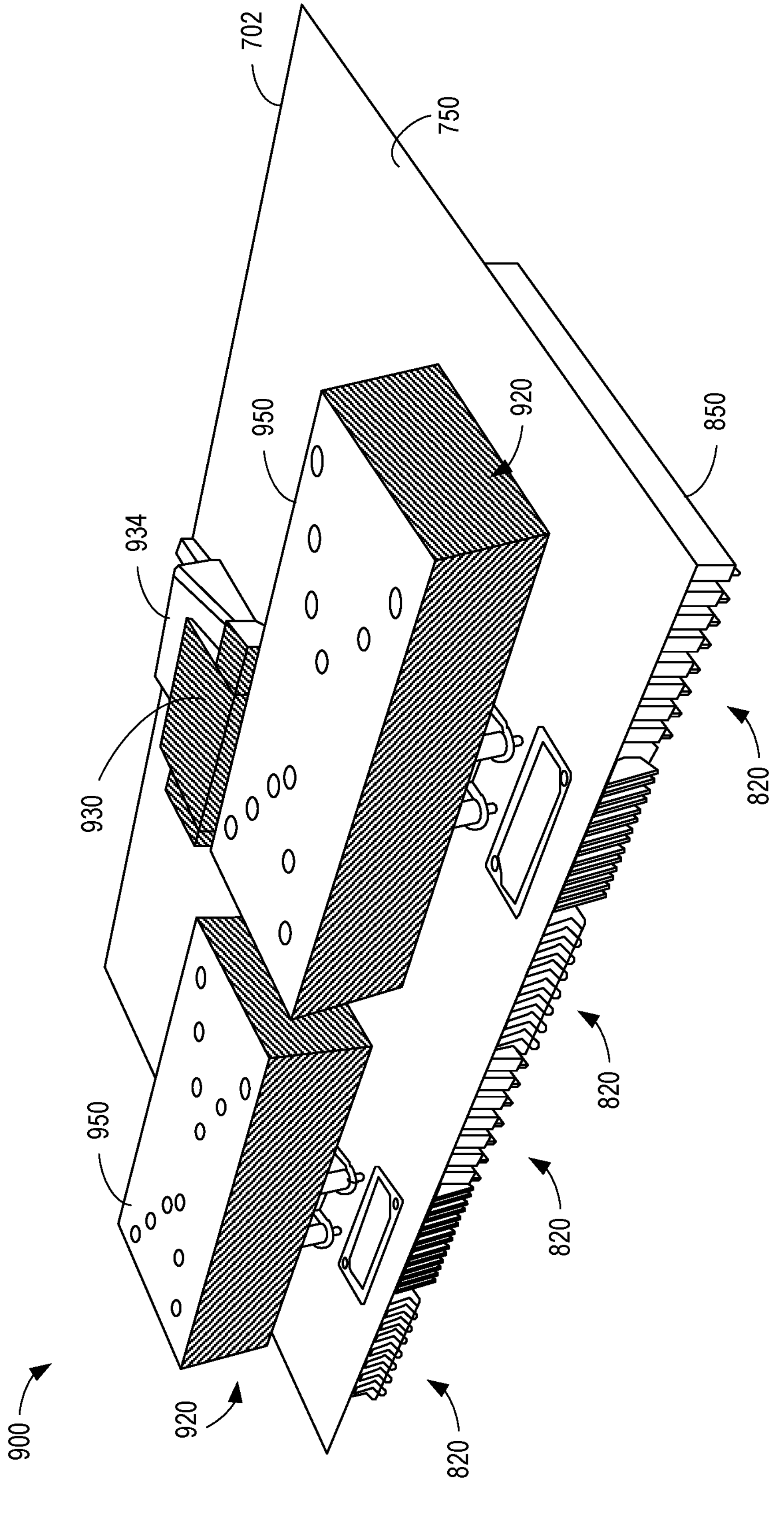
FIG. 10 is a top perspective view of at least one example of the compute sled of FIG. 9.

Referring now to FIG. 10, an illustrative example of the compute sled 900 is shown. As shown, the processor circuitry 920, communication circuit 930, and optical data connector 934 are mounted to the top side 750 of the chassis-less circuit board substrate 702. Any suitable attachment or mounting technology may be used to mount the physical resources of the compute sled 900 to the chassis-less circuit board substrate 702. For example, the various physical resources may be mounted in corresponding sockets (e.g., a processor socket), holders, or brackets. In some cases, some of the electrical components may be directly mounted to the chassis-less circuit board substrate 702 via soldering or similar techniques.

As discussed above, the separate processor circuitry 920 and the communication circuit 930 are mounted to the top side 750 of the chassis-less circuit board substrate 702 such that no two heat-producing, electrical components shadow each other. In the illustrative example, the processor circuitry 920 and the communication circuit 930 are mounted in corresponding locations on the top side 750 of the chassis-less circuit board substrate 702 such that no two of those physical resources are linearly in-line with others along the direction of the airflow path 708. It should be appreciated that, although the optical data connector 934 is in-line with the communication circuit 930, the optical data connector 934 produces no or nominal heat during operation.

The memory devices 820 of the compute sled 900 are mounted to the bottom side 850 of the of the chassis-less circuit board substrate 702 as discussed above in regard to the sled 500. Although mounted to the bottom side 850, the memory devices 820 are communicatively coupled to the processor circuitry 920 located on the top side 750 via the I/O subsystem 722. Because the chassis-less circuit board substrate 702 is implemented as a double-sided circuit board, the memory devices 820 and the processor circuitry 920 may be communicatively coupled by one or more vias, connectors, or other mechanisms extending through the chassis-less circuit board substrate 702. Different processor circuitry 920 (e.g., different processors) may be communicatively coupled to a different set of one or more memory devices 820 in some examples. Alternatively, in other examples, different processor circuitry 920 (e.g., different processors) may be communicatively coupled to the same ones of the memory devices 820. In some examples, the memory devices 820 may be mounted to one or more memory mezzanines on the bottom side of the chassis-less circuit board substrate 702 and may interconnect with a corresponding processor circuitry 920 through a ball-grid array.

Different processor circuitry 920 (e.g., different processors) include and/or is associated with corresponding heatsinks 950 secured thereto. Due to the mounting of the memory devices 820 to the bottom side 850 of the chassis-less circuit board substrate 702 (as well as the vertical spacing of the sleds 500 in the corresponding rack 340), the top side 750 of the chassis-less circuit board substrate 702 includes additional "free" area or space that facilitates the use of heatsinks 950 having a larger size relative to traditional heatsinks used in typical servers. Additionally, due to the improved thermal cooling characteristics of the chassis-less circuit board substrate 702, none of the processor heatsinks 950 include cooling fans attached thereto. That is, the heatsinks 950 may be fan-less heatsinks. In some examples, the heatsinks 950 mounted atop the processor circuitry 920 may overlap with the heatsink attached to the communication circuit 930 in the direction of the airflow path 708 due to their increased size, as illustratively suggested by FIG. 10.

Figure 11:
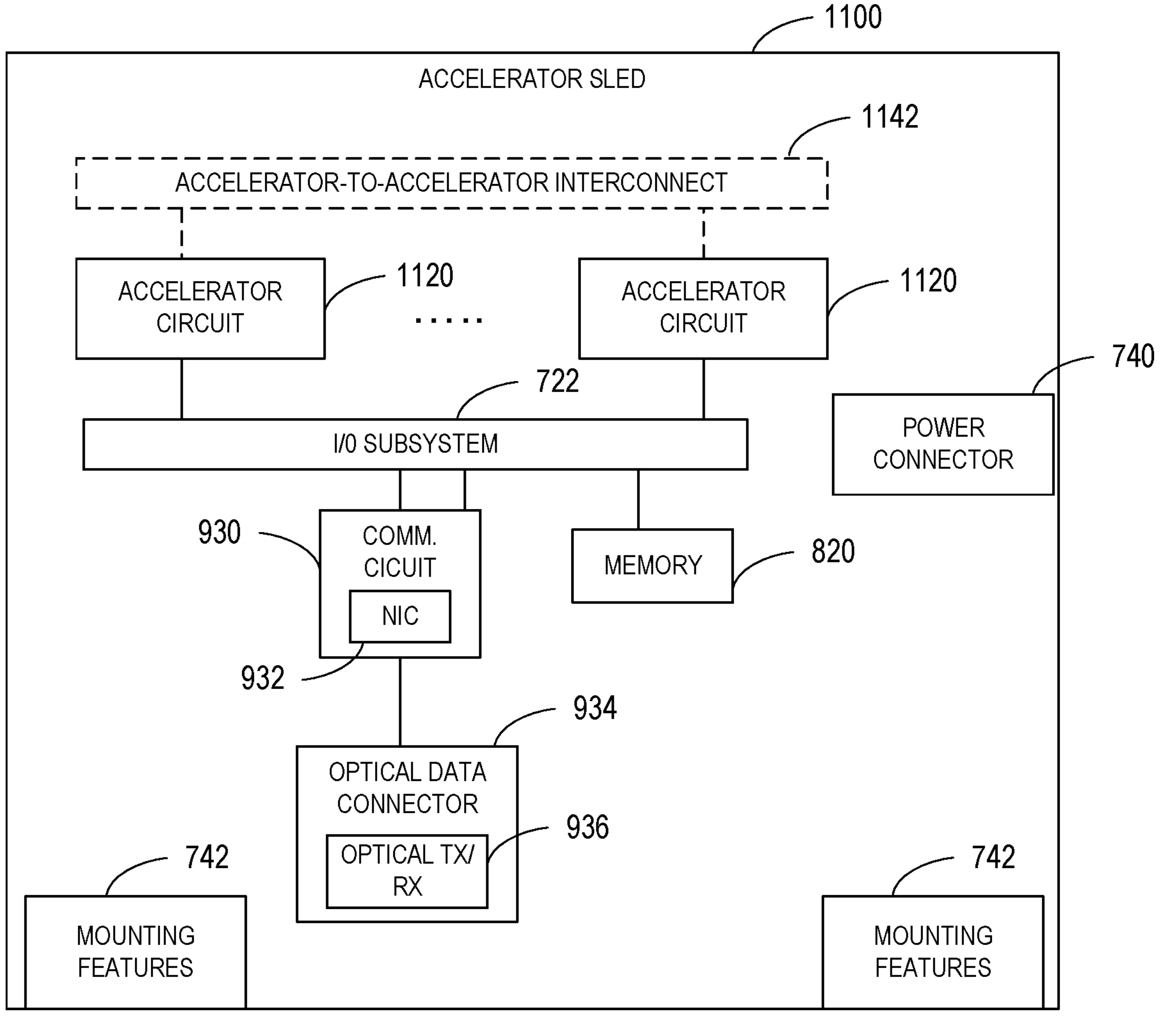
FIG. 11 is a block diagram of at least one example of an accelerator sled usable in the data center of FIG. 2.

Referring now to FIG. 11, in some examples, the sled 500 may be implemented as an accelerator sled 1100. The accelerator sled 1100 is configured, to perform specialized compute tasks, such as machine learning, encryption, hashing, or other computational-intensive task. In some examples, for example, a compute sled 900 may offload tasks to the accelerator sled 1100 during operation. The accelerator sled 1100 includes various components similar to components of the sled 500 and/or the compute sled 900, which have been identified in FIG. 11 using the same reference numbers. The description of such components provided above in regard to FIGS. 7, 8, and 9 apply to the corresponding components of the accelerator sled 1100 and is not repeated herein for clarity of the description of the accelerator sled 1100.

Figure 12:
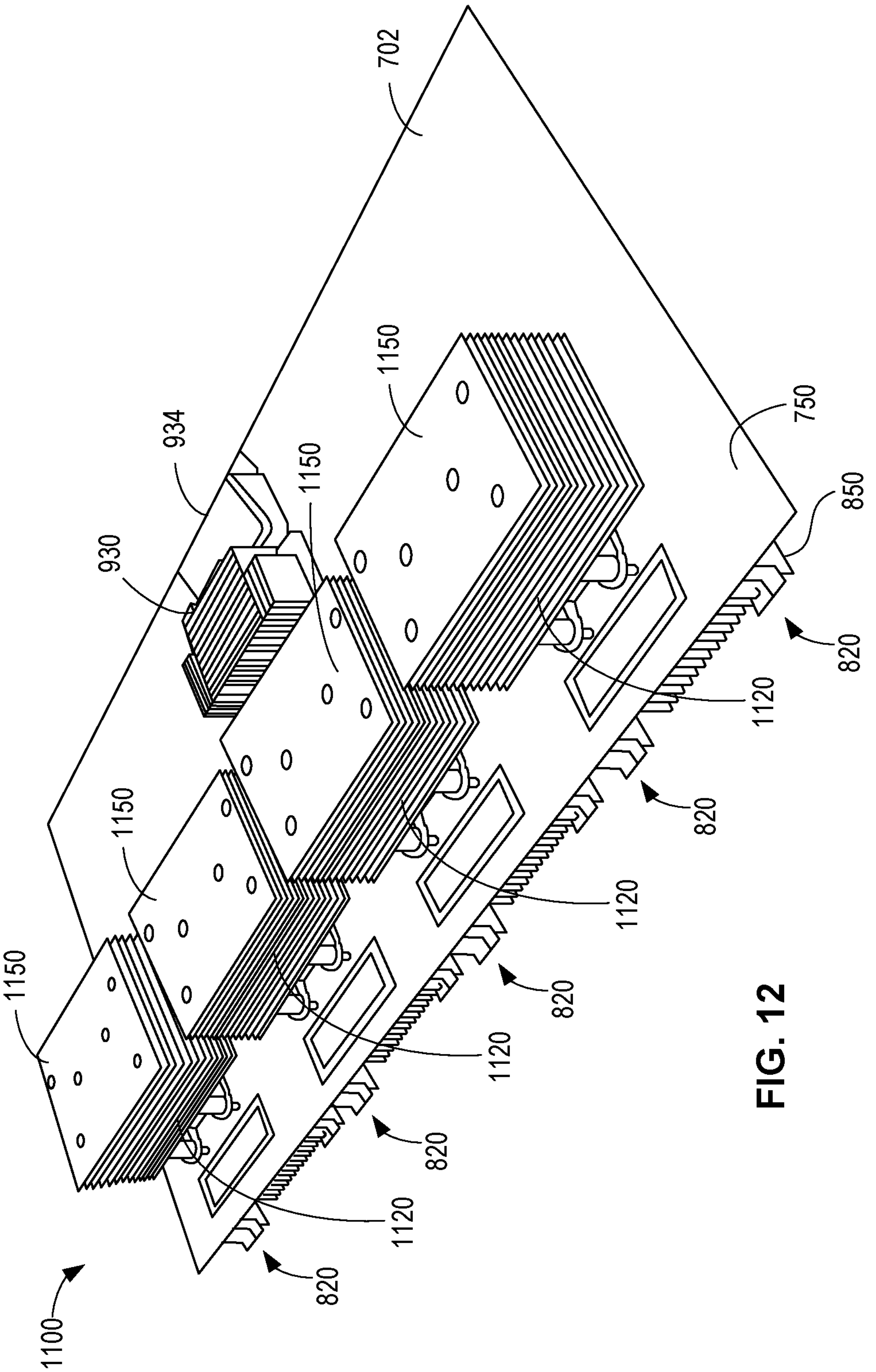
FIG. 12 is a top perspective view of at least one example of the accelerator sled of FIG. 10.

In the illustrative accelerator sled 1100, the physical resources 720 include accelerator circuits 1120. Although only two accelerator circuits 1120 are shown in FIG. 11, it should be appreciated that the accelerator sled 1100 may include additional accelerator circuits 1120 in other examples. For example, as shown in FIG. 12, the accelerator sled 1100 may include four accelerator circuits 1120. The accelerator circuits 1120 may be implemented as any type of processor, co-processor, compute circuit, or other device capable of performing compute or processing operations. For example, the accelerator circuits 1120 may be implemented as, for example, field programmable gate arrays (FPGA), application-specific integrated circuits (ASICs), security co-processors, graphics processing units (GPUs), neuromorphic processor units, quantum computers, machine learning circuits, or other specialized processors, controllers, devices, and/or circuits.

In some examples, the accelerator sled 1100 may also include an accelerator-to-accelerator interconnect 1142. Similar to the resource-to-resource interconnect 724 of the sled 500 discussed above, the accelerator-to-accelerator interconnect 1142 may be implemented as any type of communication interconnect capable of facilitating accelerator-to-accelerator communications. In the illustrative example, the accelerator-to-accelerator interconnect 1142 is implemented as a high-speed point-to-point interconnect (e.g., faster than the I/O subsystem 722). For example, the accelerator-to-accelerator interconnect 1142 may be implemented as a QuickPath Interconnect (QPI), an UltraPath Interconnect (UPI), or other high-speed point-to-point interconnect dedicated to processor-to-processor communications. In some examples, the accelerator circuits 1120 may be daisy-chained with a primary accelerator circuit 1120 connected to the NIC 932 and memory 820 through the I/O subsystem 722 and a secondary accelerator circuit 1120 connected to the NIC 932 and memory 820 through a primary accelerator circuit 1120.

Referring now to FIG. 12, an illustrative example of the accelerator sled 1100 is shown. As discussed above, the accelerator circuits 1120, the communication circuit 930, and the optical data connector 934 are mounted to the top side 750 of the chassis-less circuit board substrate 702. Again, the individual accelerator circuits 1120 and communication circuit 930 are mounted to the top side 750 of the chassis-less circuit board substrate 702 such that no two heat-producing, electrical components shadow each other as discussed above. The memory devices 820 of the accelerator sled 1100 are mounted to the bottom side 850 of the of the chassis-less circuit board substrate 702 as discussed above in regard to the sled 500. Although mounted to the bottom side 850, the memory devices 820 are communicatively coupled to the accelerator circuits 1120 located on the top side 750 via the I/O subsystem 722 (e.g., through vias). Further, the accelerator circuits 1120 may include and/or be associated with a heatsink 1150 that is larger than a traditional heatsink used in a server. As discussed above with reference to the heatsinks 950 of FIG. 9, the heatsinks 1150 may be larger than traditional heatsinks because of the "free" area provided by the memory resources 820 being located on the bottom side 850 of the chassis-less circuit board substrate 702 rather than on the top side 750.

Figure 13:
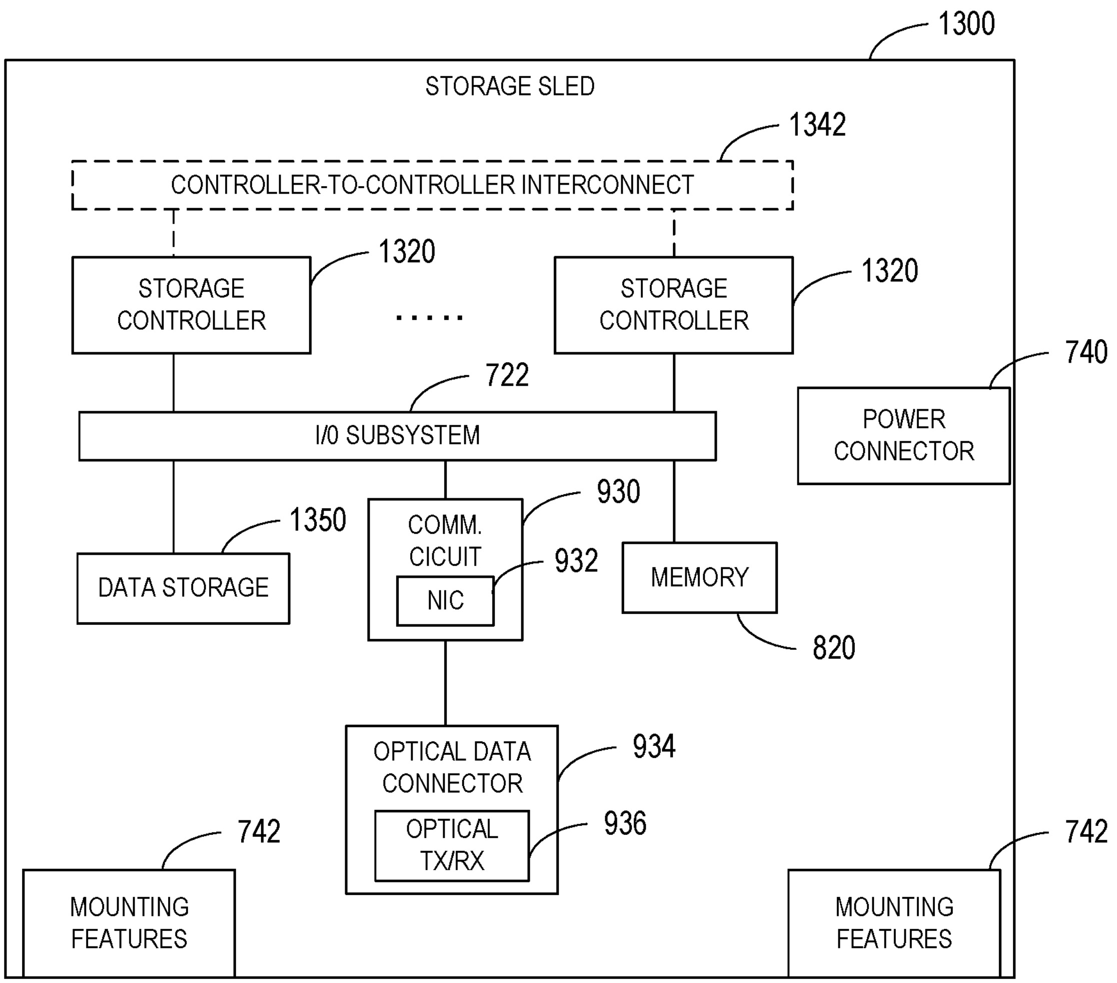
FIG. 13 is a block diagram of at least one example of a storage sled usable in the data center of FIG. 2.

Referring now to FIG. 13, in some examples, the sled 500 may be implemented as a storage sled 1300. The storage sled 1300 is configured, to store data in a data storage 1350 local to the storage sled 1300. For example, during operation, a compute sled 900 or an accelerator sled 1100 may store and retrieve data from the data storage 1350 of the storage sled 1300. The storage sled 1300 includes various components similar to components of the sled 500 and/or the compute sled 900, which have been identified in FIG. 13 using the same reference numbers. The description of such components provided above in regard to FIGS. 7, 8, and 9 apply to the corresponding components of the storage sled 1300 and is not repeated herein for clarity of the description of the storage sled 1300.

In the illustrative storage sled 1300, the physical resources 720 includes storage controllers 1320. Although only two storage controllers 1320 are shown in FIG. 13, it should be appreciated that the storage sled 1300 may include additional storage controllers 1320 in other examples. The storage controllers 1320 may be implemented as any type of processor, controller, or control circuit capable of controlling the storage and retrieval of data into the data storage 1350 based on requests received via the communication circuit 930. In the illustrative example, the storage controllers 1320 are implemented as relatively low-power processors or controllers. For example, in some examples, the storage controllers 1320 may be configured to operate at a power rating of about 75 watts.

In some examples, the storage sled 1300 may also include a controller-to-controller interconnect 1342. Similar to the resource-to-resource interconnect 724 of the sled 500 discussed above, the controller-to-controller interconnect 1342 may be implemented as any type of communication interconnect capable of facilitating controller-to-controller communications. In the illustrative example, the controller-to-controller interconnect 1342 is implemented as a high-speed point-to-point interconnect (e.g., faster than the I/O subsystem 722). For example, the controller-to-controller interconnect 1342 may be implemented as a QuickPath Interconnect (QPI), an UltraPath Interconnect (UPI), or other high-speed point-to-point interconnect dedicated to processor-to-processor communications.

Figure 14:
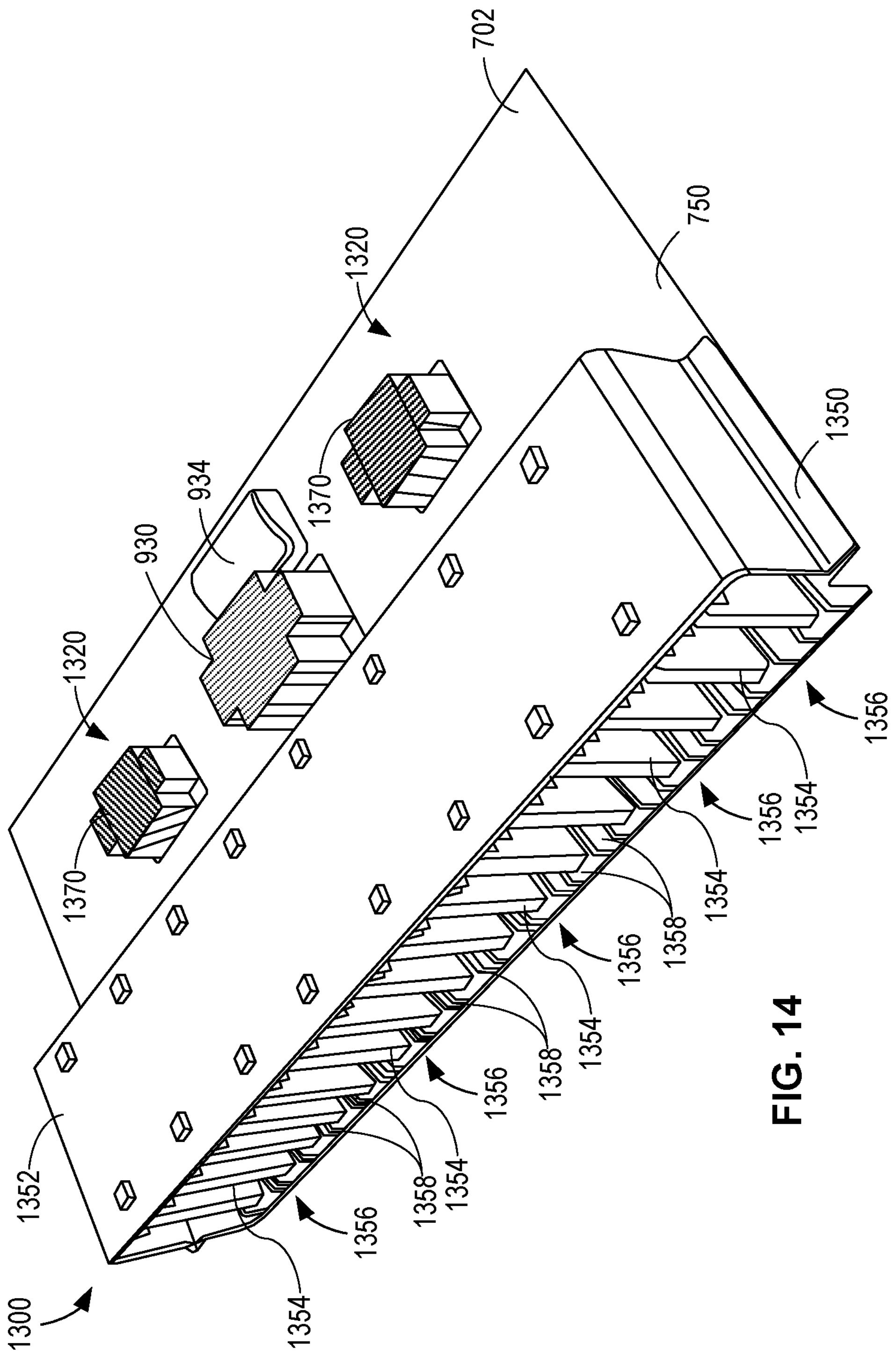
FIG. 14 is a top perspective view of at least one example of the storage sled of FIG. 13.

Referring now to FIG. 14, an illustrative example of the storage sled 1300 is shown. In the illustrative example, the data storage 1350 is implemented as, or otherwise includes, a storage cage 1352 configured to house one or more solid state drives (SSDs) 1354. To do so, the storage cage 1352 includes a number of mounting slots 1356, which are configured to receive corresponding solid state drives 1354. The mounting slots 1356 include a number of drive guides 1358 that cooperate to define an access opening of the corresponding mounting slot 1356. The storage cage 1352 is secured to the chassis-less circuit board substrate 702 such that the access openings face away from (i.e., toward the front of) the chassis-less circuit board substrate 702. As such, solid state drives 1354 are accessible while the storage sled 1300 is mounted in a corresponding rack 340. For example, a solid state drive 1354 may be swapped out of a rack 340 (e.g., via a robot) while the storage sled 1300 remains mounted in the corresponding rack 340.

The storage cage 1352 illustratively includes sixteen mounting slots 1356 and is capable of mounting and storing sixteen solid state drives 1354. The storage cage 1352 may be configured to store additional or fewer solid state drives 1354 in other examples. Additionally, in the illustrative example, the solid state drives are mounted vertically in the storage cage 1352, but may be mounted in the storage cage 1352 in a different orientation in other examples. A given solid state drive 1354 may be implemented as any type of data storage device capable of storing long term data. To do so, the solid state drives 1354 may include volatile and non-volatile memory devices discussed above.

As shown in FIG. 14, the storage controllers 1320, the communication circuit 930, and the optical data connector 934 are illustratively mounted to the top side 750 of the chassis-less circuit board substrate 702. Again, as discussed above, any suitable attachment or mounting technology may be used to mount the electrical components of the storage sled 1300 to the chassis-less circuit board substrate 702 including, for example, sockets (e.g., a processor socket), holders, brackets, soldered connections, and/or other mounting or securing techniques.

As discussed above, the individual storage controllers 1320 and the communication circuit 930 are mounted to the top side 750 of the chassis-less circuit board substrate 702 such that no two heat-producing, electrical components shadow each other. For example, the storage controllers 1320 and the communication circuit 930 are mounted in corresponding locations on the top side 750 of the chassis-less circuit board substrate 702 such that no two of those electrical components are linearly in-line with each other along the direction of the airflow path 708.

The memory devices 820 (not shown in FIG. 14) of the storage sled 1300 are mounted to the bottom side 850 (not shown in FIG. 14) of the chassis-less circuit board substrate 702 as discussed above in regard to the sled 500. Although mounted to the bottom side 850, the memory devices 820 are communicatively coupled to the storage controllers 1320 located on the top side 750 via the I/O subsystem 722. Again, because the chassis-less circuit board substrate 702 is implemented as a double-sided circuit board, the memory devices 820 and the storage controllers 1320 may be communicatively coupled by one or more vias, connectors, or other mechanisms extending through the chassis-less circuit board substrate 702. The storage controllers 1320 include and/or are associated with a heatsink 1370 secured thereto. As discussed above, due to the improved thermal cooling characteristics of the chassis-less circuit board substrate 702 of the storage sled 1300, none of the heatsinks 1370 include cooling fans attached thereto. That is, the heatsinks 1370 may be fan-less heatsinks.

Figure 15:
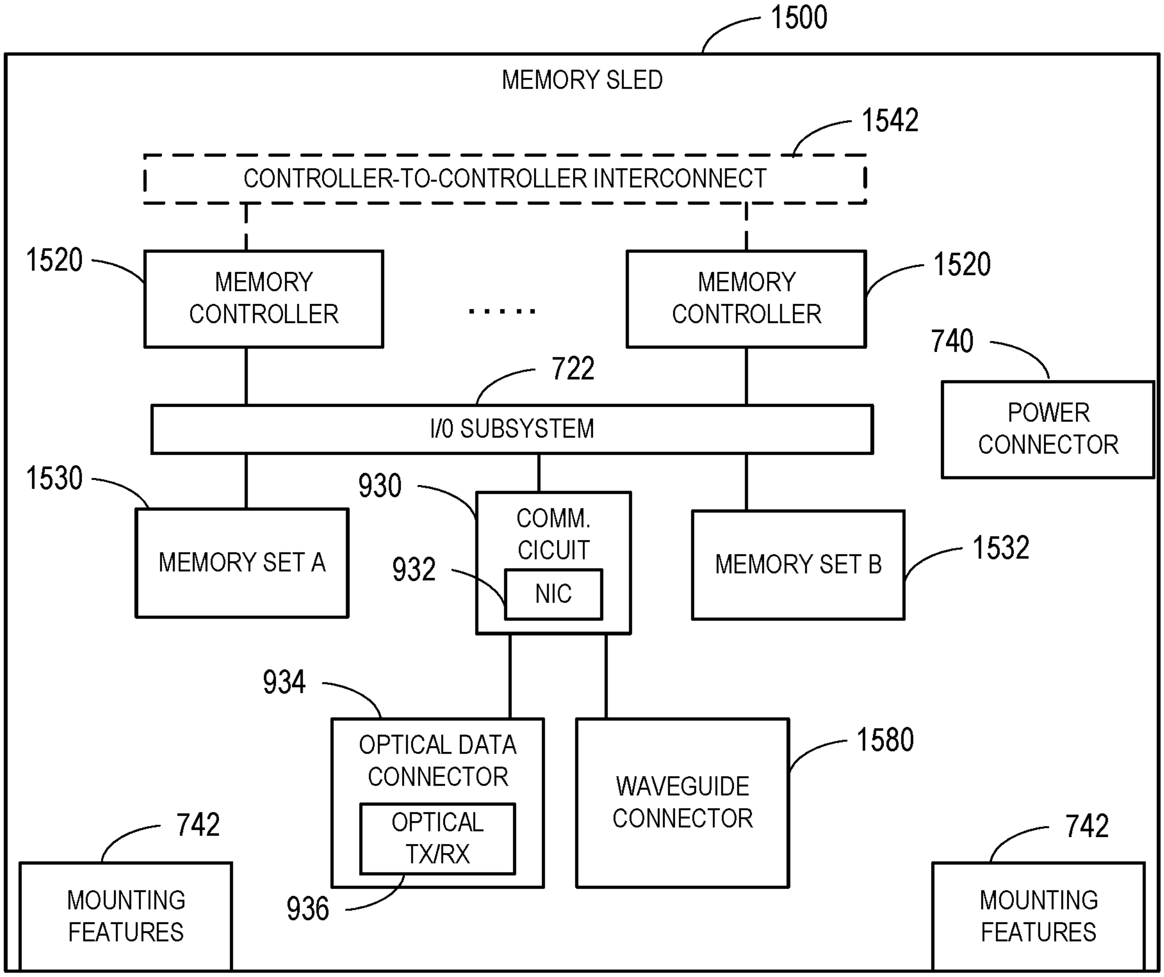
FIG. 15 is a block diagram of at least one example of a memory sled usable in the data center of FIG. 2.

Referring now to FIG. 15, in some examples, the sled 500 may be implemented as a memory sled 1500. The storage sled 1500 is optimized, or otherwise configured, to provide other sleds 500 (e.g., compute sleds 900, accelerator sleds 1100, etc.) with access to a pool of memory (e.g., in two or more sets 1530, 1532 of memory devices 820) local to the memory sled 1500. For example, during operation, a compute sled 900 or an accelerator sled 1100 may remotely write to and/or read from one or more of the memory sets 1530, 1532 of the memory sled 1500 using a logical address space that maps to physical addresses in the memory sets 1530, 1532. The memory sled 1500 includes various components similar to components of the sled 500 and/or the compute sled 900, which have been identified in FIG. 15 using the same reference numbers. The description of such components provided above in regard to FIGS. 7, 8, and 9 apply to the corresponding components of the memory sled 1500 and is not repeated herein for clarity of the description of the memory sled 1500.

In the illustrative memory sled 1500, the physical resources 720 include memory controllers 1520. Although only two memory controllers 1520 are shown in FIG. 15, it should be appreciated that the memory sled 1500 may include additional memory controllers 1520 in other examples. The memory controllers 1520 may be implemented as any type of processor, controller, or control circuit capable of controlling the writing and reading of data into the memory sets 1530, 1532 based on requests received via the communication circuit 930. In the illustrative example, the memory controllers 1520 are connected to corresponding memory sets 1530, 1532 to write to and read from memory devices 820 (not shown) within the corresponding memory set 1530, 1532 and enforce any permissions (e.g., read, write, etc.) associated with sled 500 that has sent a request to the memory sled 1500 to perform a memory access operation (e.g., read or write).

In some examples, the memory sled 1500 may also include a controller-to-controller interconnect 1542. Similar to the resource-to-resource interconnect 724 of the sled 500 discussed above, the controller-to-controller interconnect 1542 may be implemented as any type of communication interconnect capable of facilitating controller-to-controller communications. In the illustrative example, the controller-to-controller interconnect 1542 is implemented as a high-speed point-to-point interconnect (e.g., faster than the I/O subsystem 722). For example, the controller-to-controller interconnect 1542 may be implemented as a QuickPath Interconnect (QPI), an UltraPath Interconnect (UPI), or other high-speed point-to-point interconnect dedicated to processor-to-processor communications. As such, in some examples, a memory controller 1520 may access, through the controller-to-controller interconnect 1542, memory that is within the memory set 1532 associated with another memory controller 1520. In some examples, a scalable memory controller is made of multiple smaller memory controllers, referred to herein as "chiplets", on a memory sled (e.g., the memory sled 1500). The chiplets may be interconnected (e.g., using EMIB (Embedded Multi-Die Interconnect Bridge) technology). The combined chiplet memory controller may scale up to a relatively large number of memory controllers and I/O ports, (e.g., up to 16 memory channels). In some examples, the memory controllers 1520 may implement a memory interleave (e.g., one memory address is mapped to the memory set 1530, the next memory address is mapped to the memory set 1532, and the third address is mapped to the memory set 1530, etc.). The interleaving may be managed within the memory controllers 1520, or from CPU sockets (e.g., of the compute sled 900) across network links to the memory sets 1530, 1532, and may improve the latency associated with performing memory access operations as compared to accessing contiguous memory addresses from the same memory device.

Further, in some examples, the memory sled 1500 may be connected to one or more other sleds 500 (e.g., in the same rack 340 or an adjacent rack 340) through a waveguide, using the waveguide connector 1580. In the illustrative example, the waveguides are 74 millimeter waveguides that provide 16 Rx (i.e., receive) lanes and 16 Tx (i.e., transmit) lanes. Different ones of the lanes, in the illustrative example, are either 16 GHz or 32 GHz. In other examples, the frequencies may be different. Using a waveguide may provide high throughput access to the memory pool (e.g., the memory sets 1530, 1532) to another sled (e.g., a sled 500 in the same rack 340 or an adjacent rack 340 as the memory sled 1500) without adding to the load on the optical data connector 934.

Figure 16:
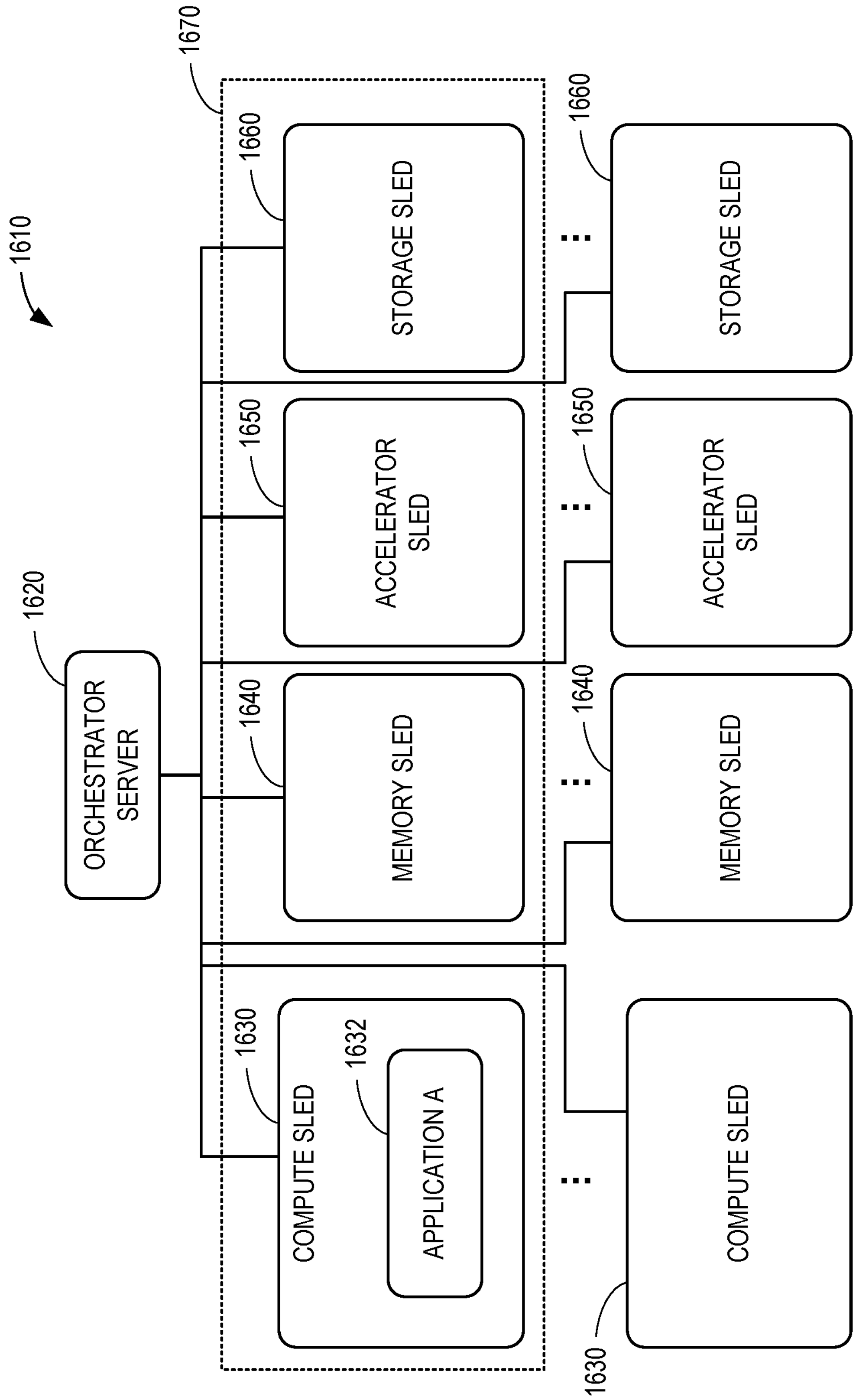
FIG. 16 is a block diagram of a system that may be established within the data center of FIG. 2 to execute workloads with managed nodes of disaggregated resources.

Referring now to FIG. 16, a system for executing one or more workloads (e.g., applications) may be implemented in accordance with the data center 200. In the illustrative example, the system 1610 includes an orchestrator server 1620, which may be implemented as a managed node including a compute device (e.g., processor circuitry 920 on a compute sled 900) executing management software (e.g., a cloud operating environment, such as OpenStack) that is communicatively coupled to multiple sleds 500 including a large number of compute sleds 1630 (e.g., similar to the compute sled 900), memory sleds 1640 (e.g., similar to the memory sled 1500), accelerator sleds 1650 (e.g., similar to the accelerator sled 1100), and storage sleds 1660 (e.g., similar to the storage sled 1300). One or more of the sleds 1630, 1640, 1650, 1660 may be grouped into a managed node 1670, such as by the orchestrator server 1620, to collectively perform a workload (e.g., an application 1632 executed in a virtual machine or in a container). The managed node 1670 may be implemented as an assembly of physical resources 720, such as processor circuitry 920, memory resources 820, accelerator circuits 1120, or data storage 1350, from the same or different sleds 500. Further, the managed node may be established, defined, or "spun up" by the orchestrator server 1620 at the time a workload is to be assigned to the managed node or at any other time, and may exist regardless of whether any workloads are presently assigned to the managed node. In the illustrative example, the orchestrator server 1620 may selectively allocate and/or deallocate physical resources 720 from the sleds 500 and/or add or remove one or more sleds 500 from the managed node 1670 as a function of quality of service (QoS) targets (e.g., a target throughput, a target latency, a target number of instructions per second, etc.) associated with a service level agreement for the workload (e.g., the application 1632). In doing so, the orchestrator server 1620 may receive telemetry data indicative of performance conditions (e.g., throughput, latency, instructions per second, etc.) in different ones of the sleds 500 of the managed node 1670 and compare the telemetry data to the quality of service targets to determine whether the quality of service targets are being satisfied. The orchestrator server 1620 may additionally determine whether one or more physical resources may be deallocated from the managed node 1670 while still satisfying the QoS targets, thereby freeing up those physical resources for use in another managed node (e.g., to execute a different workload). Alternatively, if the QoS targets are not presently satisfied, the orchestrator server 1620 may determine to dynamically allocate additional physical resources to assist in the execution of the workload (e.g., the application 1632) while the workload is executing. Similarly, the orchestrator server 1620 may determine to dynamically deallocate physical resources from a managed node if the orchestrator server 1620 determines that deallocating the physical resource would result in QoS targets still being met.

Additionally, in some examples, the orchestrator server 1620 may identify trends in the resource utilization of the workload (e.g., the application 1632), such as by identifying phases of execution (e.g., time periods in which different operations, having different resource utilizations characteristics, are performed) of the workload (e.g., the application 1632) and pre-emptively identifying available resources in the data center 200 and allocating them to the managed node 1670 (e.g., within a predefined time period of the associated phase beginning). In some examples, the orchestrator server 1620 may model performance based on various latencies and a distribution scheme to place workloads among compute sleds and other resources (e.g., accelerator sleds, memory sleds, storage sleds) in the data center 200. For example, the orchestrator server 1620 may utilize a model that accounts for the performance of resources on the sleds 500 (e.g., FPGA performance, memory access latency, etc.) and the performance (e.g., congestion, latency, bandwidth) of the path through the network to the resource (e.g., FPGA). As such, the orchestrator server 1620 may determine which resource(s) should be used with which workloads based on the total latency associated with different potential resource(s) available in the data center 200 (e.g., the latency associated with the performance of the resource itself in addition to the latency associated with the path through the network between the compute sled executing the workload and the sled 500 on which the resource is located).

In some examples, the orchestrator server 1620 may generate a map of heat generation in the data center 200 using telemetry data (e.g., temperatures, fan speeds, etc.) reported from the sleds 500 and allocate resources to managed nodes as a function of the map of heat generation and predicted heat generation associated with different workloads, to maintain a target temperature and heat distribution in the data center 200. Additionally or alternatively, in some examples, the orchestrator server 1620 may organize received telemetry data into a hierarchical model that is indicative of a relationship between the managed nodes (e.g., a spatial relationship such as the physical locations of the resources of the managed nodes within the data center 200 and/or a functional relationship, such as groupings of the managed nodes by the customers the managed nodes provide services for, the types of functions typically performed by the managed nodes, managed nodes that typically share or exchange workloads among each other, etc.). Based on differences in the physical locations and resources in the managed nodes, a given workload may exhibit different resource utilizations (e.g., cause a different internal temperature, use a different percentage of processor or memory capacity) across the resources of different managed nodes. The orchestrator server 1620 may determine the differences based on the telemetry data stored in the hierarchical model and factor the differences into a prediction of future resource utilization of a workload if the workload is reassigned from one managed node to another managed node, to accurately balance resource utilization in the data center 200. In some examples, the orchestrator server 1620 may identify patterns in resource utilization phases of the workloads and use the patterns to predict future resource utilization of the workloads.

To reduce the computational load on the orchestrator server 1620 and the data transfer load on the network, in some examples, the orchestrator server 1620 may send self-test information to the sleds 500 to enable a given sled 500 to locally (e.g., on the sled 500) determine whether telemetry data generated by the sled 500 satisfies one or more conditions (e.g., an available capacity that satisfies a predefined threshold, a temperature that satisfies a predefined threshold, etc.). The given sled 500 may then report back a simplified result (e.g., yes or no) to the orchestrator server 1620, which the orchestrator server 1620 may utilize in determining the allocation of resources to managed nodes.

Figure 17:
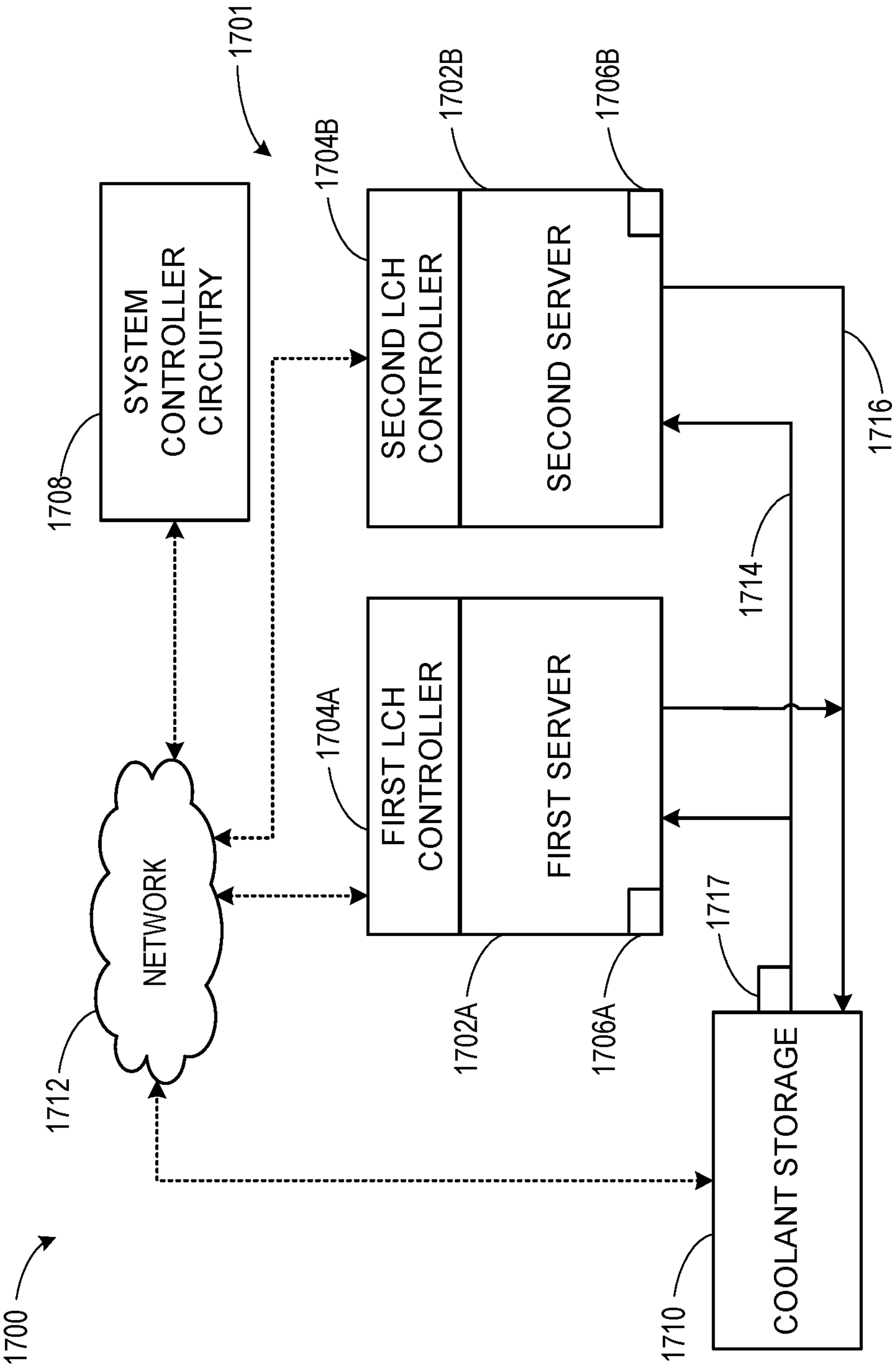
FIG. 17 is a block diagram of a system for managing the coolant supply of a plurality of nodes implemented in accordance with the teachings of this disclosure.

FIG. 17 is a block diagram of an example system 1700 for managing the coolant supply of an example distributed computing system 1701. In the illustrated example of FIG. 17, the distributed computing system 1701 includes an example first server 1702A and an example second server 1702B. The servers 1702A, 1702B include an example first liquid coolant hotplug (LCH) controller 1704A and an example second LCH controller 1704B, respectively, and example first sensors 1706A and example second sensors 1706B, respectively. In the illustrated example of FIG. 17, the system 1700 further includes system controller circuitry 1708 and example coolant storage 1710, which communicate via an example network 1712. In the illustrated example of FIG. 17, coolant flows between the coolant storage 1710 and the servers 1702A, 1702B via an example first pipe 1714 and an example second pipe 1716.

As used herein, the term "immersion fluid" is used to refer to the coolant that is used to cool the components of the servers 1702A, 1702B and term "work fluid" is used to refer the coolant used to cool the immersion fluid (e.g., in a refrigerator the immersion fluid is air and the work fluid is a refrigerant, etc.). The system 1700 of FIG. 17 is described as a system for distributing immersion fluid between the servers 1702A, 1702B. In other examples, the system 1700 can distribute work fluid between the servers 1702A, 1702B. In some such examples, the servers 1702A, 1702B can include heat exchanges that use the work fluid to cool immersion fluid stored therein. In other examples, the term coolant can refer to coolant used in a non-immersion system (e.g., an enclosed flow cold plate based system, etc.). In other examples, the coolant can refer to a fluid used to warm the servers 1702A, 1702B (e.g., the servers are disposed in an extremely cold environment, etc.).

The servers 1702A, 1702B each include a discrete volume of coolant that is used to cool the servers 1702A, 1702B. In the illustrated example of FIG. 17, the distributed computing system 1701 includes two example servers 1702A, 1702B. In other examples, the distributed computing system 1701 can include any other suitable number of servers (e.g., one, three, four, fifty, etc.). For example, the system 1700 can be a comparable large system (e.g., a large data center including several hundred servers, etc.) and/or a comparable small system (e.g., a single server, etc.). The example servers of the distributed computing system 1701 (e.g., the servers 1702A, 1702B, etc.) can include and/or be implemented by any of the example devices described above in connection with FIGS. 2-16, including the managed node 1670 of FIG. 16.

The LCH controllers 1704A, 1704B control and/or regulate the flow of coolant into and out of the servers 1702A, 1702B. For example, the LCH controller 1704A, 1704B can control the position (e.g., open, closed, partially opened, etc.) of one or more valves and/or pumps associated with the servers 1702A, 1702B, respectively, that control the flow of coolant through the pipes 1714, 1716. In some examples, the LCH controllers 1704A, 1704B can be fully and/or partially implemented by one or more compute units associated with the servers 1702A, 1702B. Additionally or alternatively, the LCH controllers 1704A, 1704B can be implemented as one or more separate compute unit(s) disposed adjacent to the servers 1702A, 1702B and/or externally to the servers 1702A, 1702B (e.g., at a control center of a data center associated with the system 1700, by the same device as the system controller circuitry 1708, on the cloud, etc.). In some such examples, some or all of one or both of the LCH controllers 1704A, 1704B can be implemented via a remote system. In some such examples, the servers 1702A, 1702B can log information relating to the operation of the servers 1702A, 1702B (e.g., information from the sensors 1706A, 1706B, etc.) and periodically transfer it to the LCH controllers 1704A, 1704B and/or the system controller 1708. An example configuration of the first LCH controller 1704A and the first server 1702A is described below in conjunction with FIG. 18. An example implementation of the first LCH controller 1704A is described below in conjunction with FIG. 19.

The sensors 1706A, 1706B include sensors that measure and output signals relating to the coolant in the first server 1702A, and the second server 1702B, respectively. For example, the sensors 1706A, 1706B can include one or more temperature sensors that measure and output signals corresponding to the temperature of the coolant of the servers 1702A, 1702B and/or the coolant stored therein. In some such examples, the sensors 1706A, 1706B can include one or more thermocouple(s), one or more resistance temperature detector(s), one or more thermistor(s), one or more infrared optical sensor(s), one or more semiconductor-based sensors. In some examples, the sensors 1706A, 1706B can include one or more fill-level sensors and/or fluid volume sensors that measure and output signals corresponding to the amount of coolant stored in the servers 1702A, 1702B. In some such examples, the sensors 1706A, 1706B can include one or more capacitive fill-level sensors, one or more mechanical fill-level sensors (e.g., float sensors, etc.), one or more optical sensor(s), etc. Additionally or alternatively, the sensors 1706A, 1706B can include any other suitable sensors that output signals reflective of a cooling capability of the coolant in the servers 1702A, 1702B (e.g., sensors that measure particulate levels in the coolant, sensors that measure contamination of the coolant, the specific heat of the coolant, etc.). In some examples, the sensors 1706A, 1706B are disposed (e.g., partially disposed, fully disposed, etc.) in an integrated circuit package associated with the servers 1702A, 1702B, respectively. Additionally or alternatively, the sensors 1706A, 1706B are disposed (e.g., partially disposed, fully disposed, etc.) in the flow path of the coolant in the servers 1702A, 1702B.

The system controller circuitry 1708 regulates the flow of coolant through the system 1700. For example, the system controller circuitry 1708 can receive data (e.g., telemetry data, etc.) from the sensors 1706A, 1706B to determine if the coolant in the servers 1702A, 1702B needs to be replaced and/or replenished. In some such examples, if the system controller circuitry 1708 determines the coolant in the first server 1702A is not able to keep the first server 1702A at a target temperature (e.g., the coolant is too hot to dissipate an expected heat output of the first server 1702A, there is not enough coolant in the first server 1702A, the heat absorbing properties of the coolant has degraded over time, etc.), the system controller circuitry 1708 can transmit instructions to the first LCH controller 1704A to drain coolant from the first server 1702A. In some examples, the system controller circuitry 1708 can send instructions to the LCH controllers 1704A, 1704B to cause them to open one or more valves to receive new coolant from the coolant storage 1710. In some such examples, the system controller circuitry 1708 can cause the pump 1717 to pump coolant from the coolant storage 1710 to one or more of the servers 1702A, 1702B. In some examples, while coolant is being replaced in the first server 1702A, the system controller circuitry 1708 can cause the workload of the first server 1702A to be transferred to another server (e.g., the second server 1702B, etc.) to reduce the heat output of the first server 1702A. In some examples, the system controller circuitry 1708 can be implemented by the orchestration server 1620 of FIG. 16 and/or another device managing the distributed computing system 1701. An example implementation of the system controller circuitry 1708 is described below in conjunction with FIG. 20.

The coolant storage 1710 stores liquid coolant to cool the server racks. In some examples, the coolant storage 1710 can be disposed (e.g., located, arranged, etc.) underground (e.g., partially underground, fully underground, etc.). For example, the coolant storage 1710 can be buried in a material (e.g., soil, rock, clay, etc.) of the ground. Additionally or alternatively, the coolant storage 1710 can be encased in a rigid cavity that is disposed underground (e.g., a subterranean vault, etc.). The temperature of the material underground is typically lower and more stable than the air of the ambient atmosphere. Accordingly, coolant stored in the coolant storage 1710 can be cooled via passive conduction into the surrounding medium (e.g., soil, rock, clay, concrete, etc.). As used herein, this cooling method is referred to as "dry cooling" and the coolant storage 1710 is referred to as a "drying pod." Additionally or alternatively, one or more pipes coupled to the coolant storage 1710 and extending into the ground can form a fluid circuit (not illustrated) that further increase the rate of conduction of the coolant of the coolant storage 1710. In other examples, the coolant storage 1710 can be disposed above ground.

In some examples, the coolant storage 1710 can include one or more cooling mechanisms to dissipate heat from the coolant stored therein. For example, the coolant storage 1710 can include one or more heat exchangers, one or more radiators, etc. The coolant stored in the coolant storage 1710 and used to cool the servers 1702A, 1702B can be an insulative dielectric fluid suitable for direct contact with compute components (e.g., mineral oil, hexane, castor oil, deionized water, silicone oil, fluorinated ketones, per-fluorinated compounds, benzene, liquid noble gases, etc.). In other examples, the coolant stored in the coolant storage 1710 and used to cool the servers 1702A, 1702B can be any other suitable fluid (e.g., ammonia, methanol, ethanol, water, mercury, hydrofluorocarbon refrigerants, acetone, esters, etc.). In some examples, the coolant storage 1710 can store multiple coolants. For example, the coolant storage 1710 can include multiple tanks that each store a particular fluid. In other examples, the coolant storage 1710 can distribute these different coolants to the first server 1702A and the second server 1702B (e.g., based on the cooling needs of the servers 1702A, 1702B, etc.). In some examples, the coolant storage 1710 can include an inlet (not illustrated) that enables coolant to be added to the coolant storage 1710 (e.g., by a technician, etc.). While the coolant storage 1710 of FIG. 17 is depicted as being a single tank at a single storage location, in other examples, the coolant storage 1710 can be disposed at multiple locations and/or be implemented by an array of tanks.

The network 1712 enables communications to be transmitted between components of the system 1700 (e.g., the LCH controllers 1704A, 1704B, the system controller circuitry 1708, the pump 1717, etc.). In some examples, the network 1712 can be implemented as a cellular network, the internet, a cellular network, or any other suitable wide area network (WAN). In other examples, the network 1712 can be a wired connection. In some examples, the network 1712 can be implemented via multiple networks (e.g., a local area network coupled to a wide area network, etc.).

In the illustrated example of FIG. 17, the first pipe 1714 (e.g., an inlet pipe, inflow pipe, etc.) enables coolant to flow from the coolant storage 1710 into the first server 1702A and the second server 1702B. In the illustrated example of FIG. 17, the first pipe 1714 is coupled to an example pump 1717 that forces coolant to flow out of the coolant storage 1710 to the servers 1702A, 1702B. In other examples, the pump 1717 can be absent. In some such examples, the coolant can flow from the coolant storage 1710 to the servers 1702A, 1702B via natural forces (e.g., natural convection, gravity, etc.). The second pipe 1716 (e.g., an outlet pipe, outflow pipe, etc.) enables coolant to flow from the servers 1702A, 1702B to the coolant storage 1710. In some examples, the second pipe 1716 can include a pump (not illustrated). For example, a pump could be required to drive coolant from the second pipe 1716 if the coolant storage 1710 is disposed above the server 1702A, 1702B. In other examples, the pipes 1714, 1716 can be absent. In some such examples, the coolant in the servers 1702A, 1702B can be drained manually by a technician and the coolant can be manually withdrawn from and added to the coolant storage 1710.

Figure 18:
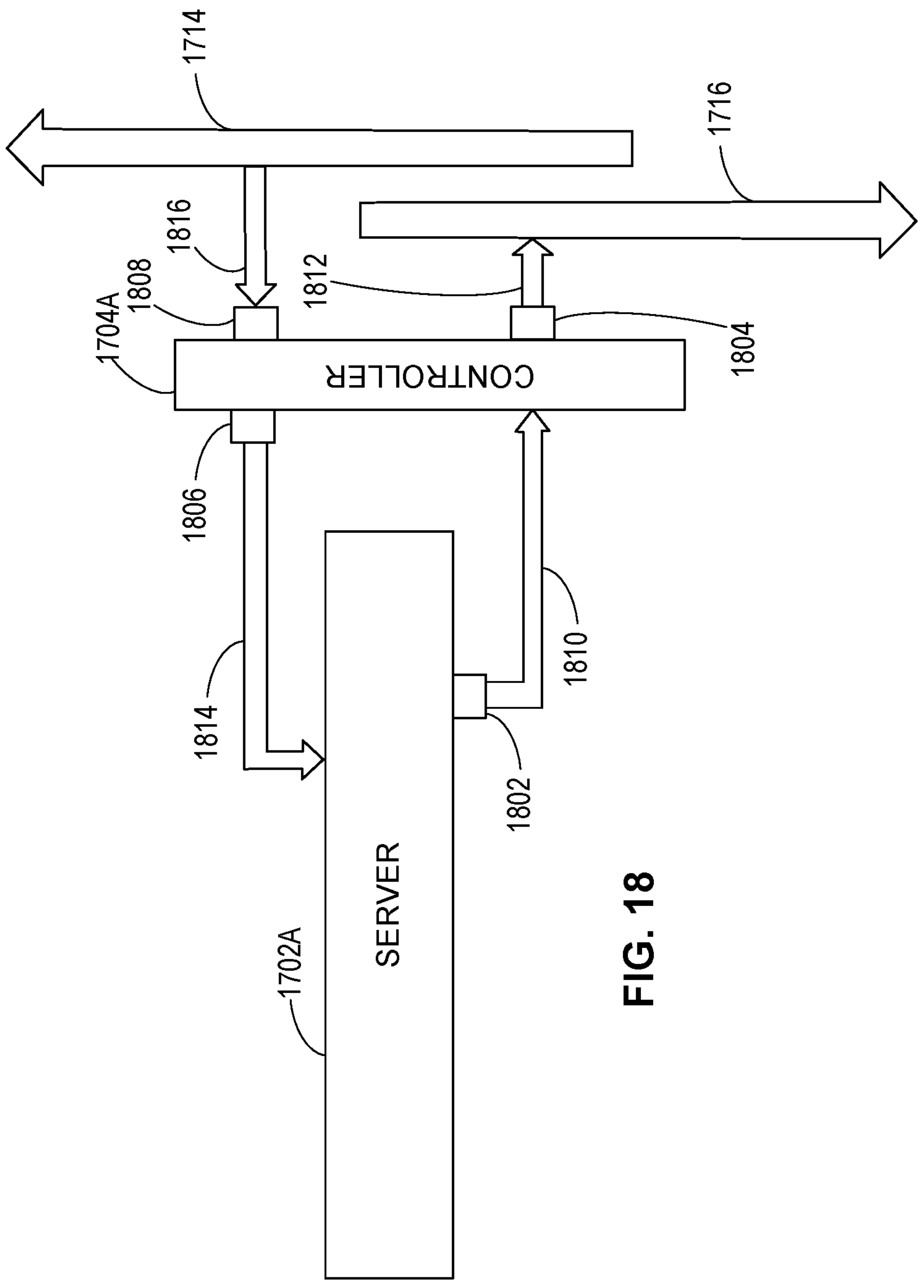
FIG. 18 is a block diagram of the first server and the LCH controller of FIG. 17.

FIG. 18 is a block diagram of the first server 1702A and the LCH controller 1704A of FIG. 17. In the illustrated example of FIG. 18, the LCH controller 1704A controls the position of an example first valve 1802, an example second valve 1804, an example third valve 1806, and an example fourth valve 1808. In the illustrated example of FIG. 18, an example first pipe 1810 couples the first server 1702A and the first LCH controller 1704A, an example second pipe 1812 couples the first LCH controller 1704A to the second pipe 1716 of FIG. 17, an example third pipe 1814 couples the first LCH controller 1704A and the first server 1702A, and an example fourth pipe 1816 couples the first LCH controller 1704A to the first pipe 1714 of FIG. 17. While the first LCH controller 1704A is disposed between the server 1702A and the pipes 1714, 1716, in other examples, the first LCH controller 1704A can be disposed at any other suitable position. For example, the first LCH controller 1704A can be implemented at a location remote to the first server 1702A and/or via a compute unit of the first server 1702A.

In some examples, the LCH controller 1704A can include one or more reservoir(s) to contain coolant received from the first pipe 1714 and/or drained from the first server 1702A. The valves 1802, 1804, 1806, 1808 are controllable mechanical structures that control the flow of coolant through the pipes 1810, 1812, 1814, 1816, respectively. The valves 1802, 1804, 1806, 1808 can be implemented by any suitable type of valve. During operation, the LCH controller 1704A can cause, by sending a signal (e.g., an electric signal, a pneumatic signal, a hydraulic signal, etc.) to a controllable feature (e.g., an actuator, etc.) associated with the first valve 1802, cause coolant to drain from the first server 1702A via the first pipe 1810. Similarly, the LCH controller 1704A can cause, by sending a signal to a controllable feature of the second valve 1804, coolant to leave the LCH controller 1704A into the second pipe 1716 via the second pipe 1812. The first LCH controller 1704A can cause, by sending a signal to a controllable feature of the third valve 1806, coolant to flow from the first LCH controller 1704A to the first server 1702A via the third pipe 1814. The first LCH controller 1704A can cause, by sending a signal to a controllable feature of the fourth valve 1808, coolant to flow from the first pipe 1714 into the first LCH controller 1704A via the fourth pipe 1816.

Figure 19:
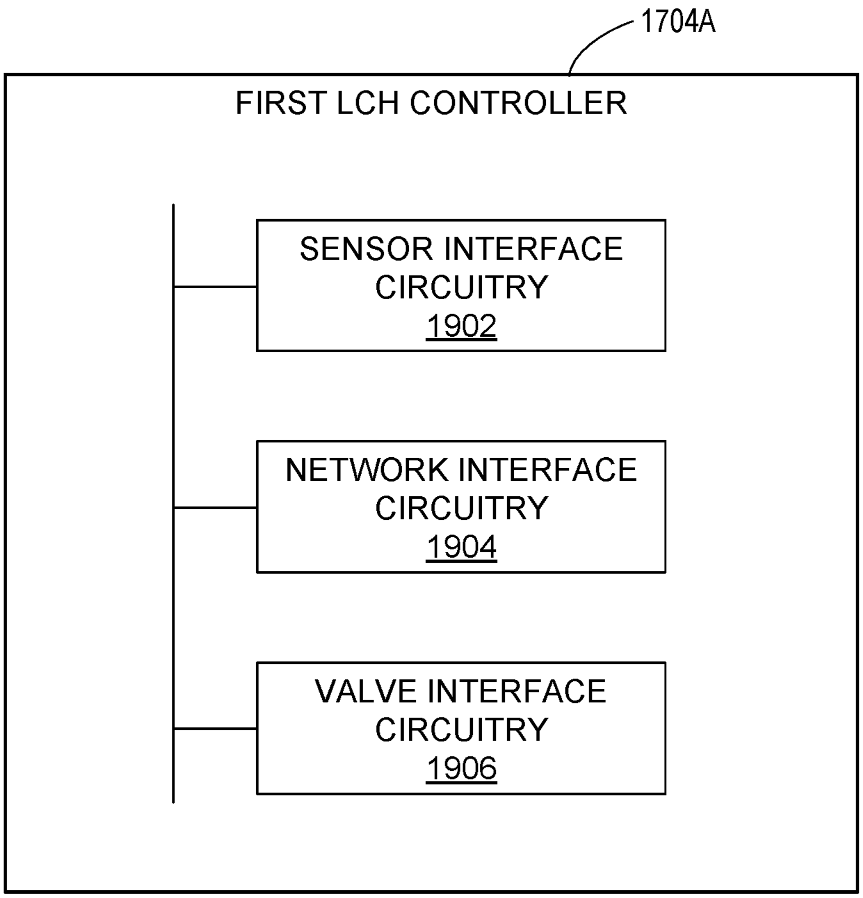
FIG. 19 is a block diagram of the example LCH controller circuitry of FIGS. 17 and 18.

FIG. 19 is a block diagram of the first LCH controller 1704A to interface with and manage the coolant of the first server 1702A. While FIG. 19 is described as an implementation of the first LCH controller 1704A, the second LCH controller 1704B may be implemented in a similar manner (e.g., including the same components, etc.). In other examples, the second LCH controller 1704B can be implemented in any other suitable manner. In the illustrated example of FIG. 19, the first LCH controller 1704A includes example sensor interface circuitry 1902, example network interface circuitry 1904, and example valve interface circuitry 1906.

The first LCH controller 1704A of FIG. 17 may be instantiated (e.g., creating an instance of, bring into being for any length of time, materialize, implement, etc.) by processor circuitry such as a central processing unit executing instructions. Additionally or alternatively, the first LCH controller 1704A of FIG. 17 may be instantiated (e.g., creating an instance of, bring into being for any length of time, materialize, implement, etc.) by an ASIC or an FPGA structured to perform operations corresponding to the instructions. It should be understood that some or all of the circuitry of FIG. 17 may, thus, be instantiated at the same or different times. Some or all of the circuitry may be instantiated, for example, in one or more threads executing concurrently on hardware and/or in series on hardware. Moreover, in some examples, some or all of the circuitry of FIG. 17 may be implemented by microprocessor circuitry executing instructions to implement one or more virtual machines and/or containers.

The sensor interface circuitry 1902 accesses sensor data from the first sensors 1706A of the first server 1702A. For example, the sensor interface circuitry 1902 can receive sensor data from the sensors 1706A of the first server 1702A. In some examples, the sensor interface circuitry 1902 can transform the sensor data from a machine-readable format (e.g., a voltage, a current, etc.) into a human-readable format (e.g., a number, a string, etc.). In some examples, the sensor interface circuitry 1902 can format the received sensor data (e.g., multiple sensors measuring different quantities, etc.) into a data structure (e.g., a vector, a matrix, an array, etc.). In some examples, the sensor interface circuitry 1902 is instantiated by processor circuitry executing sensor interface instructions and/or configured to perform operations such as those represented by the flowchart of FIG. 21.

The network interface circuitry 1904 communicates with other devices over the network 1712. For example, the network interface circuitry 1904 can send the sensor data received by the sensor interface circuitry 1902 by the sensors 1706A to the system controller circuitry 1708 via the network 1712. The network interface circuitry 1904 can receive requests (e.g., commands, instructions, alerts, etc.) to open, close, and/or throttle one or more of the valves 1802, 1804, 1806, 1808 of FIG. 18. In some examples, the network interface circuitry 1904 can be absent. In some such examples, the first LCH controller 1704A can communicate with the system controller circuitry 1708 via a direct wired connection. In some examples, the network interface circuitry 1904 is instantiated by processor circuitry executing network interface instructions and/or configured to perform operations such as those represented by the flowchart of FIG. 21.

The valve interface circuitry 1906 controls the position of the valves 1802, 1804, 1806, 1808 of FIG. 18. For example, the valve interface circuitry 1906 can send a signal (e.g., a hydraulic signal, a pneumatic signal, an electronic signal, etc.) to one or more controllable feature(s) (e.g., an actuator, etc.) of the valves 1802, 1804, 1806, 1808. In other examples, the valve interface circuitry 1906 can control the position of the valves 1802, 1804, 1806, 1808 via a direct mechanical connection (e.g., a control arm, etc.). In some examples, the valve interface circuitry 1906 is instantiated by processor circuitry executing valve interface instructions and/or configured to perform operations such as those represented by the flowchart of FIG. 21.

In some examples, the first LCH controller 1704A includes means for interfacing with sensors (e.g., means for sensor interfacing, etc.). For example, the means for sensor interfacing may be implemented by the sensor interface circuitry 1902. In some examples, the sensor interface circuitry 1902 may be instantiated by processor circuitry such as the example processor circuitry 2312 of FIG. 23. For instance, the sensor interface circuitry 1902 may be instantiated by the example microprocessor 2500 of FIG. 25 executing machine executable instructions such as those implemented by at least block 2102 of FIG. 21. In some examples, the sensor interface circuitry 1902 may be instantiated by hardware logic circuitry, which may be implemented by an ASIC, XPU, or the FPGA circuitry 2600 of FIG. 26 structured to perform operations corresponding to the machine readable instructions. Additionally or alternatively, the sensor interface circuitry 1902 may be instantiated by any other combination of hardware, software, and/or firmware. For example, the sensor interface circuitry 1902 may be implemented by at least one or more hardware circuits (e.g., processor circuitry, discrete and/or integrated analog and/or digital circuitry, an FPGA, an ASIC, an XPU, a comparator, an operational-amplifier (op-amp), a logic circuit, etc.) structured to execute some or all of the machine readable instructions and/or to perform some or all of the operations corresponding to the machine readable instructions without executing software or firmware, but other structures are likewise appropriate.

In some examples, the first LCH controller 1704A includes means for interfacing with a network (e.g., means for network interfacing, etc.). For example, the means for interfacing with a network may be implemented by the network interface circuitry 1904. In some examples, the network interface circuitry 1904 may be instantiated by processor circuitry such as the example processor circuitry 2312 of FIG. 23. For instance, the network interface circuitry 1904 may be instantiated by the example microprocessor 2500 of FIG. 25 executing machine executable instructions such as those implemented by at least blocks 2104, 2106, 2110 of FIG. 21. In some examples, the network interface circuitry 1904 may be instantiated by hardware logic circuitry, which may be implemented by an ASIC, XPU, or the FPGA circuitry 2600 of FIG. 26 structured to perform operations corresponding to the machine readable instructions. Additionally or alternatively, the network interface circuitry 1904 may be instantiated by any other combination of hardware, software, and/or firmware. For example, the network interface circuitry 1904 may be implemented by at least one or more hardware circuits (e.g., processor circuitry, discrete and/or integrated analog and/or digital circuitry, an FPGA, an ASIC, an XPU, a comparator, an operational-amplifier (op-amp), a logic circuit, etc.) structured to execute some or all of the machine readable instructions and/or to perform some or all of the operations corresponding to the machine readable instructions without executing software or firmware, but other structures are likewise appropriate.

In some examples, the first LCH controller 1704A includes means for interfacing with valves (e.g., means for valve interfacing, etc.). For example, the means for interfacing with valves may be implemented by the valve interface circuitry 1906. In some examples, the valve interface circuitry 1906 may be instantiated by processor circuitry such as the example processor circuitry 2312 of FIG. 23. For instance, the valve interface circuitry 1906 may be instantiated by the example microprocessor 2500 of FIG. 25 executing machine executable instructions such as those implemented by at least blocks 2108, 2112, 2114, 2116 of FIG. 21. In some examples, the valve interface circuitry 1906 may be instantiated by hardware logic circuitry, which may be implemented by an ASIC, XPU, or the FPGA circuitry 2600 of FIG. 26 structured to perform operations corresponding to the machine readable instructions. Additionally or alternatively, the valve interface circuitry 1906 may be instantiated by any other combination of hardware, software, and/or firmware. For example, the valve interface circuitry 1906 may be implemented by at least one or more hardware circuits (e.g., processor circuitry, discrete and/or integrated analog and/or digital circuitry, an FPGA, an ASIC, an XPU, a comparator, an operational-amplifier (op-amp), a logic circuit, etc.) structured to execute some or all of the machine readable instructions and/or to perform some or all of the operations corresponding to the machine readable instructions without executing software or firmware, but other structures are likewise appropriate.

While an example manner of implementing the first LCH controller 1704A of FIGS. 17 and 18 is illustrated in FIG. 19, one or more of the elements, processes, and/or devices illustrated in FIG. 19 may be combined, divided, re-arranged, omitted, eliminated, and/or implemented in any other way. Further, the example sensor interface circuitry 1902, the example network interface circuitry 1904, the valve interface circuitry 1906 and/or, more generally, the example first LCH controller 1704A of FIGS. 17 and 18, may be implemented by hardware alone or by hardware in combination with software and/or firmware. Thus, for example, any of the example sensor interface circuitry 1902, the example network interface circuitry 1904, the valve interface circuitry 1906, and/or, more generally, the example first LCH controller 1704A, could be implemented by processor circuitry, analog circuit(s), digital circuit(s), logic circuit(s), programmable processor(s), programmable microcontroller(s), graphics processing unit(s) (GPU(s)), digital signal processor(s) (DSP(s)), application specific integrated circuit(s) (ASIC(s)), programmable logic device (s) (PLD(s)), and/or field programmable logic device(s) (FPLD(s)) such as Field Programmable Gate Arrays (FPGAs). Further still, the example first LCH controller 1704A of FIGS. 17 and 18 may include one or more elements, processes, and/or devices in addition to, or instead of, those illustrated in FIG. 19, and/or may include more than one of any or all of the illustrated elements, processes and devices.

Figure 20:
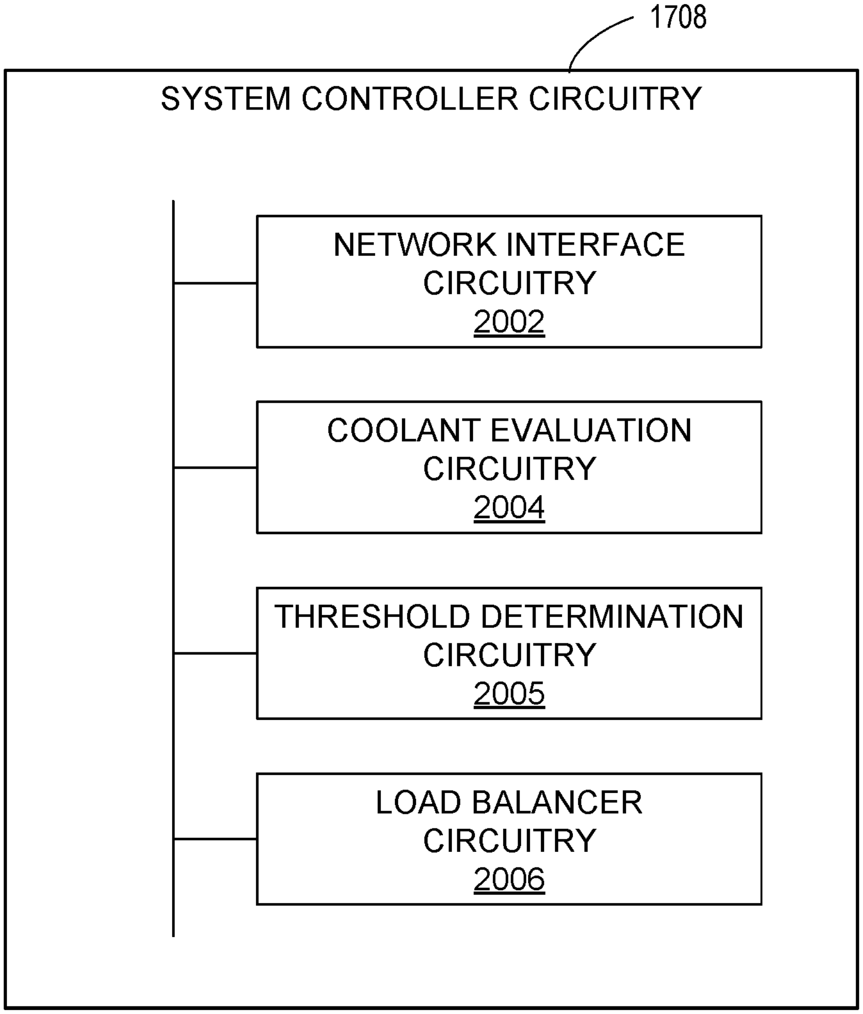
FIG. 20 is a block diagram of the example system controller circuitry of FIG. 17.

FIG. 20 is a block diagram of the system controller circuitry 1708 to manage coolant flow in the system 1700. In the illustrated example of FIG. 20, the system controller circuitry 1708 includes example network interface circuitry 2002, example coolant evaluation circuitry 2004, example threshold determination circuitry 2005, and example load balancer circuitry 2006. The system controller circuitry 1708 of FIG. 20 may be instantiated (e.g., creating an instance of, bring into being for any length of time, materialize, implement, etc.) by processor circuitry such as a central processing unit executing instructions. Additionally or alternatively, the system controller circuitry 1708 of FIG. 20 may be instantiated (e.g., creating an instance of, bring into being for any length of time, materialize, implement, etc.) by an ASIC or an FPGA structured to perform operations corresponding to the instructions. It should be understood that some or all of the circuitry of FIG. 20 may, thus, be instantiated at the same or different times. Some or all of the circuitry may be instantiated, for example, in one or more threads executing concurrently on hardware and/or in series on hardware. Moreover, in some examples, some or all of the circuitry of FIG. 20 may be implemented by microprocessor circuitry executing instructions to implement one or more virtual machines and/or containers.

The network interface circuitry 2002 communicates with other devices over the network 1712. For example, the network interface circuitry 2002 can request and/or receive the sensor data from the sensors 1706A and/or the first LCH controller 1712A via the network 1712. The network interface circuitry 2002 can send requests (e.g., commands, instructions, alerts, etc.) to the first LCH controller 1704A to open, close, and/or throttle one or more of the valves 1802, 1804, 1806, 1808 of FIG. 18. In some examples, the network interface circuitry 1904 can be absent. In some examples, the network interface circuitry 2002 can send a signal to pump 1717 of FIG. 17 to pump coolant from the coolant storage 1710 into one or more of the servers 1702A, 1702B of FIG. 17. Additionally or alternatively, the system controller circuitry 1708 can communicate with the other components of the system 1700 via a direct wired connection. In some examples, the network interface circuitry 2002 is instantiated by processor circuitry executing network interfacing instructions and/or configured to perform operations such as those represented by the flowchart of FIG. 22.

The coolant evaluation circuitry 2004 determines the coolant parameter of the coolant of the first server 1702A based on the sensor data. As used herein, the term "coolant parameter" refers to the amount of heat the coolant in a server (e.g., the first server 1702A, the second server 1702B, etc.) can absorb. In some examples, the coolant parameter is reflective of how effective a volume of coolant is. A higher coolant parameter is indicative that a volume of coolant is more effective than another volume of coolant with a lower coolant parameter. In some examples, the coolant parameter of a server can be expressed as an energy quantity (e.g., joules, calories, kilowatt-hours, British thermal units (BTU), etc.), a power value (e.g., watts, horsepower, BTU per hour, etc.), and/or any other suitable unit. The coolant evaluation circuitry 2004 can use the sensor data (e.g., the temperature of the coolant, the volume of the coolant, the contamination of the coolant, a material properties of the coolant, etc.) to determine the amount of heat the coolant of the first server 1702A is able to absorb. In some examples, the coolant evaluation circuitry 2004 can determine the efficacy of the coolant based on the known properties (e.g., the specific heat, etc.) of the coolant in a current condition (e.g., at a current temperature, at a current volume, at a current pressure, a current degradation, etc.). In other examples, the coolant evaluation circuitry 2004 can determine the coolant parameter in any other suitable manner (e.g., via historic data, via a machine-learning algorithm, etc.). In some examples, the coolant evaluation circuitry 2004 is instantiated by processor circuitry executing coolant evaluator circuitry instructions and/or configured to perform operations such as those represented by the flowchart of FIG. 22.

The threshold determination circuitry 2005 determines the threshold for the first server 1702A. For example, the threshold determiner circuitry 2005 can determine the threshold based on a target temperature of the first server 1702A, a current workload of the first server 1702A and/or a queued workload of the first server 1702A. In some examples, the target temperature of the first server 1702A can be set by an operator of the system 1700, be associated with the workload on the first server 1702A and/or be based on the specification(s) of the components of the first server 1702A. In some examples, the threshold can be based on an expected heat output of the first server 1702A (e.g., the heat output of the current workload on the first server 1702A, the heat output of the upcoming/queued workload on the first server 1702A, etc.) and/or the ambient conditions of the server 1702A (e.g., the ambient temperature of the first server 1702A, a solar irradiance on the first server 1702A, etc.). In some examples, the threshold determiner circuitry 2005 can determine the threshold based on historic data associated with the first server 1702A (e.g., data relating to the historic heat output of the first server 1702A, etc.). In some examples, if the coolant parameter of a volume of coolant satisfies the threshold, the volume of coolant is effective to keep the first server 1702A at a target temperature. In some such examples, if the coolant parameter of a volume of coolant does not satisfy the threshold, the volume of coolant is not effective to keep the first server 1702A at a target temperature. In other examples, the threshold determiner circuitry 2005 can determine the threshold in any other suitable manner. In some examples, the threshold determination circuitry 2005 is instantiated by processor circuitry executing threshold determiner instructions and/or configured to perform operations such as those represented by the flowchart of FIG. 22.

The load balancer circuitry 2006 reduces the heat output of the first server 1702A. For example, the load balancer circuitry 2006 can cap the heat output of the first server 1702A. In some examples, the load balancer circuitry 2006 can throttle one or more compute units associated with the first server 1702A to reduce and/or cap the heat output of the first server 1702A. In some such examples, the load balancer circuitry 2006 can use feedback from the first sensors 1706A to keep the temperature output of the first server 1702A beneath the capped heat output. In some examples, the load balancer circuitry 2006 can base the capped heat output based on the coolant efficacy parameter determined during the execution of block 2204 (e.g., by ensuring the heat output by the first server 1702A does not exceed the cooling capabilities of the first coolant, etc.). Additionally or alternatively, the load balancer circuitry 2006 can transfer some or all of the workload of the first server 1702A to one or more other servers. In some such examples, the load balancer circuitry 2006 can transfer the workload of the first server 1702A to another server at the distributed computing system 1701 (e.g., the second server 1702B, etc.). In some examples, the load balancer circuitry 2006 is instantiated by processor circuitry executing load balancer instructions and/or configured to perform operations such as those represented by the flowchart of FIG. 22.

In some examples, the system controller circuitry 1708 includes means for interacting with a network (e.g., means for network interfacing, etc.). For example, the means for determining may be implemented by network interface circuitry 2002. In some examples, the network interface circuitry 2002 may be instantiated by processor circuitry such as the example processor circuitry 2412 of FIG. 24. For instance, the network interface circuitry 2002 may be instantiated by the example microprocessor 2500 of FIG. 25 executing machine executable instructions such as those implemented by at least blocks 2202, 2210, 2212, 2214, 2216 of FIG. 22. In some examples, the network interface circuitry 2002 may be instantiated by hardware logic circuitry, which may be implemented by an ASIC, XPU, or the FPGA circuitry 2600 of FIG. 26 structured to perform operations corresponding to the machine readable instructions. Additionally or alternatively, the network interface circuitry 2002 may be instantiated by any other combination of hardware, software, and/or firmware. For example, the network interface circuitry 2002 may be implemented by at least one or more hardware circuits (e.g., processor circuitry, discrete and/or integrated analog and/or digital circuitry, an FPGA, an ASIC, an XPU, a comparator, an operational-amplifier (op-amp), a logic circuit, etc.) structured to execute some or all of the machine readable instructions and/or to perform some or all of the operations corresponding to the machine readable instructions without executing software or firmware, but other structures are likewise appropriate.

In some examples, the system controller circuitry 1708 includes means for means for evaluating a coolant (e.g., means for coolant evaluation, etc.). For example, the means for evaluating a coolant may be implemented by the coolant evaluation circuitry 2004. In some examples, the coolant evaluation circuitry 2004 may be instantiated by processor circuitry such as the example processor circuitry 2412 of FIG. 24. For instance, the coolant evaluation circuitry 2004 may be instantiated by the example microprocessor 2500 of FIG. 25 executing machine executable instructions such as those implemented by at least blocks 2204, 2206 of FIG. 22. In some examples, the coolant evaluation circuitry 2004 may be instantiated by hardware logic circuitry, which may be implemented by an ASIC, XPU, or the FPGA circuitry 2600 of FIG. 26 structured to perform operations corresponding to the machine readable instructions. Additionally or alternatively, the coolant evaluation circuitry 2004 may be instantiated by any other combination of hardware, software, and/or firmware. For example, the coolant evaluation circuitry 2004 may be implemented by at least one or more hardware circuits (e.g., processor circuitry, discrete and/or integrated analog and/or digital circuitry, an FPGA, an ASIC, an XPU, a comparator, an operational-amplifier (op-amp), a logic circuit, etc.) structured to execute some or all of the machine readable instructions and/or to perform some or all of the operations corresponding to the machine readable instructions without executing software or firmware, but other structures are likewise appropriate.

In some examples, the system controller circuitry 1708 includes means for determining a threshold (e.g., means for threshold determining, etc.). For example, the means for determining a threshold may be implemented by threshold determination circuitry 2005. In some examples, the threshold determination circuitry 2005 may be instantiated by processor circuitry such as the example processor circuitry 2412 of FIG. 24. For instance, the threshold determination circuitry 2005 may be instantiated by the example microprocessor 2500 of FIG. 25 executing machine executable instructions such as those implemented by at least block 2205 of FIG. 22. In some examples, the threshold determination circuitry 2005 may be instantiated by hardware logic circuitry, which may be implemented by an ASIC, XPU, or the FPGA circuitry 2600 of FIG. 26 structured to perform operations corresponding to the machine readable instructions. Additionally or alternatively, the threshold determination circuitry 2005 may be instantiated by any other combination of hardware, software, and/or firmware. For example, the threshold determination circuitry 2005 may be implemented by at least one or more hardware circuits (e.g., processor circuitry, discrete and/or integrated analog and/or digital circuitry, an FPGA, an ASIC, an XPU, a comparator, an operational-amplifier (op-amp), a logic circuit, etc.) structured to execute some or all of the machine readable instructions and/or to perform some or all of the operations corresponding to the machine readable instructions without executing software or firmware, but other structures are likewise appropriate.

In some examples, the system controller circuitry 1708 includes means for balancing the load on a server (e.g., means for load balancing, etc.). For example, the means for balancing the load on a server may be implemented by the load balancer circuitry 2006. In some examples, the load balancer circuitry 2006 may be instantiated by processor circuitry such as the example processor circuitry 2412 of FIG. 24. For instance, the load balancer circuitry 2006 may be instantiated by the example microprocessor 2500 of FIG. 25 executing machine executable instructions such as those implemented by at least block 2208 of FIG. 22. In some examples, the load balancer circuitry 2006 may be instantiated by hardware logic circuitry, which may be implemented by an ASIC, XPU, or the FPGA circuitry 2600 of FIG. 26 structured to perform operations corresponding to the machine readable instructions. Additionally or alternatively, the load balancer circuitry 2006 may be instantiated by any other combination of hardware, software, and/or firmware. For example, the load balancer circuitry 2006 may be implemented by at least one or more hardware circuits (e.g., processor circuitry, discrete and/or integrated analog and/or digital circuitry, an FPGA, an ASIC, an XPU, a comparator, an operational-amplifier (op-amp), a logic circuit, etc.) structured to execute some or all of the machine readable instructions and/or to perform some or all of the operations corresponding to the machine readable instructions without executing software or firmware, but other structures are likewise appropriate.

Figure 21:
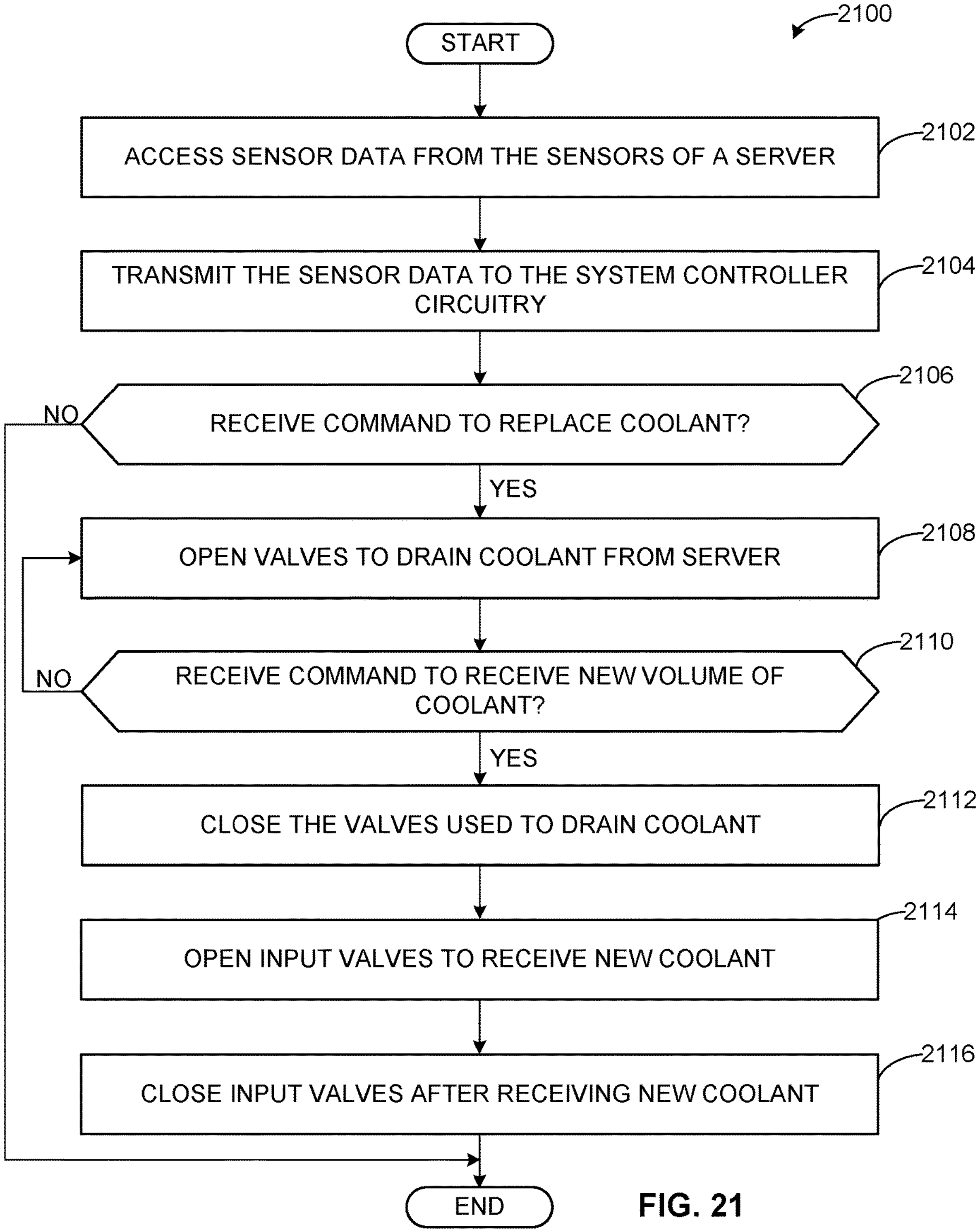
FIG. 21 is a flowchart representative of example machine readable instructions and/or example operations that may be executed by example processor circuitry to implement the LCH controller of FIGS. 17-19.

A flowchart representative of example machine readable instructions, which may be executed to configure processor circuitry to implement the first LCH controller of FIGS. 17-19, is shown in FIG. 21. The machine readable instructions may be one or more executable programs or portion(s) of an executable program for execution by processor circuitry, such as the processor circuitry 2312 shown in the example processor platform 2300 discussed below in connection with FIG. 23 and/or the example processor circuitry discussed below in connection with FIGS. 25 and/or 26. The program may be embodied in software stored on one or more non-transitory computer readable storage media such as a compact disk (CD), a floppy disk, a hard disk drive (HDD), a solid-state drive (SSD), a digital versatile disk (DVD), a Blu-ray disk, a volatile memory (e.g., Random Access Memory (RAM) of any type, etc.), or a non-volatile memory (e.g., electrically erasable programmable read-only memory (EEPROM), FLASH memory, an HDD, an SSD, etc.) associated with processor circuitry located in one or more hardware devices, but the entire program and/or parts thereof could alternatively be executed by one or more hardware devices other than the processor circuitry and/or embodied in firmware or dedicated hardware. The machine readable instructions may be distributed across multiple hardware devices and/or executed by two or more hardware devices (e.g., a server and a client hardware device). For example, the client hardware device may be implemented by an endpoint client hardware device (e.g., a hardware device associated with a user) or an intermediate client hardware device (e.g., a radio access network (RAN)) gateway that may facilitate communication between a server and an endpoint client hardware device). Similarly, the non-transitory computer readable storage media may include one or more mediums located in one or more hardware devices. Further, although the example program is described with reference to the flowchart illustrated in FIG. 21, many other methods of implementing the example first LCH controller 1704A may alternatively be used. For example, the order of execution of the blocks may be changed, and/or some of the blocks described may be changed, eliminated, or combined. Additionally or alternatively, any or all of the blocks may be implemented by one or more hardware circuits (e.g., processor circuitry, discrete and/or integrated analog and/or digital circuitry, an FPGA, an ASIC, a comparator, an operational-amplifier (op-amp), a logic circuit, etc.) structured to perform the corresponding operation without executing software or firmware. The processor circuitry may be distributed in different network locations and/or local to one or more hardware devices (e.g., a single-core processor (e.g., a single core central processor unit (CPU)), a multi-core processor (e.g., a multi-core CPU, an XPU, etc.) in a single machine, multiple processors distributed across multiple servers of a server rack, multiple processors distributed across one or more server racks, a CPU and/or a FPGA located in the same package (e.g., the same integrated circuit (IC) package or in two or more separate housings, etc.).

The machine readable instructions described herein may be stored in one or more of a compressed format, an encrypted format, a fragmented format, a compiled format, an executable format, a packaged format, etc. Machine readable instructions as described herein may be stored as data or a data structure (e.g., as portions of instructions, code, representations of code, etc.) that may be utilized to create, manufacture, and/or produce machine executable instructions. For example, the machine readable instructions may be fragmented and stored on one or more storage devices and/or computing devices (e.g., servers) located at the same or different locations of a network or collection of networks (e.g., in the cloud, in edge devices, etc.). The machine readable instructions may require one or more of installation, modification, adaptation, updating, combining, supplementing, configuring, decryption, decompression, unpacking, distribution, reassignment, compilation, etc., in order to make them directly readable, interpretable, and/or executable by a computing device and/or other machine. For example, the machine readable instructions may be stored in multiple parts, which are individually compressed, encrypted, and/or stored on separate computing devices, wherein the parts when decrypted, decompressed, and/or combined form a set of machine executable instructions that implement one or more operations that may together form a program such as that described herein.

In another example, the machine readable instructions may be stored in a state in which they may be read by processor circuitry, but require addition of a library (e.g., a dynamic link library (DLL)), a software development kit (SDK), an application programming interface (API), etc., in order to execute the machine readable instructions on a particular computing device or other device. In another example, the machine readable instructions may need to be configured (e.g., settings stored, data input, network addresses recorded, etc.) before the machine readable instructions and/or the corresponding program(s) can be executed in whole or in part. Thus, machine readable media, as used herein, may include machine readable instructions and/or program(s) regardless of the particular format or state of the machine readable instructions and/or program(s) when stored or otherwise at rest or in transit.

The machine readable instructions described herein can be represented by any past, present, or future instruction language, scripting language, programming language, etc. For example, the machine readable instructions may be represented using any of the following languages: C, C++, Java, C#, Perl, Python, JavaScript, HyperText Markup Language (HTML), Structured Query Language (SQL), Swift, etc.

As mentioned above, the example operations of FIGS. 21 and 22 may be implemented using executable instructions (e.g., computer and/or machine readable instructions) stored on one or more non-transitory computer and/or machine readable media such as optical storage devices, magnetic storage devices, an HDD, a flash memory, a read-only memory (ROM), a CD, a DVD, a cache, a RAM of any type, a register, and/or any other storage device or storage disk in which information is stored for any duration (e.g., for extended time periods, permanently, for brief instances, for temporarily buffering, and/or for caching of the information). As used herein, the terms non-transitory computer readable medium, non-transitory computer readable storage medium, non-transitory machine readable medium, and non-transitory machine readable storage medium are expressly defined to include any type of computer readable storage device and/or storage disk and to exclude propagating signals and to exclude transmission media. As used herein, the terms "computer readable storage device" and "machine readable storage device" are defined to include any physical (mechanical and/or electrical) structure to store information, but to exclude propagating signals and to exclude transmission media. Examples of computer readable storage devices and machine readable storage devices include random access memory of any type, read only memory of any type, solid state memory, flash memory, optical discs, magnetic disks, disk drives, and/or redundant array of independent disks (RAID) systems. As used herein, the term "device" refers to physical structure such as mechanical and/or electrical equipment, hardware, and/or circuitry that may or may not be configured by computer readable instructions, machine readable instructions, etc., and/or manufactured to execute computer readable instructions, machine readable instructions, etc.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc., may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, or (7) A with B and with C. As used herein in the context of describing structures, components, items, objects and/or things, the phrase "at least one of A and B" is intended to refer to implementations including any of (1) at least one A, (2) at least one B, or (3) at least one A and at least one B. Similarly, as used herein in the context of describing structures, components, items, objects and/or things, the phrase "at least one of A or B" is intended to refer to implementations including any of (1) at least one A, (2) at least one B, or (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, or (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, or (3) at least one A and at least one B.

As used herein, singular references (e.g., "a", "an", "first", "second", etc.) do not exclude a plurality. The term "a" or "an" object, as used herein, refers to one or more of that object. The terms "a" (or "an"), "one or more", and "at least one" are used interchangeably herein. Furthermore, although individually listed, a plurality of means, elements or method actions may be implemented by, e.g., the same entity or object. Additionally, although individual features may be included in different examples or claims, these may possibly be combined, and the inclusion in different examples or claims does not imply that a combination of features is not feasible and/or advantageous.

FIG. 21 is a flowchart representative of example machine readable instructions and/or example operations 2100 that may be executed and/or instantiated by processor circuitry to receive sensor data from the sensors 1706A of the first server 1702A, drain coolant from the first server 1702A, and/or supply new coolant from the first server 1702A. The machine readable instructions and/or the operations 2100 of FIG. 21 begin at block 2102, at which the sensor interface circuitry accesses sensor data from the first sensors 1706A of the first server 1702A. For example, the sensor interface circuitry 1902 can receive sensor data from the sensors 1706A of the first server 1702A. In some examples, the sensor interface circuitry 1902 can transform the sensor data from a machine-readable format (e.g., a voltage, a current, etc.) into a human-readable format (e.g., a number, a string, etc.). In some examples, the sensor interface circuitry 1902 can format the data from the sensors 1706A (e.g., multiple sensors measuring different quantities, etc.) into a data structure.

At block 2104, the network interface circuitry 1904 transmits the sensor data to the system controller circuitry 1708. For example, the network interface circuitry 1904 can transmit the sensor data accessed by the sensor interface circuitry 1902 to the system controller circuitry 1708 via the network 1712. In other examples, the network interface circuitry 1904 can transmit the sensor data to the system controller circuitry 1708 in any other suitable manner.

At block 2106, the network interface circuitry 1904 determines if a command to replace coolant has been received. For example, the network interface circuitry 1904 can determine if the system controller circuitry 1708 has transmitted a command (e.g., a request, a signal, etc.) to drain the first volume of coolant (e.g., a portion of the coolant stored within the first server 1702A, all of the coolant stored within the first server 1702A, etc.). contained within the first server 1702A via the network 1712. In other examples, the network interface circuitry 1904 can determine if the command has been received in any other suitable manner. If the network interface circuitry 1904 determines a command to drain the coolant has been received, the operations 2100 advances to block 2108. If the network interface circuitry 1904 determines a command to drain the coolant has not been received, the operations 2100 ends.

At block 2108, the valve interface circuitry 1906 opens one or more valves to drain coolant from the first server 1702A. For example, the valve interface circuitry 1906 can, by sending a signal to one or more controllable features (e.g., an actuator, etc.) of the valves 1802, 1804 of FIG. 18, to open and drain a first volume of coolant from the first server 1702A. At block 2110, the network interface circuitry 1904 determines if a command to receive a new volume of coolant has been received. For example, the network interface circuitry 1904 can determine if the system controller circuitry 1708 has transmitted a command (e.g., a request, a signal, etc.) to receive a new volume of the coolant via the network 1712. Additionally or alternatively, the command to receive new coolant can be included with the command received during the execution of block 2106. In some examples, the command can be generated automatically (e.g., by the first LCH controller 1704A, by the system controller circuitry 1708, etc.) after a set period of time after receiving the command of block 2106 or after detecting a first volume of coolant being expelled through the first valve 1802 and/or the second valve 1804. If the network interface circuitry 1904 determines a command to receive new coolant has been received, the operations 2100 advances to block 2112. If the network interface circuitry 1904 determines a command to drain the coolant has not been received, the operations 2100 returns to block 2108.

At block 2112, the valve interface circuitry 1906 closes the valves used to drain the coolant. For example, the valve interface circuitry 1906 can send a signal to one or more controllable features (e.g., an actuator, etc.) of the valves 1802, 1804 of FIG. 18, to close. In other examples, the valve interface circuitry 1906 can close the valves 1802, 1804 in any other suitable manner.

At block 2114, the valve interface circuitry 1906 opens the valves used to receive new coolant. For example, the valve interface circuitry 1906 can send a signal to one or more controllable features (e.g., an actuator, etc.) of the valves 1806, 1808 of FIG. 18 to open and receive new coolant pumped from the coolant storage 1710. In other examples, the valve interface circuitry 1906 can open the valves 1806, 1808 in any other suitable manner. At block 2116, the valve interface circuitry 1906 closes the valves used to receive the new coolant after the new coolant has been received. For example, the valve interface circuitry 1906 can close the valves 1806, 1808 by sending a signal to the controllable feature of the valves 1806, 1808 after detecting (e.g., via a flowmeter disposed in the valves 1806, 1808, etc.) that the new coolant has been received. In some examples, the valve interface circuitry 1906 can close the valves 1806, 1808 after receiving a command from the system controller circuitry 1708. Additionally or alternatively, the valve interface circuitry 1906 can close the valves 1806, 1808 after a predetermined period of time. The operations 2100 end.

Figure 22:
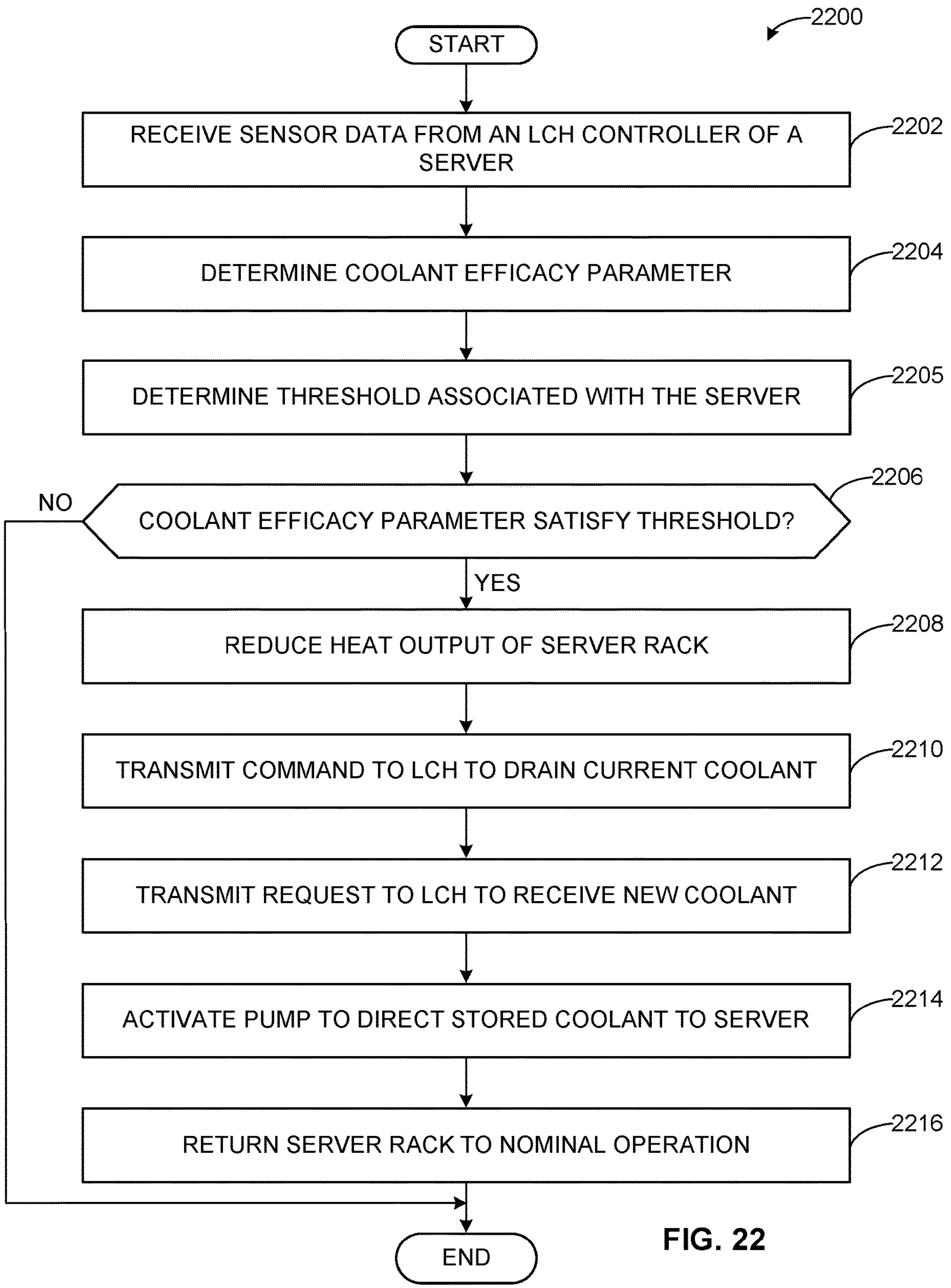
FIG. 22 is a flowchart representative of example machine readable instructions and/or example operations that may be executed by example processor circuitry to implement the system controller circuitry of FIGS. 17 and 20.

A flowchart representative of example machine readable instructions, which may be executed to configure processor circuitry to implement the system controller circuitry 1708 of FIGS. 17 and 20, is shown in FIG. 22. The machine readable instructions may be one or more executable programs or portion(s) of an executable program for execution by processor circuitry, such as the processor circuitry 2412 shown in the example processor platform 2400 discussed below in connection with FIG. 24 and/or the example processor circuitry discussed below in connection with FIGS. 25 and/or 26. The program may be embodied in software stored on one or more non-transitory computer readable storage media such as a compact disk (CD), a floppy disk, a hard disk drive (HDD), a solid-state drive (SSD), a digital versatile disk (DVD), a Blu-ray disk, a volatile memory (e.g., Random Access Memory (RAM) of any type, etc.), or a non-volatile memory (e.g., electrically erasable programmable read-only memory (EEPROM), FLASH memory, an HDD, an SSD, etc.) associated with processor circuitry located in one or more hardware devices, but the entire program and/or parts thereof could alternatively be executed by one or more hardware devices other than the processor circuitry and/or embodied in firmware or dedicated hardware. The machine readable instructions may be distributed across multiple hardware devices and/or executed by two or more hardware devices (e.g., a server and a client hardware device). For example, the client hardware device may be implemented by an endpoint client hardware device (e.g., a hardware device associated with a user) or an intermediate client hardware device (e.g., a radio access network (RAN)) gateway that may facilitate communication between a server and an endpoint client hardware device). Similarly, the non-transitory computer readable storage media may include one or more mediums located in one or more hardware devices. Further, although the example program is described with reference to the flowchart illustrated in FIG. 22, many other methods of implementing the example system controller circuitry 1708 may alternatively be used. For example, the order of execution of the blocks may be changed, and/or some of the blocks described may be changed, eliminated, or combined. Additionally or alternatively, any or all of the blocks may be implemented by one or more hardware circuits (e.g., processor circuitry, discrete and/or integrated analog and/or digital circuitry, an FPGA, an ASIC, a comparator, an operational-amplifier (op-amp), a logic circuit, etc.) structured to perform the corresponding operation without executing software or firmware. The processor circuitry may be distributed in different network locations and/or local to one or more hardware devices (e.g., a single-core processor (e.g., a single core central processor unit (CPU)), a multi-core processor (e.g., a multi-core CPU, an XPU, etc.) in a single machine, multiple processors distributed across multiple servers of a server rack, multiple processors distributed across one or more server racks, a CPU and/or a FPGA located in the same package (e.g., the same integrated circuit (IC) package or in two or more separate housings, etc.).

FIG. 22 is a flowchart representative of example machine readable instructions and/or example operations 2200 that may be executed and/or instantiated by processor circuitry to determine if the coolant of a server is suitable to cool the server and/or the replace the coolant of a server. The machine readable instructions and/or the operations 2200 of FIG. 22 begin at block 2202, at which the network interface circuitry 2002 receive sensor data from the first LCH controller 1704A. For example, the network interface circuitry 2002 can receive sensor data output by the sensors 1706A of FIG. 17 and transmitted by the network interface circuitry 1904 of the first LCH controller 1704A via the network 1712. In other examples, the network interface circuitry 2002 can access the sensor data in any other suitable manner (e.g., directly from the sensors 1706A, etc.).

At block 2204, the coolant evaluation circuitry 2004 determines the coolant parameter of the coolant of the first server 1702A based on the sensor data. For example, the coolant evaluation circuitry 2004 can used the sensor data (e.g., the temperature of the coolant, the volume of the coolant, the contamination of the coolant, etc.) to determine an amount of heat the coolant of the first server 1702A is able to absorb (e.g., in units of energy, in units of power, etc.). In some examples, the coolant evaluation circuitry 2004 can determine the efficacy of the coolant based on the known properties (e.g., the specific heat, etc.) of the coolant at a given temperature. In other examples, the coolant evaluation circuitry 2004 can determine the coolant parameter in any other suitable manner.

At block 2205, the threshold determiner circuitry 2005 determines the threshold for the first server 1702A. For example, the threshold determiner circuitry 2005 can determine the threshold based on a target temperature of the first server 1702A. In some examples, the target temperature can be based on an input from a technician and/or be associated with a workload of the first server 1702A. In some examples, the threshold can be based on an expected heat output of the first server 1702A (e.g., the heat output of a current workload on the first server 1702A, the heat output of upcoming workload on the first server 1702A, etc.) and/or the ambient conditions of the server 1702A (e.g., the ambient temperature of the first server 1702A, a solar irradiance on the first server 1702A, etc.). In some examples, the threshold determiner circuitry 2005 can determine the threshold based on historic data associated with the first server 1702A (e.g., data relating to the historic heat output of the first server 1702A, etc.). In other examples, the threshold determiner circuitry 2005 can determine the threshold in any other suitable manner.

At block 2206, the coolant evaluation circuitry 2004 can determine coolant efficacy parameter satisfies a threshold. For example, the coolant evaluation circuitry 2004 can compare the coolant efficacy to the threshold to determine if the coolant in the first server 1702A is able to keep the first server 1702A at a target temperature (e.g., a temperature to prevent damage to the first server 1702A, a temperature required for the workload of the first server 1702A, etc.). If the coolant evaluation circuitry 2004 determines the coolant satisfies the threshold, the operations 2200 advance to block 2208. If the coolant evaluation circuitry 2004 determines the coolant does not satisfy the threshold, the operations 2200 end.

At block 2208, the load balancer circuitry 2006 reduces the heat output of the first server 1702A. For example, the load balancer circuitry 2006 can cap the heat output of the first server 1702A. In some examples, the load balancer circuitry 2006 can throttle one or more compute units associated with the first server 1702A to reduce and/or cap the heat output of the first server 1702A. In some such examples, the load balancer circuitry 2006 can use feedback from the first sensors 1706A to keep the temperature output of the first server 1702A beneath the capped heat output. In some examples, the load balancer circuitry 2006 can base the capped heat output based on the coolant efficacy parameter determined during the execution of block 2204 (e.g., by ensuring the heat output by the first server 1702A does not exceed the cooling capabilities of the first coolant, etc.). Additionally or alternatively, the load balancer circuitry 2006 can transfer some or all of the workload of the first server 1702A to one or more other servers. In some such examples, the load balancer circuitry 2006 can transfer the workload of the first server 1702A to another server at the distributed computing system 1701 (e.g., the second server 1702B, etc.).

At block 2210, the network interface circuitry 2002 transmits the command to the first LCH controller 1704A to drain the current coolant. For example, the network interface circuitry 2002 can transmit a command over the network 1712 to the first LCH controller 1704A to open one or more valves to drain some or all of the coolant from the first server 1702A. At block 2212, the network interface circuitry 2002 transmits the command to the first LCH controller 1704A to drain the current coolant. For example, the network interface circuitry 2002 can transmit a command over the network 1712 to the first LCH controller 1704A to open one or more valves to receive coolant from the coolant storage 1710. In some examples, the network interface circuitry 2002 can concurrently send a command to close the valves opened during the execution of block 2210.

At block 2214, the network interface circuitry 2002 activates THE pump 1717 to direct stored coolant to the first server 1702A. For example, the network interface circuitry 2002 can send a command to the pump 1717 to begin pumping coolant from the coolant storage 1710 into the first pipe 1714 to the first server 1702A. In other examples, the network interface circuitry 2002 can activate the pump 1717 in any other suitable manner (e.g., by alerting a technician to activate the pump 1717, etc.). At block 2216, the network interface circuitry 2002 and/or the load balancer circuitry 2006 return. server rack to nominal operation. For example, the load balancer circuitry 2006 can return the workload to the first server 1702A that was transferred to other servers during the execution of block 2208. In some examples, the load balancer circuitry 2006 can remove the cap on the heat output of the first server 1702A. In some examples, the network interface circuitry 2002 can send a command to close any open valves associated with the first server 1702A and/or the first LCH controller 1704A. The operations 2200 end.

Figure 23:
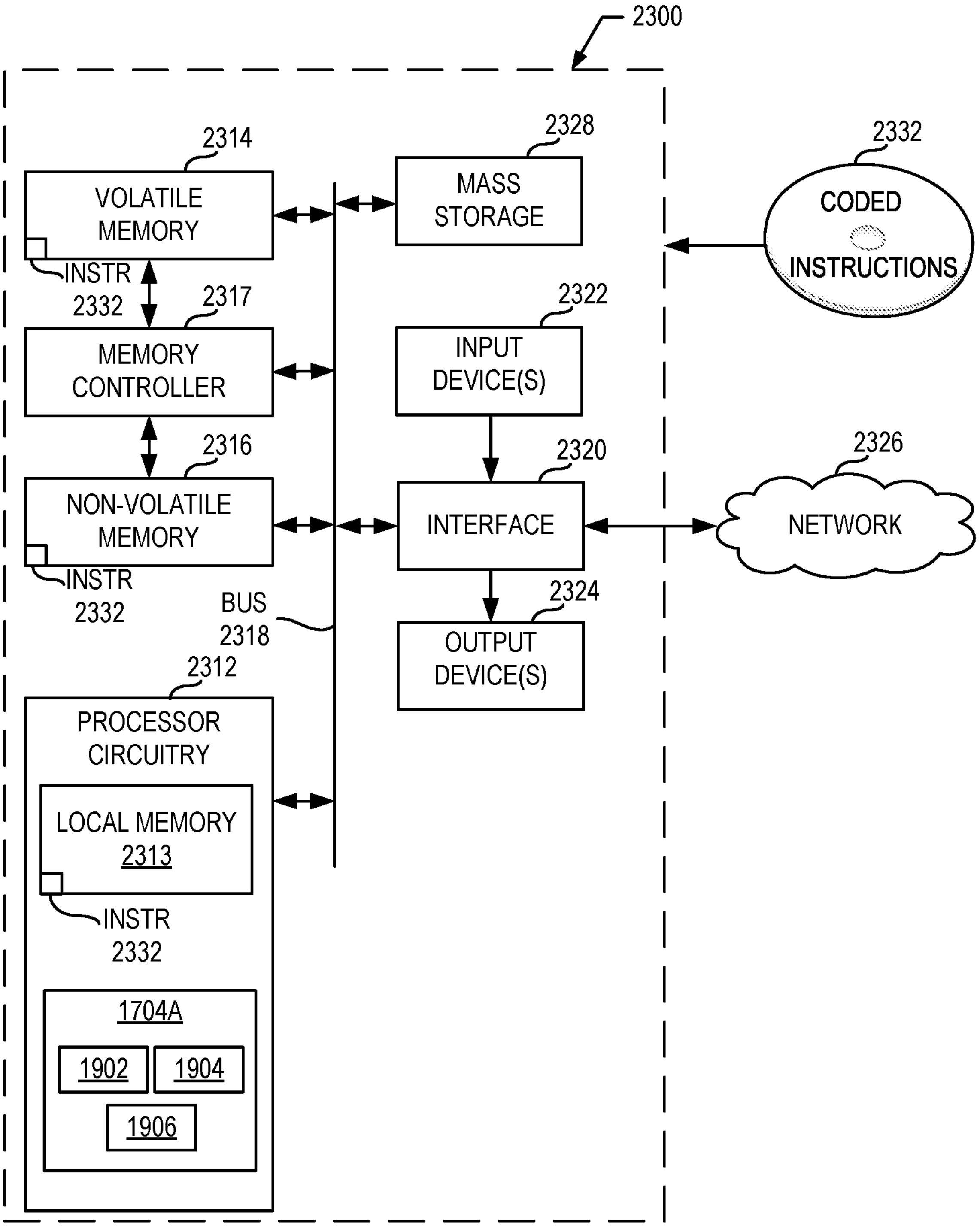
FIG. 23 is a block diagram of an example processing platform including processor circuitry structured to execute the example machine readable instructions and/or the example operations of FIG. 21 to implement the LCH controller of FIGS. 17-19.

FIG. 23 is a block diagram of an example processor platform 2300 structured to execute and/or instantiate the machine readable instructions and/or the operations of FIG. 21 to implement the first LCH controller 1704A of FIGS. 17 and 19. The processor platform 2300 can be, for example, a server, a personal computer, a workstation, a self-learning machine (e.g., a neural network), a mobile device (e.g., a cell phone, a smart phone, a tablet such as an iPad™), a personal digital assistant (PDA), an Internet appliance, a DVD player, a CD player, a Blu-ray player, a gaming console, a headset (e.g., an augmented reality (AR) headset, a virtual reality (VR) headset, etc.) or other wearable device, or any other type of computing device.

The processor platform 2300 of the illustrated example includes processor circuitry 2312. The processor circuitry 2312 of the illustrated example is hardware. For example, the processor circuitry 2312 can be implemented by one or more integrated circuits, logic circuits, FPGAs, microprocessors, CPUs, GPUs, DSPs, and/or microcontrollers from any desired family or manufacturer. The processor circuitry 2312 may be implemented by one or more semiconductor based (e.g., silicon based) devices. In this example, the processor circuitry 2312 implements the sensor interface circuitry 1902, the network interface circuitry 1904, and the valve interface circuitry 1906.

The processor circuitry 2312 of the illustrated example includes a local memory 2313 (e.g., a cache, registers, etc.). The processor circuitry 2312 of the illustrated example is in communication with a main memory including a volatile memory 2314 and a non-volatile memory 2316 by a bus 2318. The volatile memory 2314 may be implemented by Synchronous Dynamic Random Access Memory (SDRAM), Dynamic Random Access Memory (DRAM), RAMBUS® Dynamic Random Access Memory (RDRAM®), and/or any other type of RAM device. The non-volatile memory 2316 may be implemented by flash memory and/or any other desired type of memory device. Access to the main memory 2314, 2316 of the illustrated example is controlled by a memory controller 2317.

The processor platform 2300 of the illustrated example also includes interface circuitry 2320. The interface circuitry 2320 may be implemented by hardware in accordance with any type of interface standard, such as an Ethernet interface, a universal serial bus (USB) interface, a Bluetooth® interface, a near field communication (NFC) interface, a Peripheral Component Interconnect (PCI) interface, and/or a Peripheral Component Interconnect Express (PCIe) interface.

In the illustrated example, one or more input devices 2322 are connected to the interface circuitry 2320. The input device(s) 2322 permit(s) a user to enter data and/or commands into the processor circuitry 2312. The input device(s) 2322 can be implemented by, for example, an audio sensor, a microphone, a camera (still or video), a keyboard, a button, a mouse, a touchscreen, a track-pad, a trackball, an isopoint device, and/or a voice recognition system.

One or more output devices 2324 are also connected to the interface circuitry 2320 of the illustrated example. The output device(s) 2324 can be implemented, for example, by display devices (e.g., a light emitting diode (LED), an organic light emitting diode (OLED), a liquid crystal display (LCD), a cathode ray tube (CRT) display, an in-place switching (IPS) display, a touchscreen, etc.), a tactile output device, a printer, and/or speaker. The interface circuitry 2320 of the illustrated example, thus, typically includes a graphics driver card, a graphics driver chip, and/or graphics processor circuitry such as a GPU.

The interface circuitry 2320 of the illustrated example also includes a communication device such as a transmitter, a receiver, a transceiver, a modem, a residential gateway, a wireless access point, and/or a network interface to facilitate exchange of data with external machines (e.g., computing devices of any kind) by a network 2326. The communication can be by, for example, an Ethernet connection, a digital subscriber line (DSL) connection, a telephone line connection, a coaxial cable system, a satellite system, a line-of-site wireless system, a cellular telephone system, an optical connection, etc.

The processor platform 2300 of the illustrated example also includes one or more mass storage devices 2328 to store software and/or data. Examples of such mass storage devices 2328 include magnetic storage devices, optical storage devices, floppy disk drives, HDDs, CDs, Blu-ray disk drives, redundant array of independent disks (RAID) systems, solid state storage devices such as flash memory devices and/or SSDs, and DVD drives.

The machine readable instructions 2332, which may be implemented by the machine readable instructions of FIGS. 21, may be stored in the mass storage device 2328, in the volatile memory 2314, in the non-volatile memory 2316, and/or on a removable non-transitory computer readable storage medium such as a CD or DVD.

Figure 24:
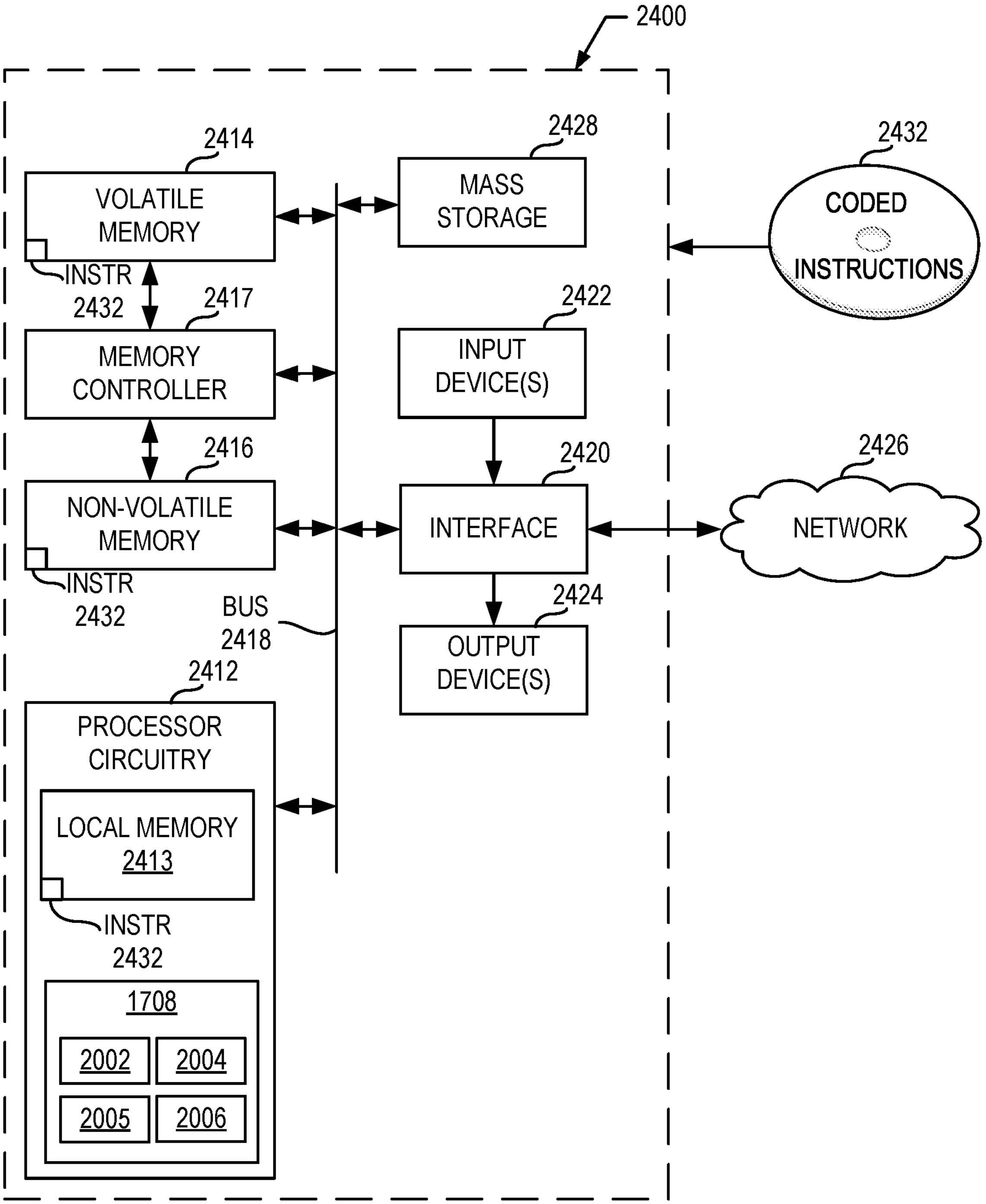
FIG. 24 is a block diagram of an example processing platform including processor circuitry structured to execute the example machine readable instructions and/or the example operations of FIG. 22 to implement the system controller of FIGS. 17 and 20.

FIG. 24 is a block diagram of an example processor platform 2400 structured to execute and/or instantiate the machine readable instructions and/or the operations of FIG. 22 to implement the system controller circuitry 1708 of FIGS. 17 and 20. The processor platform 2400 can be, for example, a server, a personal computer, a workstation, a self-learning machine (e.g., a neural network), a mobile device (e.g., a cell phone, a smart phone, a tablet such as an iPad™), a personal digital assistant (PDA), an Internet appliance, a DVD player, a CD player, a Blu-ray player, a gaming console, a headset (e.g., an augmented reality (AR) headset, a virtual reality (VR) headset, etc.) or other wearable device, or any other type of computing device.

The processor platform 2400 of the illustrated example includes processor circuitry 2412. The processor circuitry 2412 of the illustrated example is hardware. For example, the processor circuitry 2412 can be implemented by one or more integrated circuits, logic circuits, FPGAs, microprocessors, CPUs, GPUs, DSPs, and/or microcontrollers from any desired family or manufacturer. The processor circuitry 2412 may be implemented by one or more semiconductor based (e.g., silicon based) devices. In this example, the processor circuitry 2412 implements the network interface circuitry 2002, the coolant evaluation circuitry 2004, the threshold determination circuitry 2005, and the load balancer circuitry 2006.

The processor circuitry 2412 of the illustrated example includes a local memory 2413 (e.g., a cache, registers, etc.). The processor circuitry 2412 of the illustrated example is in communication with a main memory including a volatile memory 2414 and a non-volatile memory 2416 by a bus 2418. The volatile memory 2414 may be implemented by Synchronous Dynamic Random Access Memory (SDRAM), Dynamic Random Access Memory (DRAM), RAMBUS® Dynamic Random Access Memory (RDRAM®), and/or any other type of RAM device. The non-volatile memory 2416 may be implemented by flash memory and/or any other desired type of memory device. Access to the main memory 2414, 2416 of the illustrated example is controlled by a memory controller 2417.

The processor platform 2400 of the illustrated example also includes interface circuitry 2420. The interface circuitry 2420 may be implemented by hardware in accordance with any type of interface standard, such as an Ethernet interface, a universal serial bus (USB) interface, a Bluetooth® interface, a near field communication (NFC) interface, a Peripheral Component Interconnect (PCI) interface, and/or a Peripheral Component Interconnect Express (PCIe) interface.

In the illustrated example, one or more input devices 2422 are connected to the interface circuitry 2420. The input device(s) 2422 permit(s) a user to enter data and/or commands into the processor circuitry 2412. The input device(s) 2422 can be implemented by, for example, an audio sensor, a microphone, a camera (still or video), a keyboard, a button, a mouse, a touchscreen, a track-pad, a trackball, an isopoint device, and/or a voice recognition system.

One or more output devices 2424 are also connected to the interface circuitry 2420 of the illustrated example. The output device(s) 2424 can be implemented, for example, by display devices (e.g., a light emitting diode (LED), an organic light emitting diode (OLED), a liquid crystal display (LCD), a cathode ray tube (CRT) display, an in-place switching (IPS) display, a touchscreen, etc.), a tactile output device, a printer, and/or speaker. The interface circuitry 2420 of the illustrated example, thus, typically includes a graphics driver card, a graphics driver chip, and/or graphics processor circuitry such as a GPU.

The interface circuitry 2420 of the illustrated example also includes a communication device such as a transmitter, a receiver, a transceiver, a modem, a residential gateway, a wireless access point, and/or a network interface to facilitate exchange of data with external machines (e.g., computing devices of any kind) by a network 2426. The communication can be by, for example, an Ethernet connection, a digital subscriber line (DSL) connection, a telephone line connection, a coaxial cable system, a satellite system, a line-of-site wireless system, a cellular telephone system, an optical connection, etc.

The processor platform 2400 of the illustrated example also includes one or more mass storage devices 2428 to store software and/or data. Examples of such mass storage devices 2428 include magnetic storage devices, optical storage devices, floppy disk drives, HDDs, CDs, Blu-ray disk drives, redundant array of independent disks (RAID) systems, solid state storage devices such as flash memory devices and/or SSDs, and DVD drives.

The machine readable instructions 2432, which may be implemented by the machine readable instructions of FIGS. 22, may be stored in the mass storage device 2428, in the volatile memory 2414, in the non-volatile memory 2416, and/or on a removable non-transitory computer readable storage medium such as a CD or DVD.

Figure 25:
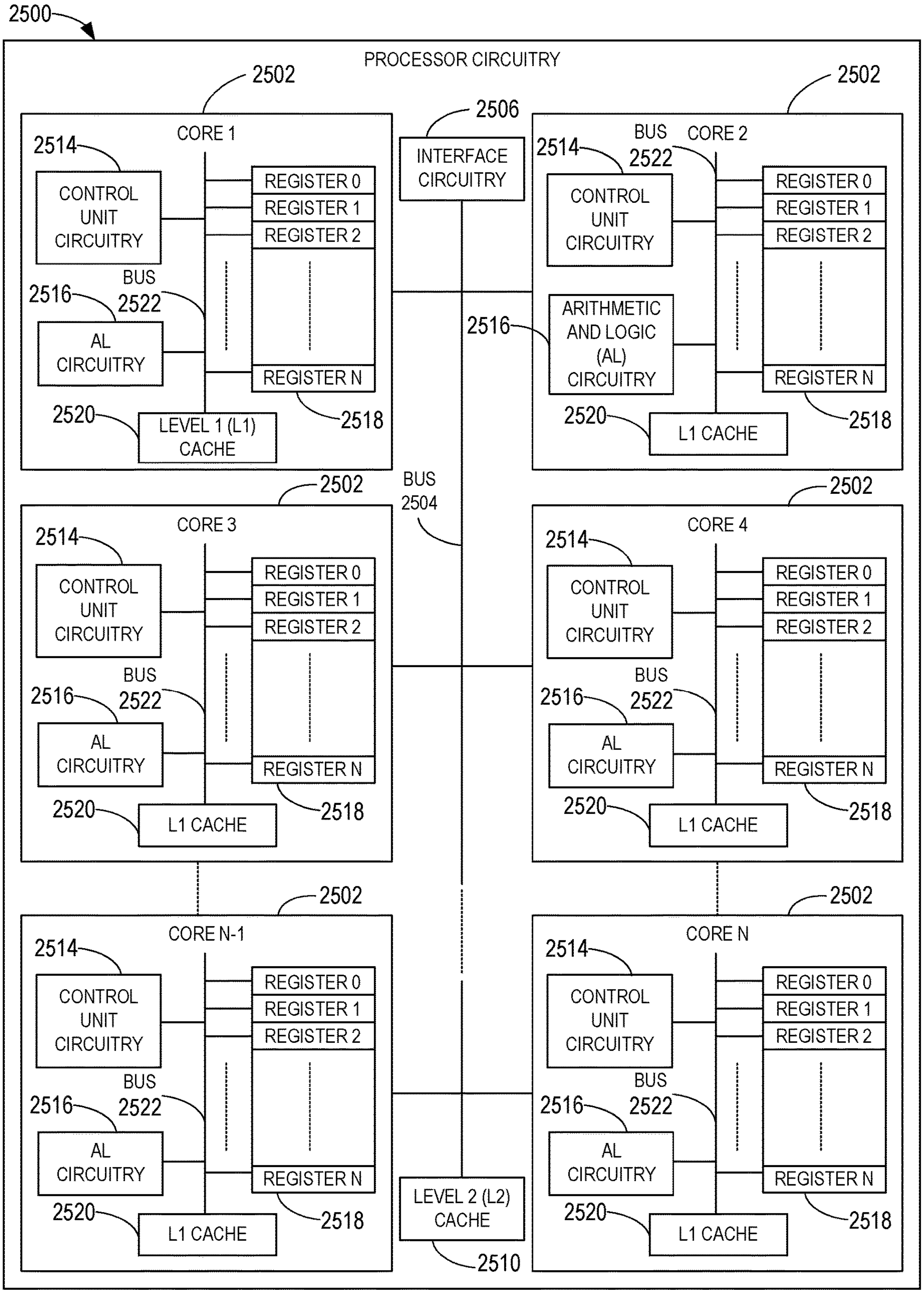
FIG. 25 is a block diagram of an example implementation of the processor circuitry of FIG. 23 and/or the processor circuitry of FIG. 24.

FIG. 25 is a block diagram of an example implementation of the processor circuitry 2312 of FIG. 23 and/or the processor circuitry 2412 of FIG. 24. In this example, the processor circuitry 2312 of FIG. 23 and/or the processor circuitry 2412 of FIG. 24 is implemented by a microprocessor 2500. For example, the microprocessor 2500 may be a general purpose microprocessor (e.g., general purpose microprocessor circuitry). The microprocessor 2500 executes some or all of the machine readable instructions of the flowcharts of FIGS. 21 and 22 to effectively instantiate the circuitry of FIGS. 19 and 20 as logic circuits to perform the operations corresponding to those machine readable instructions. In some such examples, the circuitry of FIGS. 19 and 20 is instantiated by the hardware circuits of the microprocessor 2500 in combination with the instructions. For example, the microprocessor 2500 may be implemented by multi-core hardware circuitry such as a CPU, a DSP, a GPU, an XPU, etc. Although it may include any number of example cores 2502 (e.g., 1 core), the microprocessor 2500 of this example is a multi-core semiconductor device including N cores. The cores 2502 of the microprocessor 2500 may operate independently or may cooperate to execute machine readable instructions. For example, machine code corresponding to a firmware program, an embedded software program, or a software program may be executed by one of the cores 2502 or may be executed by multiple ones of the cores 2502 at the same or different times. In some examples, the machine code corresponding to the firmware program, the embedded software program, or the software program is split into threads and executed in parallel by two or more of the cores 2502. The software program may correspond to a portion or all of the machine readable instructions and/or operations represented by the flowcharts of FIGS. 21 and 22.

The cores 2502 may communicate by a first example bus 2504. In some examples, the first bus 2504 may be implemented by a communication bus to effectuate communication associated with one(s) of the cores 2502. For example, the first bus 2504 may be implemented by at least one of an Inter-Integrated Circuit (I2C) bus, a Serial Peripheral Interface (SPI) bus, a PCI bus, or a PCIe bus. Additionally or alternatively, the first bus 2504 may be implemented by any other type of computing or electrical bus. The cores 2502 may obtain data, instructions, and/or signals from one or more external devices by example interface circuitry 2506. The cores 2502 may output data, instructions, and/or signals to the one or more external devices by the interface circuitry 2506. Although the cores 2502 of this example include example local memory 2520 (e.g., Level 1 (L1) cache that may be split into an L1 data cache and an L1 instruction cache), the microprocessor 2500 also includes example shared memory 2510 that may be shared by the cores (e.g., Level 2 (L2 cache)) for high-speed access to data and/or instructions. Data and/or instructions may be transferred (e.g., shared) by writing to and/or reading from the shared memory 2510. The local memory 2520 of each of the cores 2502 and the shared memory 2510 may be part of a hierarchy of storage devices including multiple levels of cache memory and the main memory (e.g., the main memory 2314, 2316 of FIG. 23, the main memory 2414, 2416 of FIG. 24, etc.). Typically, higher levels of memory in the hierarchy exhibit lower access time and have smaller storage capacity than lower levels of memory. Changes in the various levels of the cache hierarchy are managed (e.g., coordinated) by a cache coherency policy.

Each core 2502 may be referred to as a CPU, DSP, GPU, etc., or any other type of hardware circuitry. Each core 2502 includes control unit circuitry 2514, arithmetic and logic (AL) circuitry (sometimes referred to as an ALU) 2516, a plurality of registers 2518, the local memory 2520, and a second example bus 2522. Other structures may be present. For example, each core 2502 may include vector unit circuitry, single instruction multiple data (SIMD) unit circuitry, load/store unit (LSU) circuitry, branch/jump unit circuitry, floating-point unit (FPU) circuitry, etc. The control unit circuitry 2514 includes semiconductor-based circuits structured to control (e.g., coordinate) data movement within the corresponding core 2502. The AL circuitry 2516 includes semiconductor-based circuits structured to perform one or more mathematic and/or logic operations on the data within the corresponding core 2502. The AL circuitry 2516 of some examples performs integer based operations. In other examples, the AL circuitry 2516 also performs floating point operations. In yet other examples, the AL circuitry 2516 may include first AL circuitry that performs integer based operations and second AL circuitry that performs floating point operations. In some examples, the AL circuitry 2516 may be referred to as an Arithmetic Logic Unit (ALU). The registers 2518 are semiconductor-based structures to store data and/or instructions such as results of one or more of the operations performed by the AL circuitry 2516 of the corresponding core 2502. For example, the registers 2518 may include vector register(s), SIMD register(s), general purpose register(s), flag register(s), segment register(s), machine specific register(s), instruction pointer register(s), control register(s), debug register(s), memory management register(s), machine check register(s), etc. The registers 2518 may be arranged in a bank as shown in FIG. 25. Alternatively, the registers 2518 may be organized in any other arrangement, format, or structure including distributed throughout the core 2502 to shorten access time. The second bus 2522 may be implemented by at least one of an I2C bus, a SPI bus, a PCI bus, or a PCIe bus Each core 2502 and/or, more generally, the microprocessor 2500 may include additional and/or alternate structures to those shown and described above. For example, one or more clock circuits, one or more power supplies, one or more power gates, one or more cache home agents (CHAs), one or more converged/common mesh stops (CMSs), one or more shifters (e.g., barrel shifter(s)) and/or other circuitry may be present. The microprocessor 2500 is a semiconductor device fabricated to include many transistors interconnected to implement the structures described above in one or more integrated circuits (ICs) contained in one or more packages. The processor circuitry may include and/or cooperate with one or more accelerators. In some examples, accelerators are implemented by logic circuitry to perform certain tasks more quickly and/or efficiently than can be done by a general purpose processor. Examples of accelerators include ASICs and FPGAs such as those discussed herein. A GPU or other programmable device can also be an accelerator. Accelerators may be on-board the processor circuitry, in the same chip package as the processor circuitry and/or in one or more separate packages from the processor circuitry.

Figure 26:
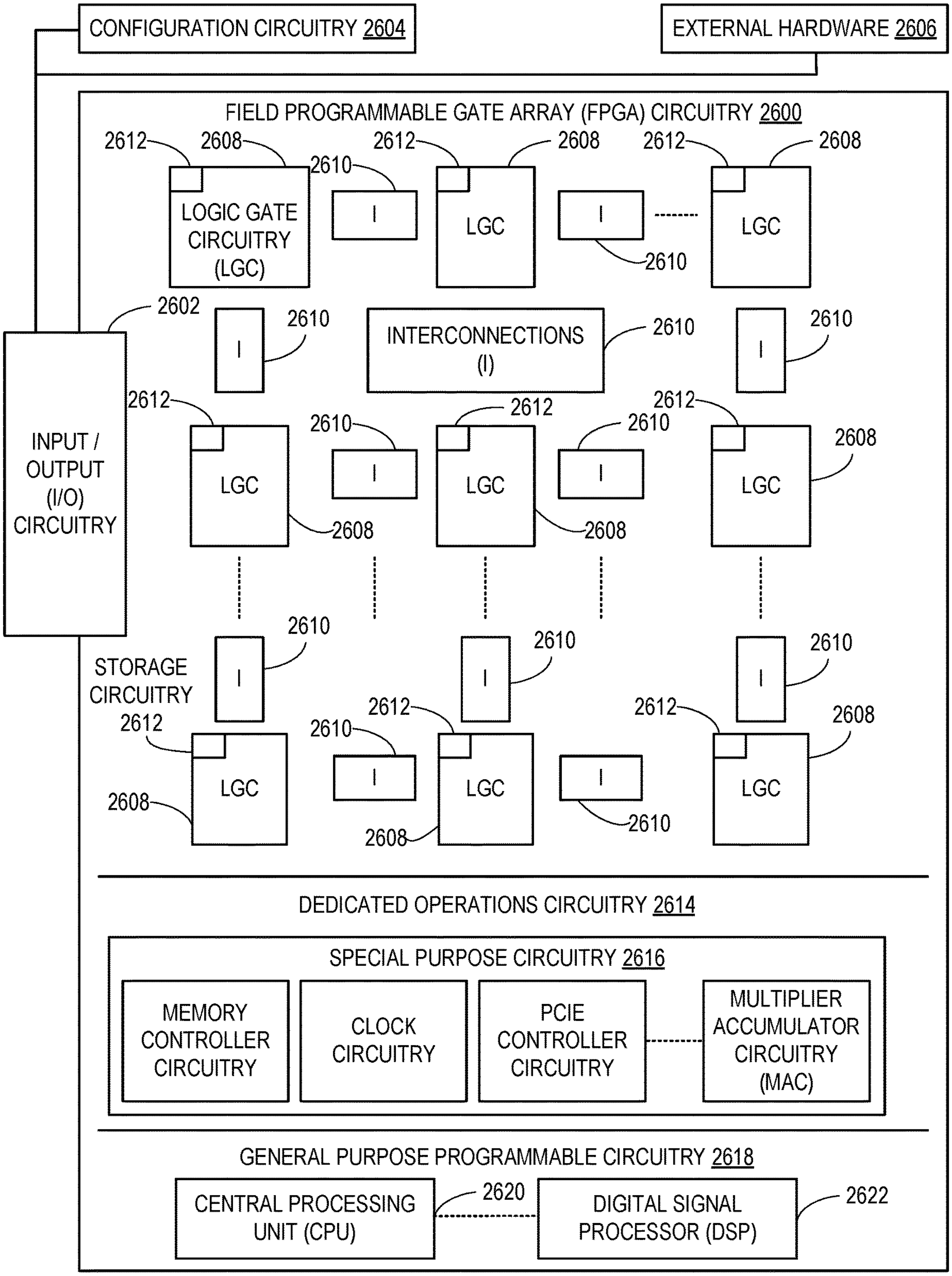
FIG. 26 is a block diagram of another example implementation of the processor circuitry of FIG. 23 and/or the processor circuitry of FIG. 24

FIG. 26 is a block diagram of another example implementation of the processor circuitry 2312 of FIG. 23 and/or the processor circuitry 2412 of FIG. 24. In this example, the processor circuitry 2412 is implemented by FPGA circuitry 2600. For example, the FPGA circuitry 2600 may be implemented by an FPGA. The FPGA circuitry 2600 can be used, for example, to perform operations that could otherwise be performed by the example microprocessor 2500 of FIG. 25 executing corresponding machine readable instructions. However, once configured, the FPGA circuitry 2600 instantiates the machine readable instructions in hardware and, thus, can often execute 2 the operations faster than they could be performed by a general purpose microprocessor executing the corresponding software.

More specifically, in contrast to the microprocessor 2500 of FIG. 25 described above (which is a general purpose device that may be programmed to execute some or all of the machine readable instructions represented by the flowcharts of FIGS. 21 and 22 but whose interconnections and logic circuitry are fixed once fabricated), the FPGA circuitry 2600 of the example of FIG. 26 includes interconnections and logic circuitry that may be configured and/or interconnected in different ways after fabrication to instantiate, for example, some or all of the machine readable instructions represented by the flowcharts of FIGS. 21 and 22. In particular, the FPGA circuitry 2600 may be thought of as an array of logic gates, interconnections, and switches. The switches can be programmed to change how the logic gates are interconnected by the interconnections, effectively forming one or more dedicated logic circuits (unless and until the FPGA circuitry 2600 is reprogrammed). The configured logic circuits enable the logic gates to cooperate in different ways to perform different operations on data received by input circuitry. Those operations may correspond to some or all of the software represented by the flowcharts of FIGS. 21 and 22. As such, the FPGA circuitry 2600 may be structured to effectively instantiate some or all of the machine readable instructions of the flowcharts of FIGS. 21 and 22 as dedicated logic circuits to perform the operations corresponding to those software instructions in a dedicated manner analogous to an ASIC. Therefore, the FPGA circuitry 2600 may perform the operations corresponding to the some or all of the machine readable instructions of FIGS. 21 and 22 faster than the general purpose microprocessor can execute the same.

In the example of FIG. 26, the FPGA circuitry 2600 is structured to be programmed (and/or reprogrammed one or more times) by an end user by a hardware description language (HDL) such as Verilog. The FPGA circuitry 2600 of FIG. 6, includes example input/output (I/O) circuitry 2602 to obtain and/or output data to/from example configuration circuitry 2604 and/or external hardware 2606. For example, the configuration circuitry 2604 may be implemented by interface circuitry that may obtain machine readable instructions to configure the FPGA circuitry 2600, or portion(s) thereof. In some such examples, the configuration circuitry 2604 may obtain the machine readable instructions from a user, a machine (e.g., hardware circuitry (e.g., programmed or dedicated circuitry) that may implement an Artificial Intelligence/Machine Learning (AI/ML) model to generate the instructions), etc. In some examples, the external hardware 2606 may be implemented by external hardware circuitry. For example, the external hardware 2606 may be implemented by the microprocessor 2500 of FIG. 25. The FPGA circuitry 2600 also includes an array of example logic gate circuitry 2608, a plurality of example configurable interconnections 2610, and example storage circuitry 2612. The logic gate circuitry 2608 and the configurable interconnections 2610 are configurable to instantiate one or more operations that may correspond to at least some of the machine readable instructions of FIGS. 21 and 22 and/or other desired operations. The logic gate circuitry 2608 shown in FIG. 26 is fabricated in groups or blocks. Each block includes semiconductor-based electrical structures that may be configured into logic circuits. In some examples, the electrical structures include logic gates (e.g., And gates, Or gates, Nor gates, etc.) that provide basic building blocks for logic circuits. Electrically controllable switches (e.g., transistors) are present within each of the logic gate circuitry 2608 to enable configuration of the electrical structures and/or the logic gates to form circuits to perform desired operations. The logic gate circuitry 2608 may include other electrical structures such as look-up tables (LUTs), registers (e.g., flip-flops or latches), multiplexers, etc.

The configurable interconnections 2610 of the illustrated example are conductive pathways, traces, vias, or the like that may include electrically controllable switches (e.g., transistors) whose state can be changed by programming (e.g., using an HDL instruction language) to activate or deactivate one or more connections between one or more of the logic gate circuitry 2608 to program desired logic circuits.

The storage circuitry 2612 of the illustrated example is structured to store result(s) of the one or more of the operations performed by corresponding logic gates. The storage circuitry 2612 may be implemented by registers or the like. In the illustrated example, the storage circuitry 2612 is distributed amongst the logic gate circuitry 2608 to facilitate access and increase execution speed.

The example FPGA circuitry 2600 of FIG. 26 also includes example Dedicated Operations Circuitry 2614. In this example, the Dedicated Operations Circuitry 2614 includes special purpose circuitry 2616 that may be invoked to implement commonly used functions to avoid the need to program those functions in the field. Examples of such special purpose circuitry 2616 include memory (e.g., DRAM) controller circuitry, PCIe controller circuitry, clock circuitry, transceiver circuitry, memory, and multiplier-accumulator circuitry. Other types of special purpose circuitry may be present. In some examples, the FPGA circuitry 2600 may also include example general purpose programmable circuitry 2618 such as an example CPU 2620 and/or an example DSP 2622. Other general purpose programmable circuitry 2618 may additionally or alternatively be present such as a GPU, an XPU, etc., that can be programmed to perform other operations.

Although FIGS. 25 and 26 illustrate two example implementations of the processor circuitry 2312 of FIG. 23 and/or the processor circuitry 2412 of FIG. 24, many other approaches are contemplated. For example, as mentioned above, modern FPGA circuitry may include an on-board CPU, such as one or more of the example CPU 2620 of FIG. 6. Therefore, the processor circuitry 2312 of FIG. 23 and/or the processor circuitry 2412 of FIG. 24 may additionally be implemented by combining the example microprocessor 2500 of FIG. 25 and the example FPGA circuitry 2600 of FIG. 6. In some such hybrid examples, a first portion of the machine readable instructions represented by the flowchart of FIGS. 21 and 22 may be executed by one or more of the cores 2502 of FIG. 25, a second portion of the machine readable instructions represented by the flowcharts of FIGS. 21 and 22 may be executed by the FPGA circuitry 2600 of FIG. 26, and/or a third portion of the machine readable instructions represented by the flowcharts of FIGS. 21 and 22 may be executed by an ASIC. It should be understood that some or all of the circuitry of FIGS. 19 and 20 may, thus, be instantiated at the same or different times. Some or all of the circuitry may be instantiated, for example, in one or more threads executing concurrently and/or in series. Moreover, in some examples, some or all of the circuitry of FIGS. 19 and 20 may be implemented within one or more virtual machines and/or containers executing on the microprocessor.

In some examples, the processor circuitry 2312 of FIG. 23 and the processor circuitry 2412 of FIG. 24 may be in one or more packages. For example, the microprocessor 2500 of FIG. 25 and/or the FPGA circuitry 2600 of FIG. 26 may be in one or more packages. In some examples, an XPU may be implemented by the processor circuitry 2312 of FIG. 23 and/or the processor circuitry 2412 of FIG. 24, which may be in one or more packages. For example, the XPU may include a CPU in one package, a DSP in another package, a GPU in yet another package, and an FPGA in still yet another package.

From the foregoing, it will be appreciated that example systems, methods, apparatus, and articles of manufacture have been disclosed that enable coolant to be supplied to one or more distributed servers. Examples disclosed herein enable the servers to be supplied fresh coolant when the coolant of the current server is not able effectively cool the server. Disclosed systems, methods, apparatus, and articles of manufacture improve the efficiency of using a computing device by ensuring the servers are able to operate at an appropriate temperature. Disclosed systems, methods, apparatus, and articles of manufacture are accordingly directed to one or more improvement(s) in the operation of a machine such as a computer or other electronic and/or mechanical device.

Example methods, apparatus, systems, and articles of manufacture for coolant management in distributed compute systems are disclosed herein. Further examples and combinations thereof include the following:

Example 1 includes an apparatus memory, and at least one processor to execute instructions to determine, based on sensor data received from a sensor associated with a server, if a first volume of coolant is effective to maintain a temperature of the server at a target temperature, and in response to determining the first volume of the coolant is not effective reduce a heat output of the server, and pump, from a coolant storage, a second volume of the coolant to the server.

Example 2 includes the apparatus of example 1, wherein the coolant storage is disposed underground.

Example 3 includes the apparatus of example 2, wherein the coolant storage is a cooled via passive conduction.

Example 4 includes the apparatus of example 1, wherein the server is a first server, and the processor executes the instructions to reduce the heat output of the first server by shifting a workload on the first server to a second server.

Example 5 includes the apparatus of example 1, wherein the processor executes the instructions to reduce the heat output of the server by capping a heat output of the server.

Example 6 includes the apparatus of example 1, wherein the sensor data includes at least one of a temperature of the first volume of the coolant, a fill-level of the first volume of coolant, or a contamination of the coolant.

Example 7 includes the apparatus of example 1, wherein the processor executes the instructions to drain the first volume of the coolant by sending an instruction to open a valve associated with the server, the valve coupling the server to a pipe, the pipe extending between the valve and the coolant storage.

Example 8 includes a non-transitory computer readable medium comprising instructions, which when executed, cause one or more processors to determine, based on sensor data received from a sensor associated with a server, if a first volume of coolant is effective to maintain a temperature of the server at a target temperature, and in response to determining the first volume of the coolant is not effective reduce a heat output of the server, and pump, from a coolant storage, a second volume of the coolant to the server.

Example 9 includes the non-transitory computer readable medium of example 8, wherein the coolant storage is disposed underground.

Example 10 includes the non-transitory computer readable medium of example 9, wherein the coolant storage is a cooled via passive conduction.

Example 11 includes the non-transitory computer readable medium of example 8, wherein the server is a first server and the instructions, when executed, cause the one or more processors to reduce the heat output of the first server by shifting a workload on the first server to a second server.

Example 12 includes the non-transitory computer readable medium of example 9, the instructions, when executed, cause the one or more processors to reduce the heat output of the server by capping a heat output of the server.

Example 13 includes the non-transitory computer readable medium of example 8, wherein the sensor data includes at least one of a temperature of the first volume of the coolant, a fill-level of the first volume of coolant, or a contamination of the coolant.

Example 14 includes the non-transitory computer readable medium of example 9, the instructions, when executed, cause the one or more processors to drain the first volume of the coolant by sending an instruction to open a valve associated with the server, the valve coupling the server to a pipe, the pipe extending between the valve and the coolant storage.

Example 15 includes a method comprising determining, based on sensor data received from a sensor associated with a server, if a first volume of coolant is effective to maintain a temperature of the server at a target temperature, and in response to determining the first volume of the coolant is not effective reducing a heat output of the server, and pumping, from a coolant storage, a second volume of the coolant to the server.

Example 16 includes the method of example 15, wherein the coolant storage is disposed underground, and the coolant storage is a cooled via passive conduction.

Example 17 includes the method of example 15, wherein the server is a first server and the reducing the heat output of the first server includes shifting a workload on the server to a second server.

Example 18 includes the method of example 15, wherein the reducing the heat output of the server includes capping a heat output of the server.

Example 19 includes the method of example 15, wherein the sensor data includes at least one of a temperature of the first volume of the coolant, a fill-level of the first volume of coolant, or a contamination of the coolant.

Example 20 includes the method of example 15, wherein the draining the first volume of the coolant includes sending an instruction to open a valve associated with the server, the valve coupling the server to a pipe, the pipe extending between the valve and the coolant storage.

The following claims are hereby incorporated into this Detailed Description by this reference. Although certain example systems, methods, apparatus, and articles of manufacture have been disclosed herein, the scope of coverage of this patent is not limited thereto. On the contrary, this patent covers all systems, methods, apparatus, and articles of manufacture fairly falling within the scope of the claims of this patent.

What is claimed is:

1. An apparatus comprising:

memory; and at least one processor circuit to execute instructions to:

determine a coolant parameter for a first discrete volume of coolant, the coolant parameter determined based on sensor data from a sensor associated with a server, the coolant parameter indicative of a capability of the first discrete volume of the coolant to maintain a temperature of the server at a target temperature;

compare the coolant parameter to a threshold;

in response to the coolant parameter not satisfying the threshold, determine that the first discrete volume of coolant is to be retained to cool the server; and in response to the coolant parameter satisfying the threshold:

reduce a heat output of the server; and pump a second volume of the coolant from a coolant storage to the server.

2. The apparatus of claim 1, wherein the coolant storage is underground.

3. The apparatus of claim 2, wherein the coolant storage is cooled via passive conduction.

4. The apparatus of claim 1, wherein the server is a first server, and one or more of the at least one processor circuit is to reduce the heat output of the first server by shifting a workload on the first server to a second server.

5. The apparatus of claim 1, wherein one or more of the at least one processor circuit is to reduce the heat output of the server by capping the heat output of the server.

6. The apparatus of claim 1, wherein the sensor data includes at least one of a temperature of the first discrete volume of the coolant, a fill-level of the first discrete volume of coolant, or a contamination of the coolant.

7. The apparatus of claim 1, wherein, in response to the coolant parameter satisfying the threshold, one or more of the at least one processor circuit is to drain the first discrete volume of the coolant by sending an instruction to open a valve associated with the server, the valve coupling the server to a pipe, the pipe extending between the valve and the coolant storage.

8. A non-transitory computer readable medium comprising instructions to cause one or more processor circuits to at least:

determine a coolant parameter for a first discrete volume of coolant, the coolant parameter determined based on sensor data received from a sensor associated with a server, the coolant parameter indicative of a capability of the first discrete volume of the coolant to maintain a temperature of the server at a target temperature;

compare the coolant parameter to a threshold;

in response to the coolant parameter not satisfying the threshold, determine the first discrete volume of coolant is to be retained; and in response to the coolant parameter satisfying the threshold:

reduce a heat output of the server; and pump a second volume of the coolant to the server from a coolant storage.

9. The non-transitory computer readable medium of claim 8, wherein the coolant storage is underground.

10. The non-transitory computer readable medium of claim 9, wherein the coolant storage is cooled via passive conduction.

11. The non-transitory computer readable medium of claim 8, wherein the server is a first server and the instructions are to cause at least one of the one or more processor circuits to reduce the heat output of the first server by shifting a workload on the first server to a second server.

12. The non-transitory computer readable medium of claim 9, wherein the instructions are to cause at least one of the one or more processor circuits to reduce the heat output of the server by capping the heat output of the server.

13. The non-transitory computer readable medium of claim 8, wherein the sensor data includes at least one of a temperature of the first discrete volume of the coolant, a fill-level of the first discrete volume of coolant, or a contamination of the coolant.

14. The non-transitory computer readable medium of claim 9, wherein the instructions are to cause at least one of the one or more processor circuits to drain the first discrete volume of the coolant, in response to the coolant parameter satisfying the threshold, by sending an instruction to open a valve associated with the server, the valve coupling the server to a pipe, the pipe extending between the valve and the coolant storage.

15. A method comprising:

determining a coolant parameter for a first discrete volume of coolant, the coolant parameter determined based on sensor data received from a sensor associated with a server, the coolant parameter indicative of a capability of the first discrete volume of the coolant to maintain a temperature of the server at a target temperature;

comparing the coolant parameter to a threshold;

in response to the coolant parameter not satisfying the threshold, determining that the first discrete volume of coolant is to be retained for cooling the server; and in response to the coolant parameter satisfying the threshold:

reducing a heat output of the server; and pumping a second volume of the coolant from a coolant storage to the server.

16. The method of claim 15, wherein the coolant storage is underground, and the coolant storage is cooled via passive conduction.

17. The method of claim 15, wherein the server is a first server and the reducing of the heat output of the first server includes shifting a workload on the server to a second server.

18. The method of claim 15, wherein the reducing of the heat output of the server includes capping the heat output of the server.

19. The method of claim 15, wherein the sensor data includes at least one of a temperature of the first discrete volume of the coolant, a fill-level of the first discrete volume of coolant, or a contamination of the coolant.

20. The method of claim 15, including draining, in response to the coolant parameter satisfying the threshold, the first discrete volume of the coolant by sending an instruction to open a valve associated with the server, the valve coupling the server to a pipe, the pipe extending between the valve and the coolant storage.

* * * * *